United States Patent [19]
Park

[11] Patent Number: 6,100,697
[45] Date of Patent: *Aug. 8, 2000

[54] SEISMIC ACTIVITY PREDICTOR IN PROXIMITY WITH THE EARTH INCLUDING A DIELECTRIC FOR RECEIVING PRECURSOR SEISMIC ELECTROMAGNETIC WAVEFORMS

[76] Inventor: Larry Park, 50631 NW. Gheen Rd., Manning, Oreg. 97125

[*] Notice: This patent is subject to a terminal disclaimer.

[21] Appl. No.: 09/042,215

[22] Filed: Mar. 13, 1998

Related U.S. Application Data

[63] Continuation-in-part of application No. 08/743,909, Nov. 4, 1996, Pat. No. 5,742,166.
[51] Int. Cl.[7] .............................. G01V 3/12; G01V 1/16; G01V 11/00; G01R 29/00
[52] U.S. Cl. .......................... 324/344; 324/72; 324/323; 324/347; 340/690; 367/180
[58] Field of Search .............................. 324/72, 323, 344, 324/347–349; 340/600, 601, 690; 367/140, 157, 178, 180, 181

[56] References Cited

U.S. PATENT DOCUMENTS 5,742,166   4/1998   Park ........................................ 324/344

*Primary Examiner*—Gerard Strecker
*Attorney, Agent, or Firm*—Kevin L. Russell; Chernoff Vilhauer et al.

[57] ABSTRACT

A method of detecting precursor seismic electromagnetic waveforms and predicting future seismic activity in the form of an earthquake by placing a detector including a dielectric material in contact with the earth. The detector receives at the dielectric material precursor seismic electromagnetic waveforms traveling within the earth emanating from a region of seismic activity. A sensor responsive to the dielectric material senses a series of individual discrete signals imposed by the waveforms at the dielectric material wherein each of the signals has the characteristic of a rise time that is shorter than its fall time. Alternatively, the discrete signals may be a single discrete signal characterized by a plurality of overlapping waveforms. Then predicting based on the series of the signals the occurrence of the earthquake.

33 Claims, 73 Drawing Sheets

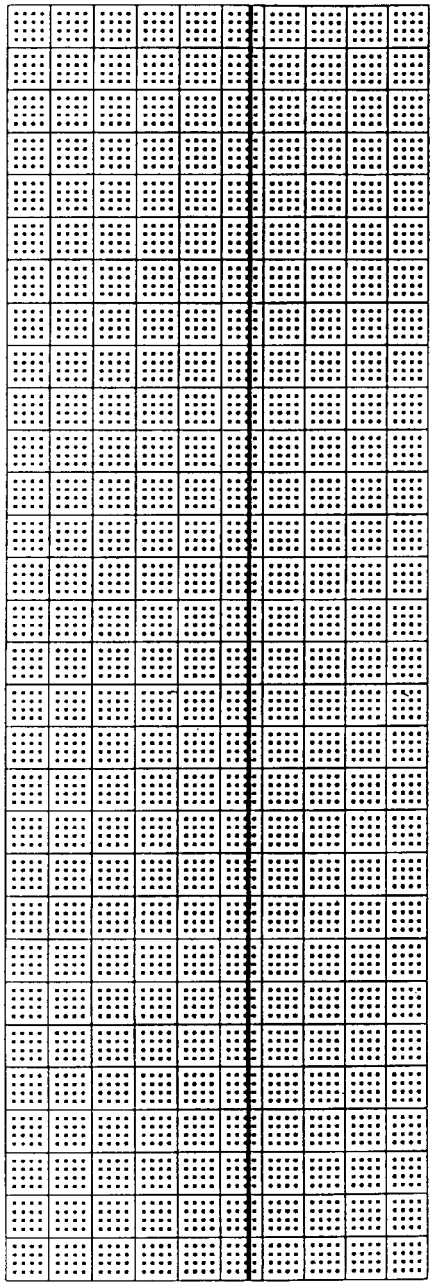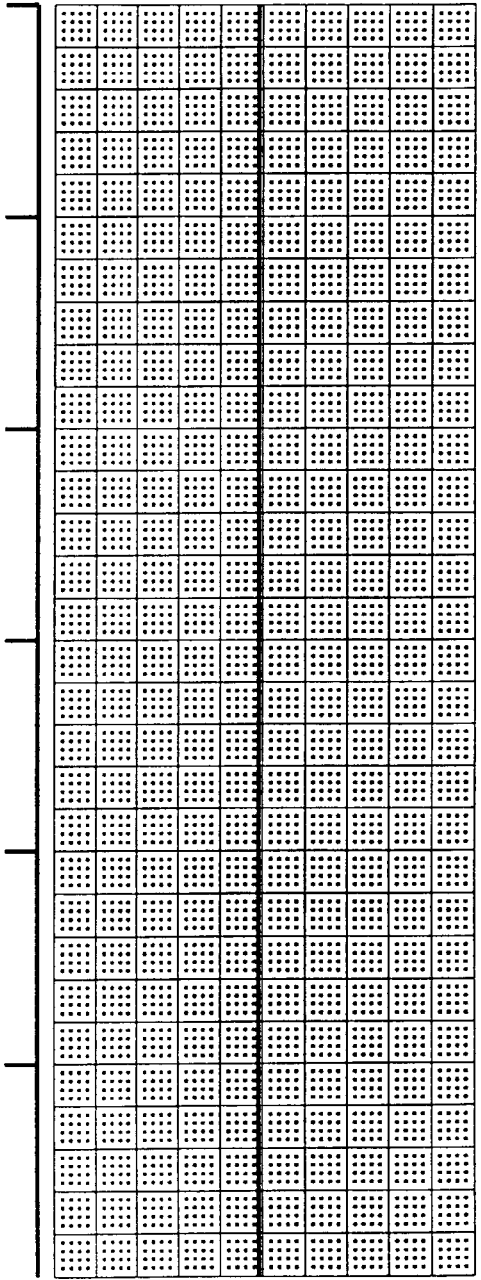
FIG. 10B

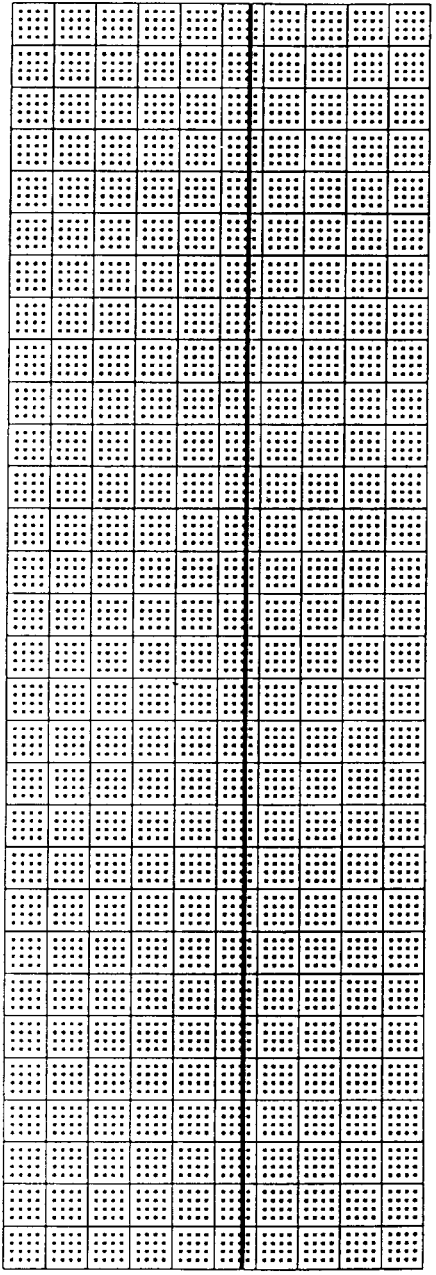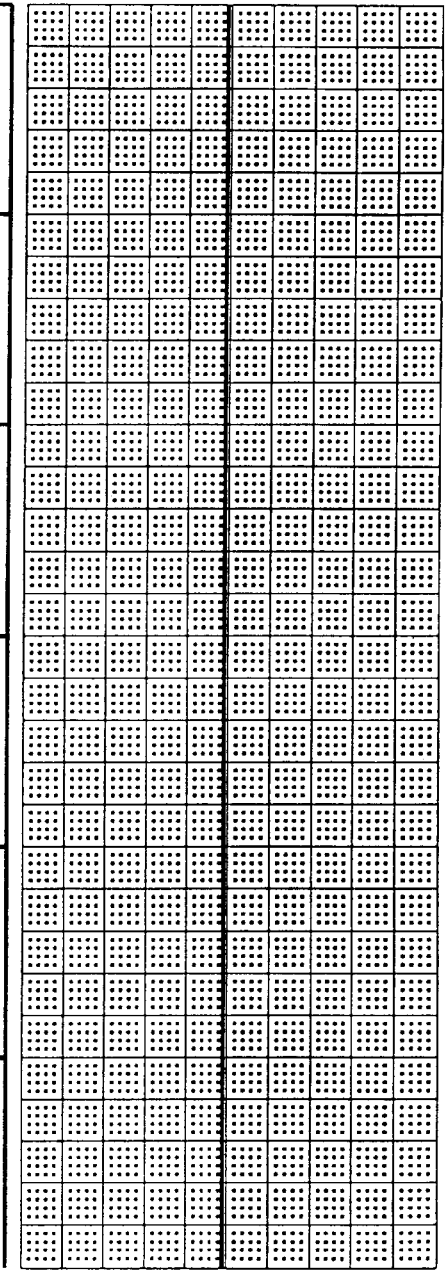
FIG. 10C

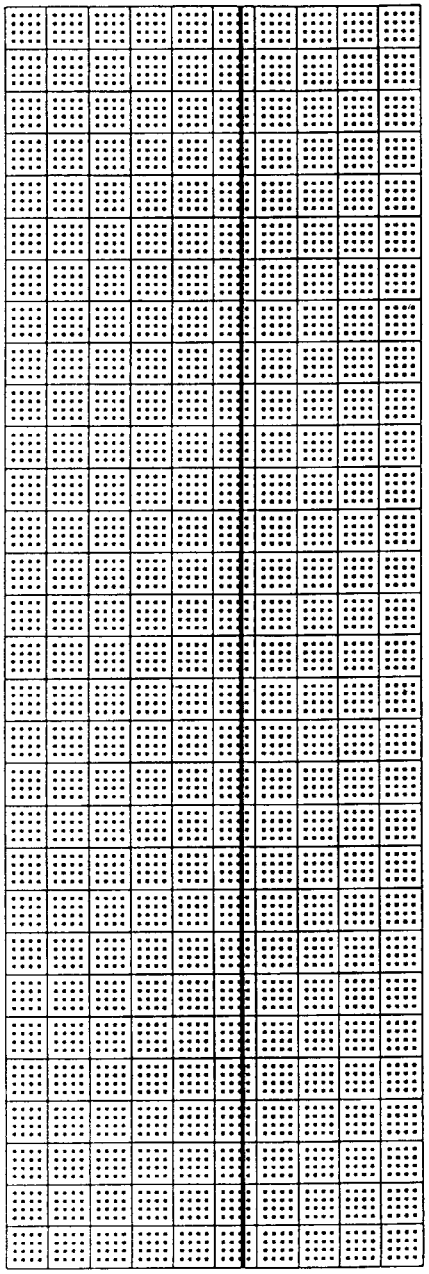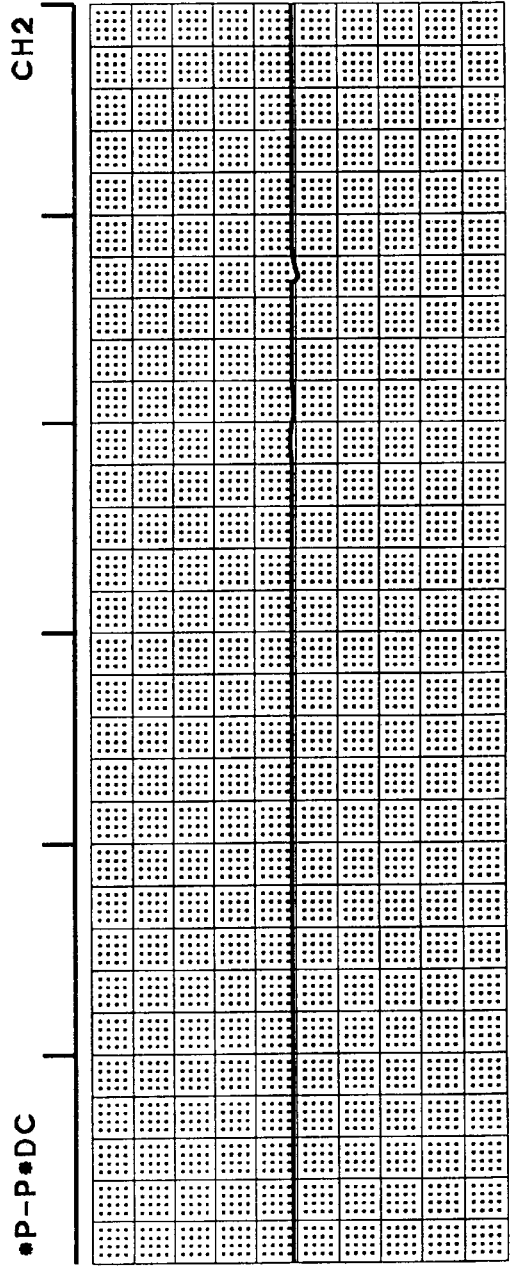
FIG. 10D

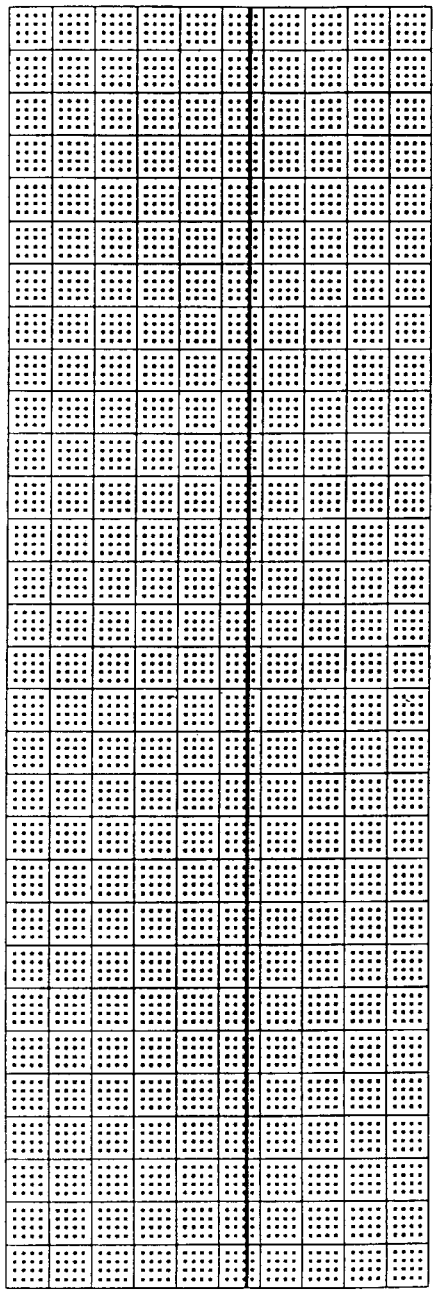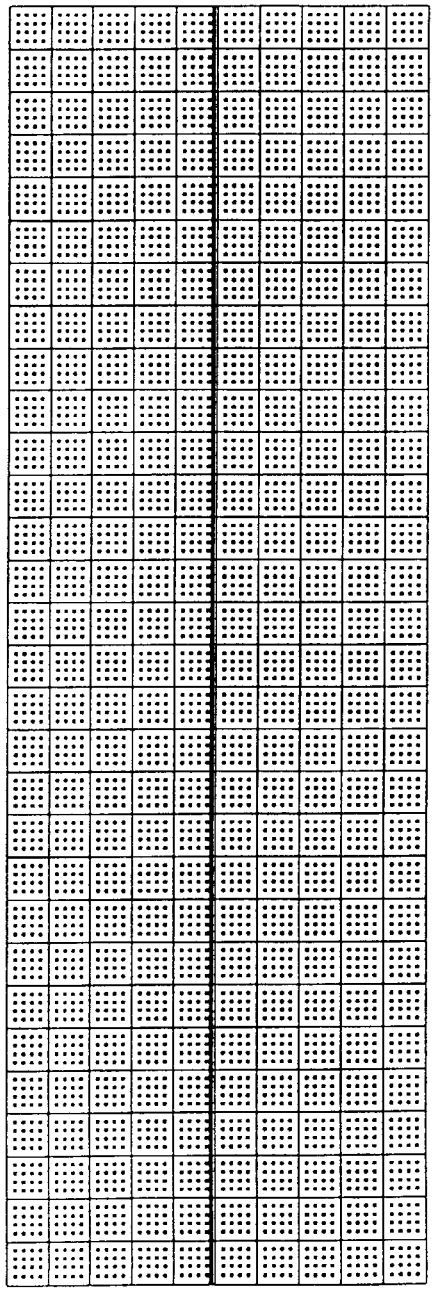
FIG. 10E

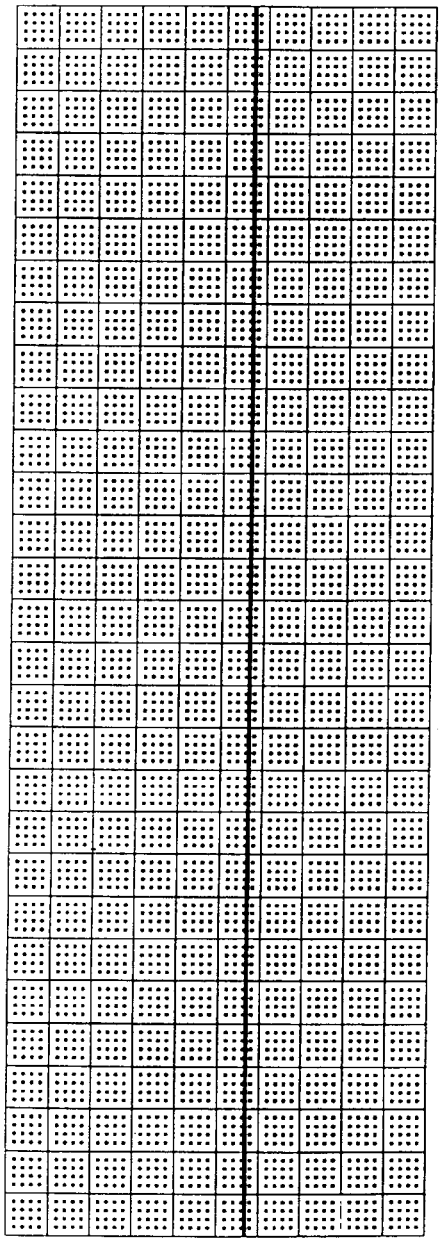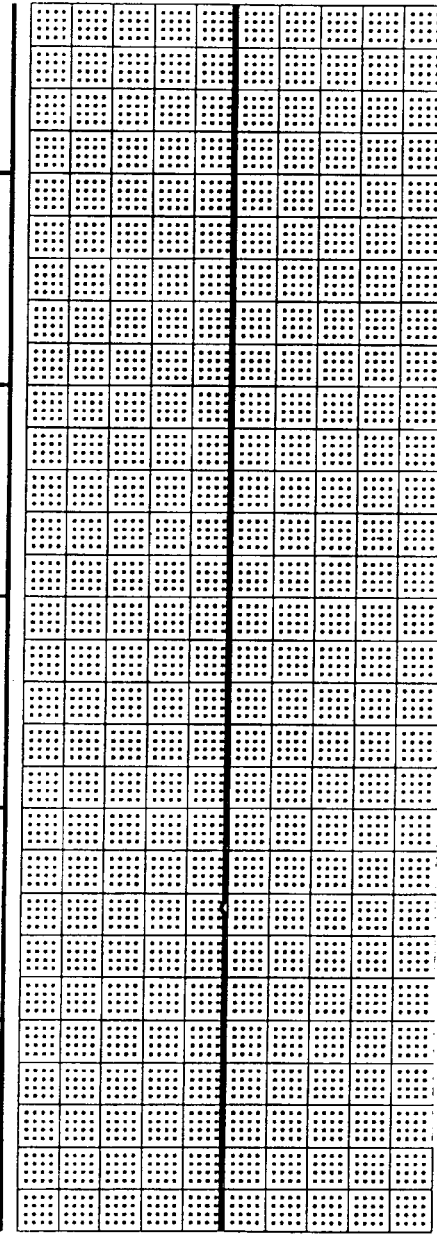
FIG. 10F

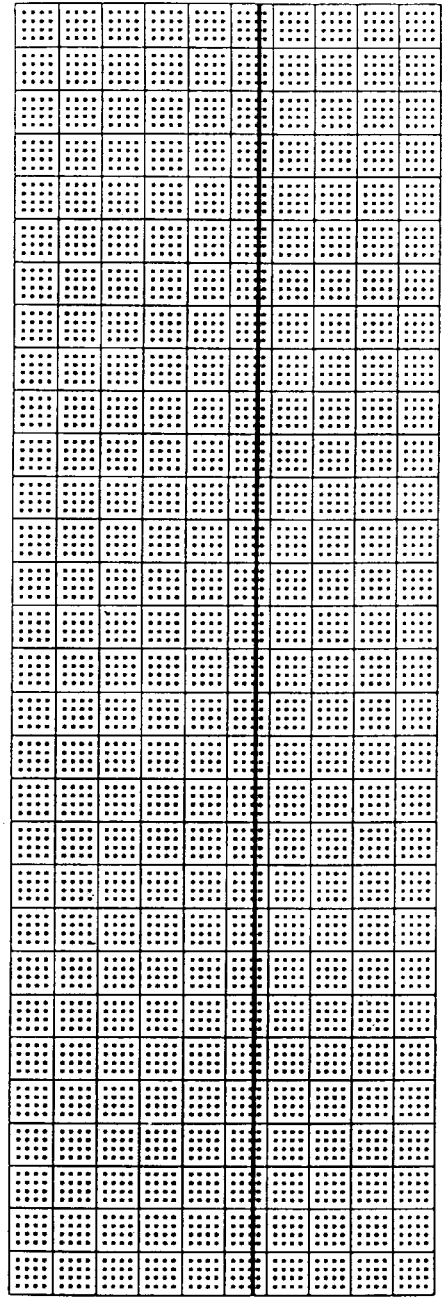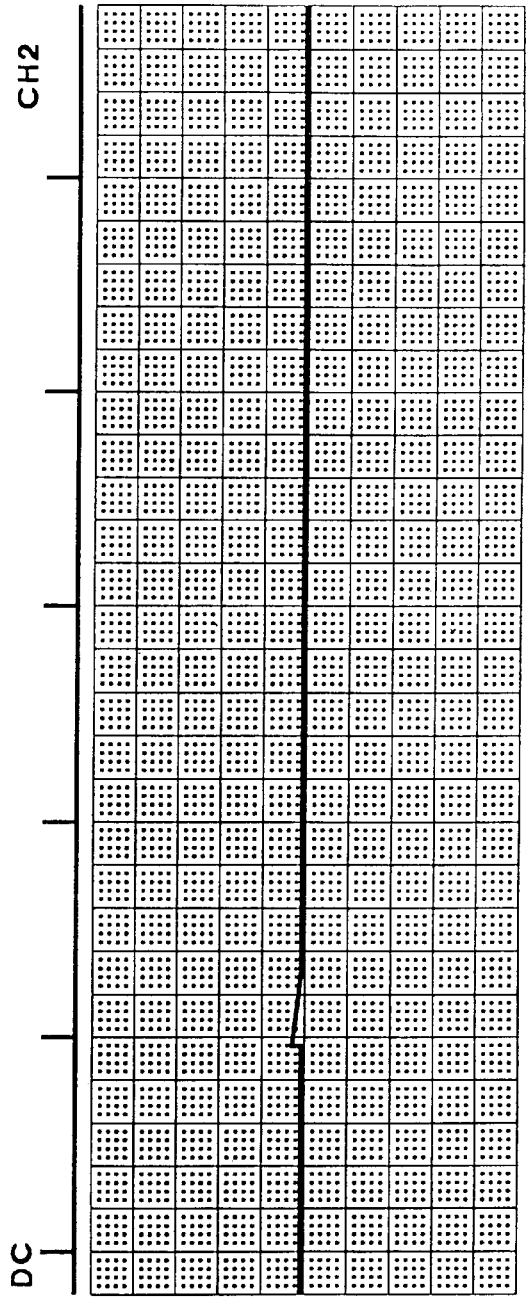
FIG. 10G

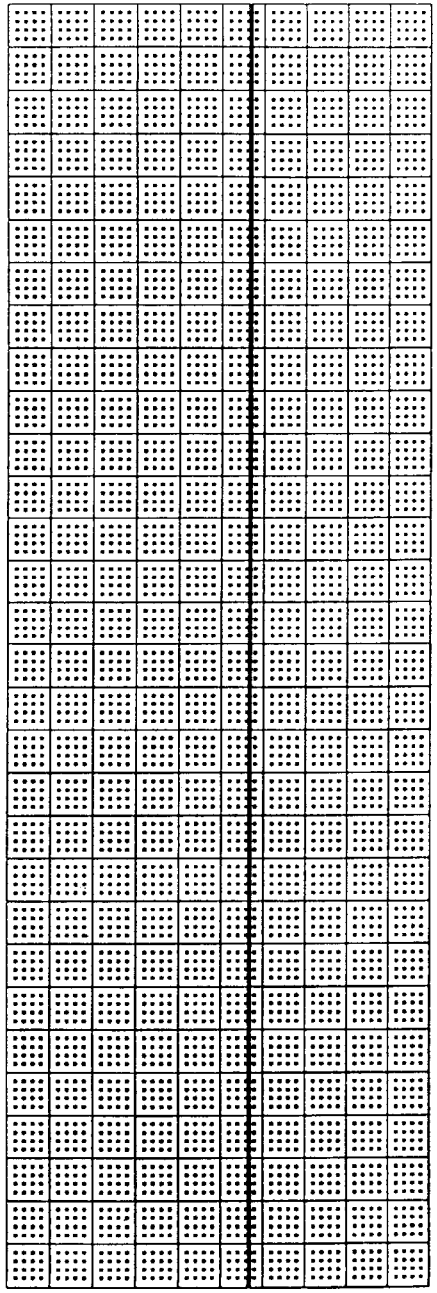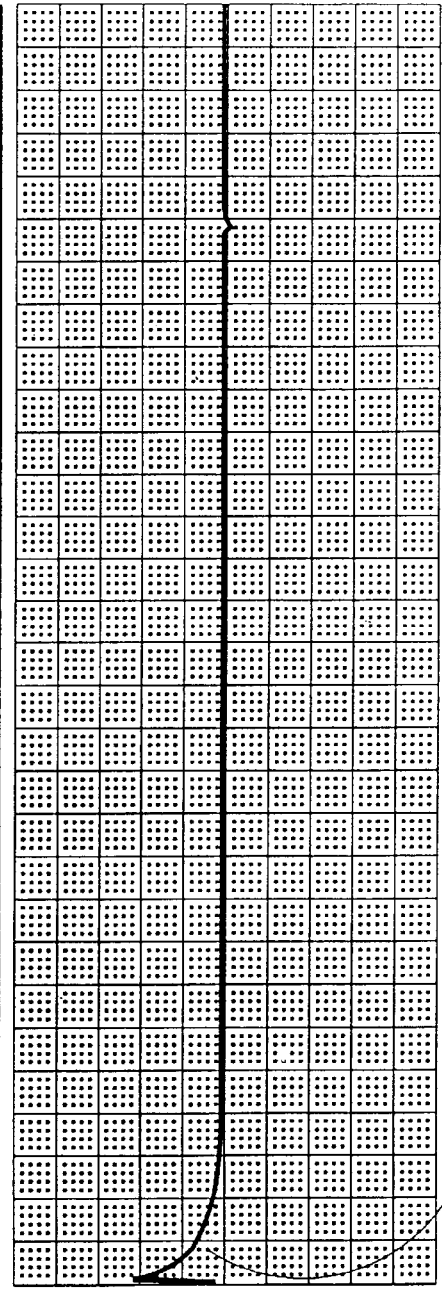
FIG. 10H

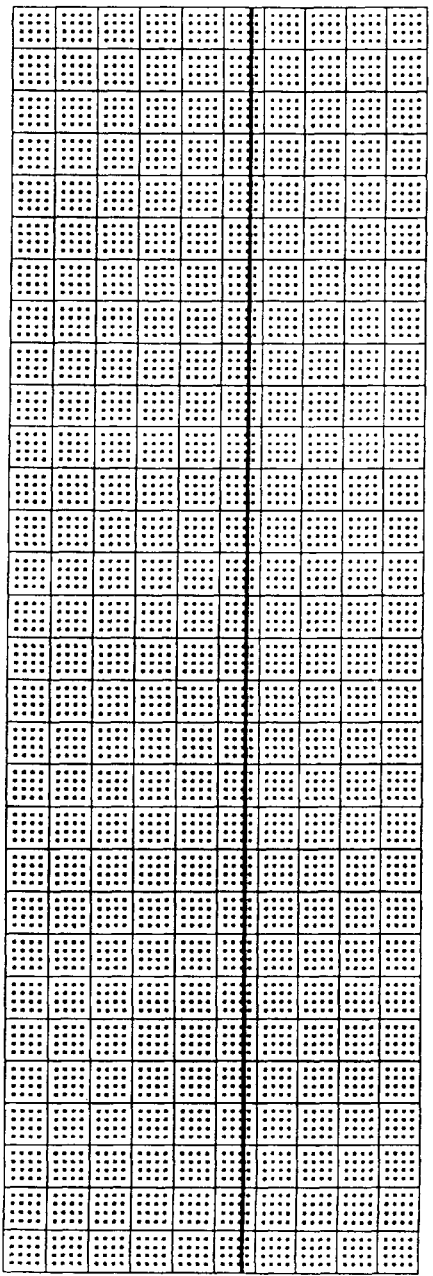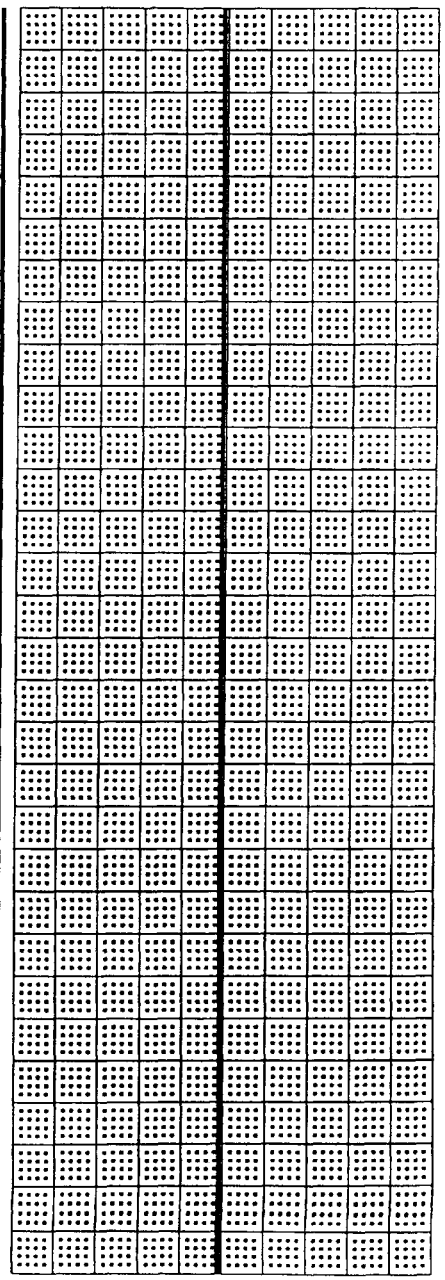
FIG. 10I

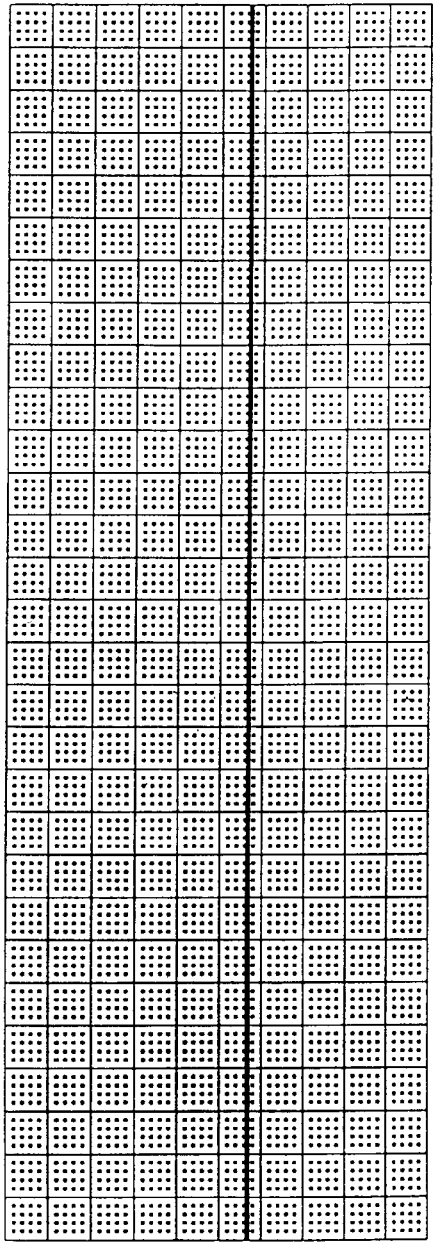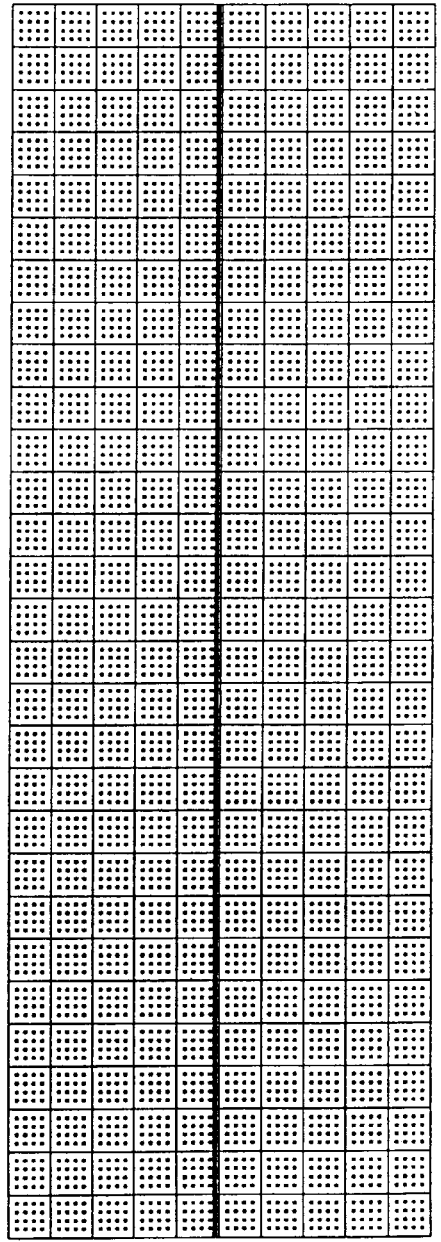
FIG. 10J

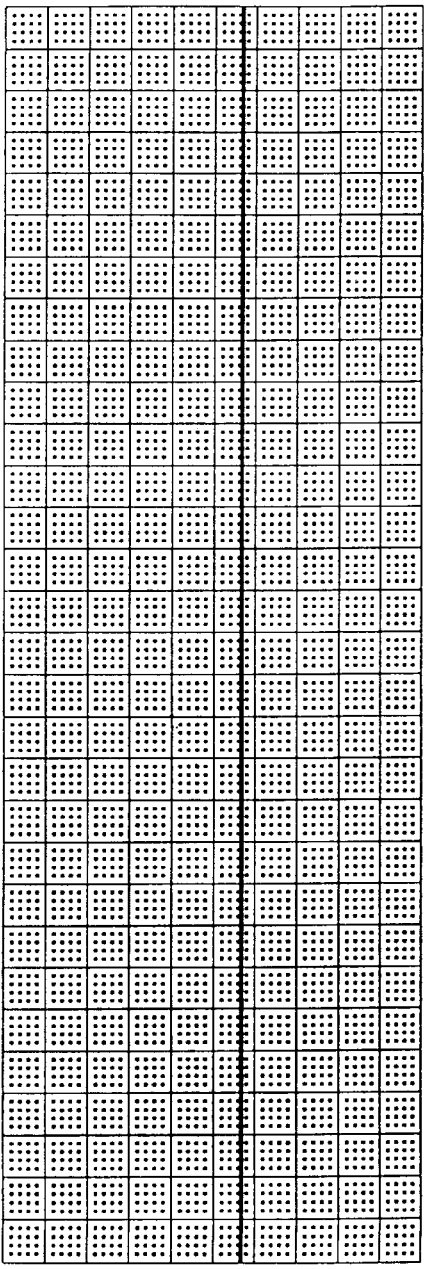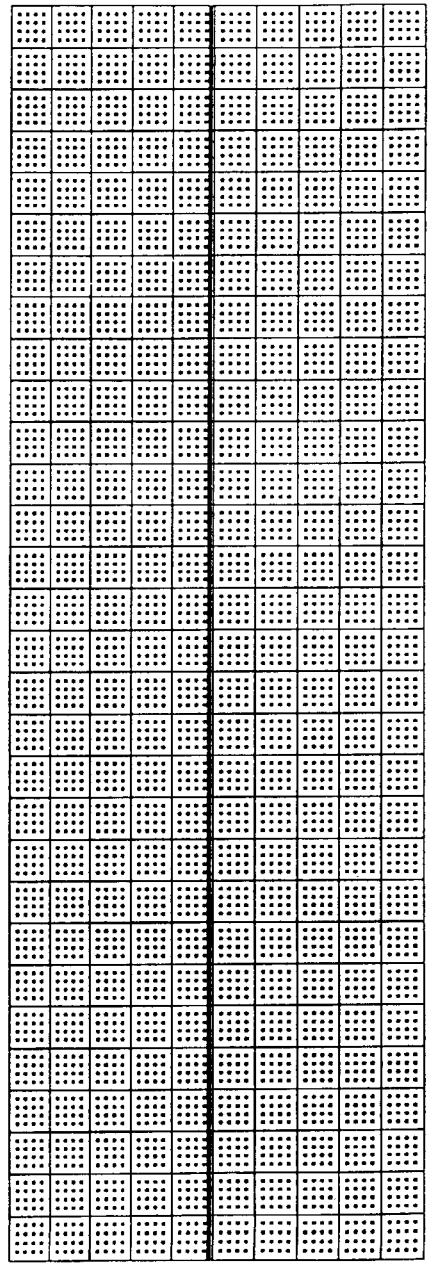
FIG. 10K

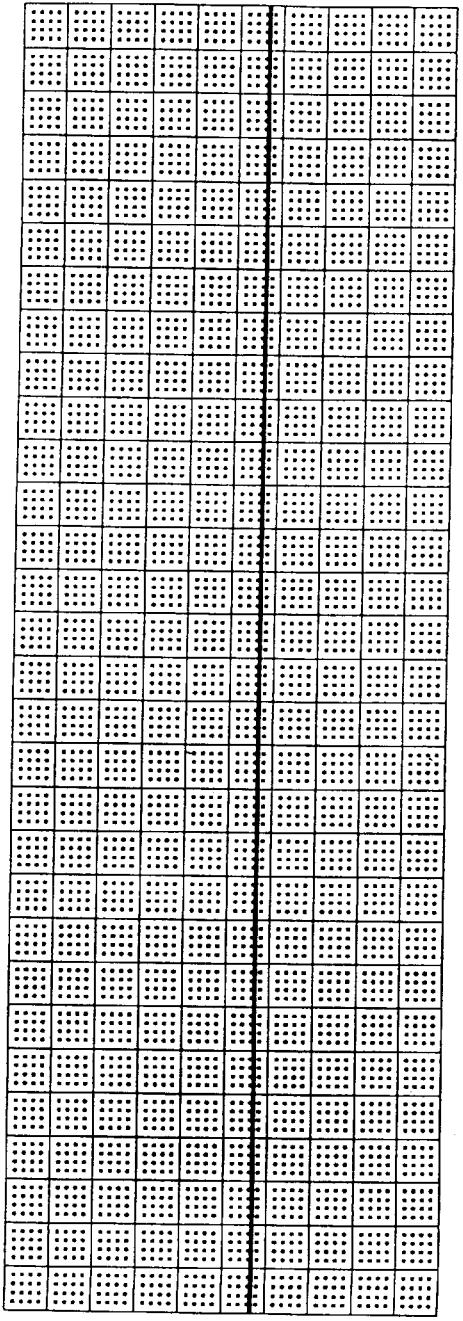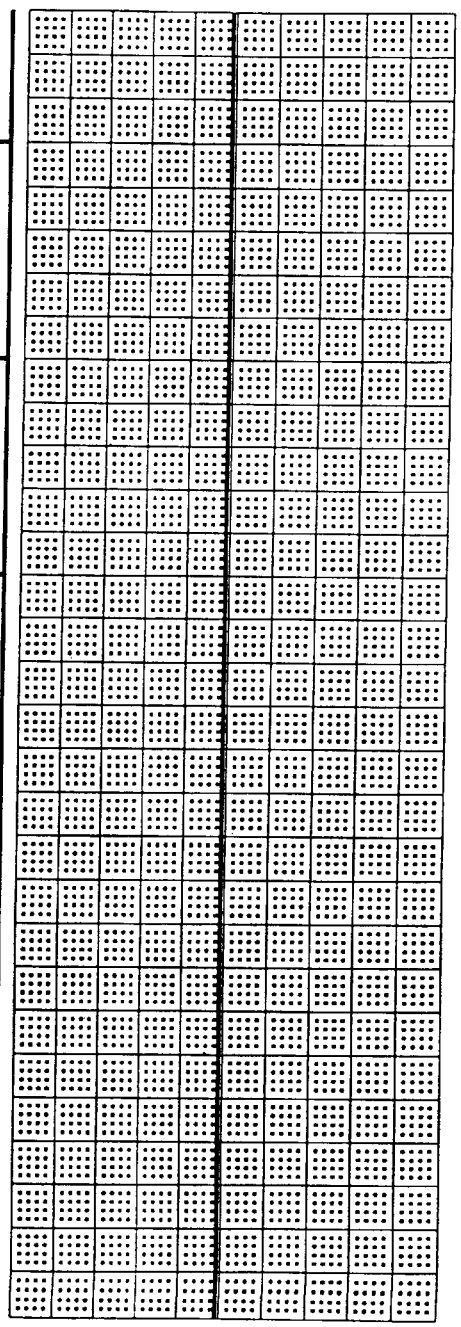
FIG. 10L

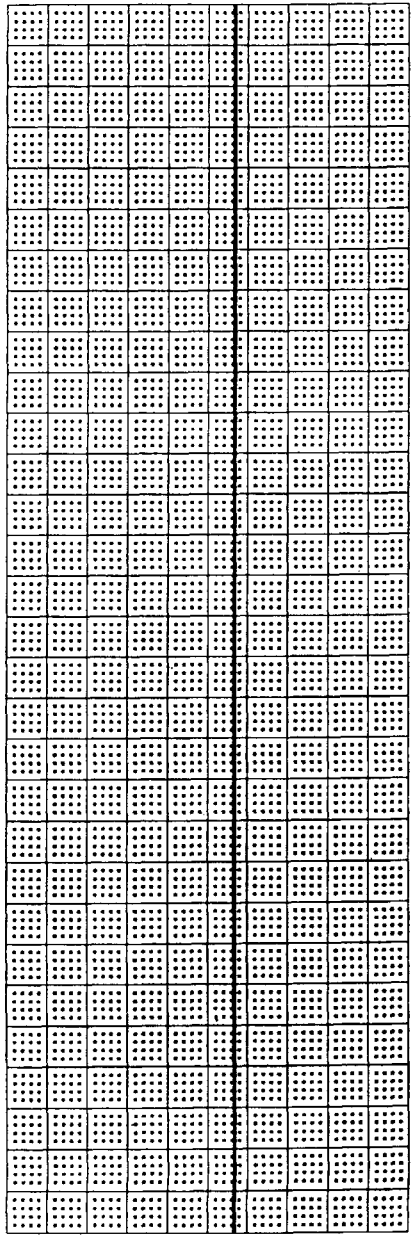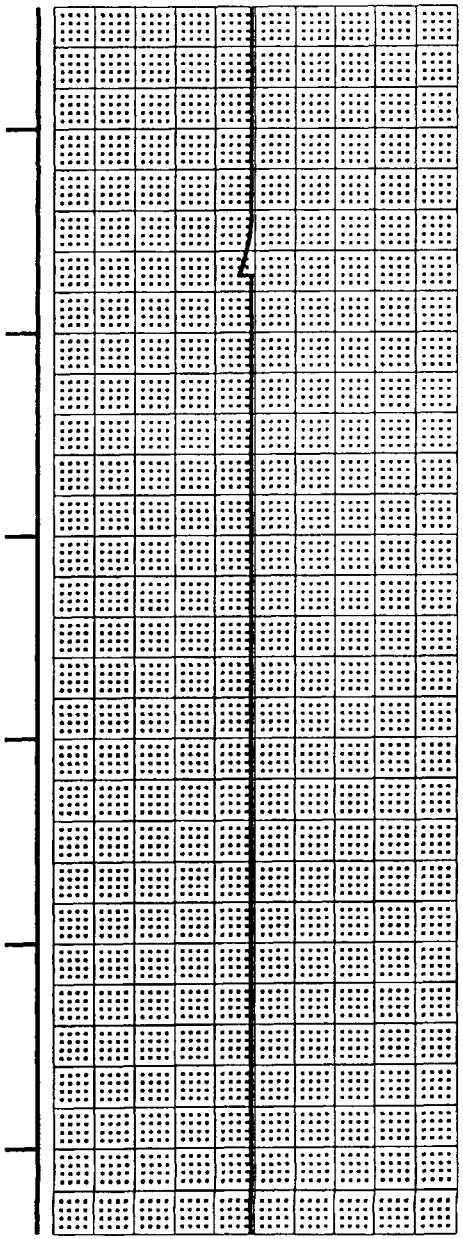
FIG. 10M

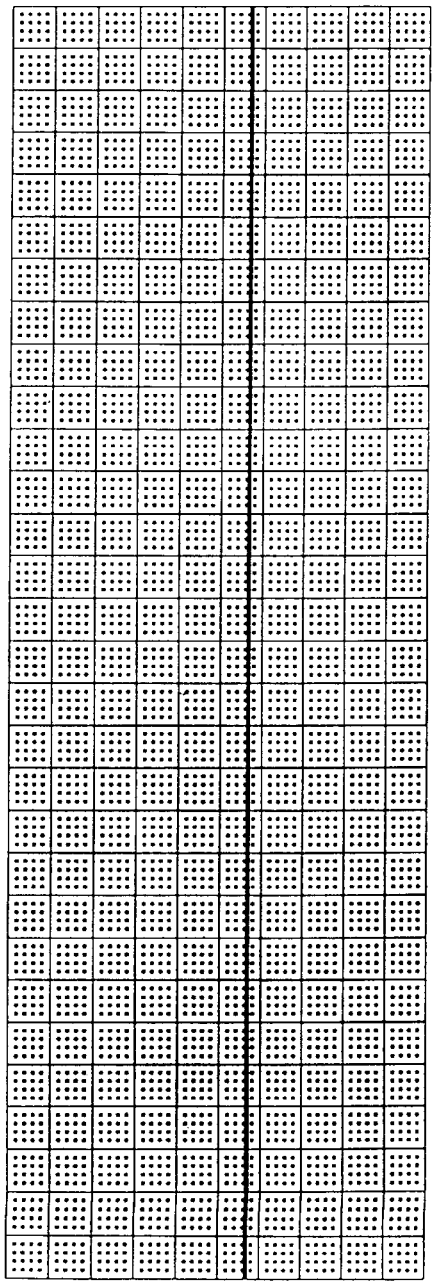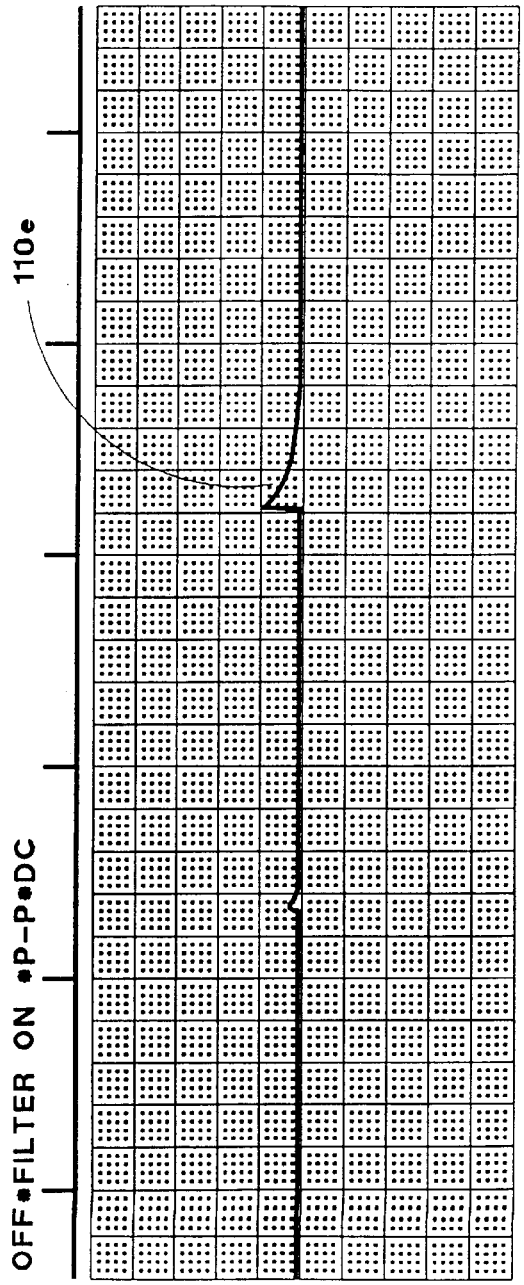
FIG. 10N

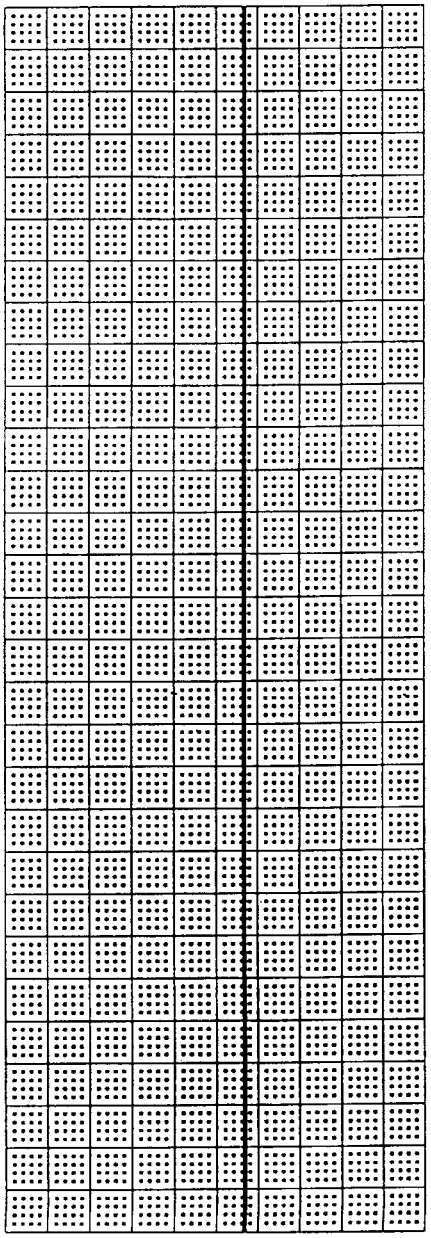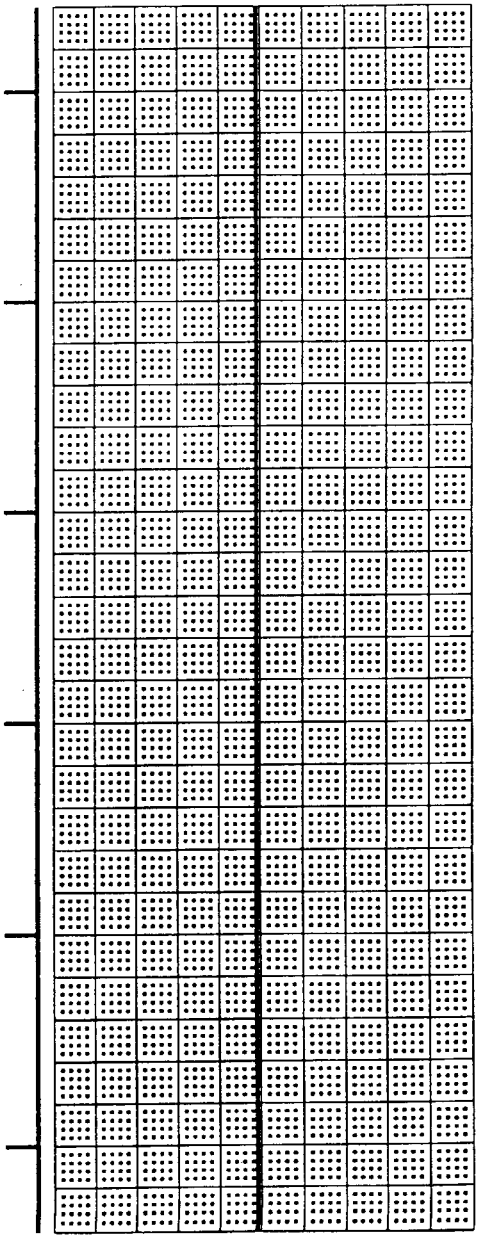
FIG. 100

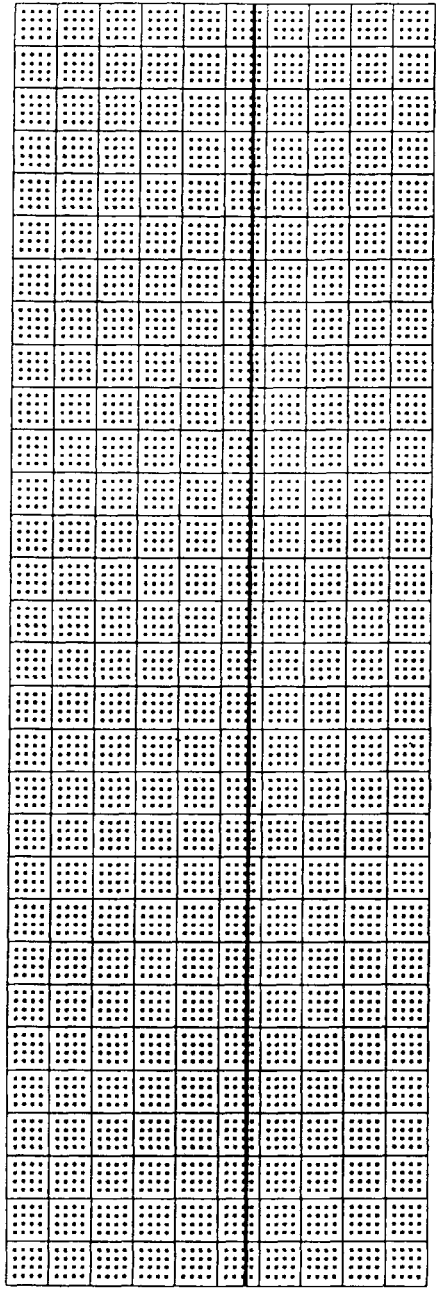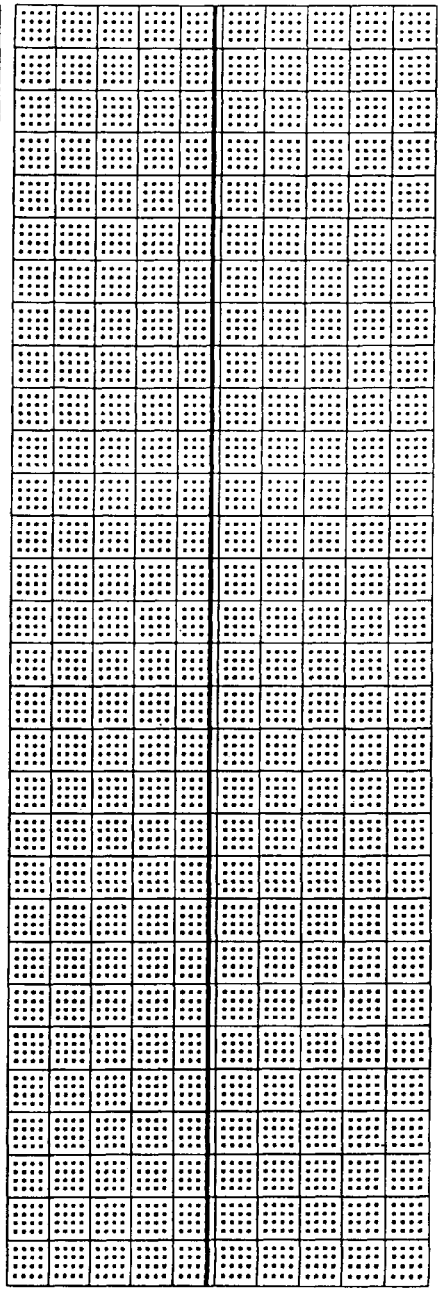
FIG. 10P

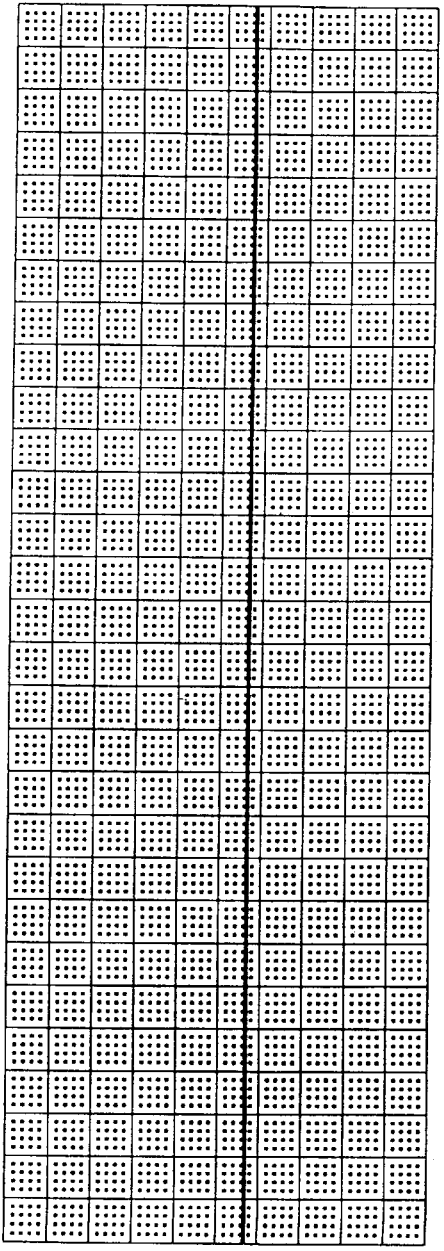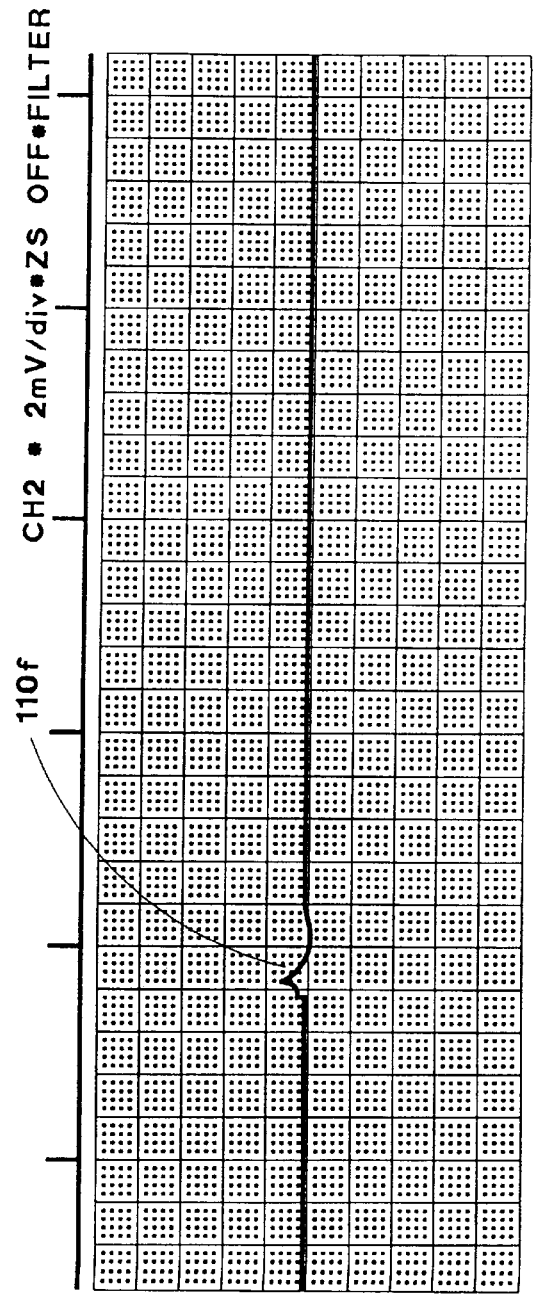
FIG. 10Q

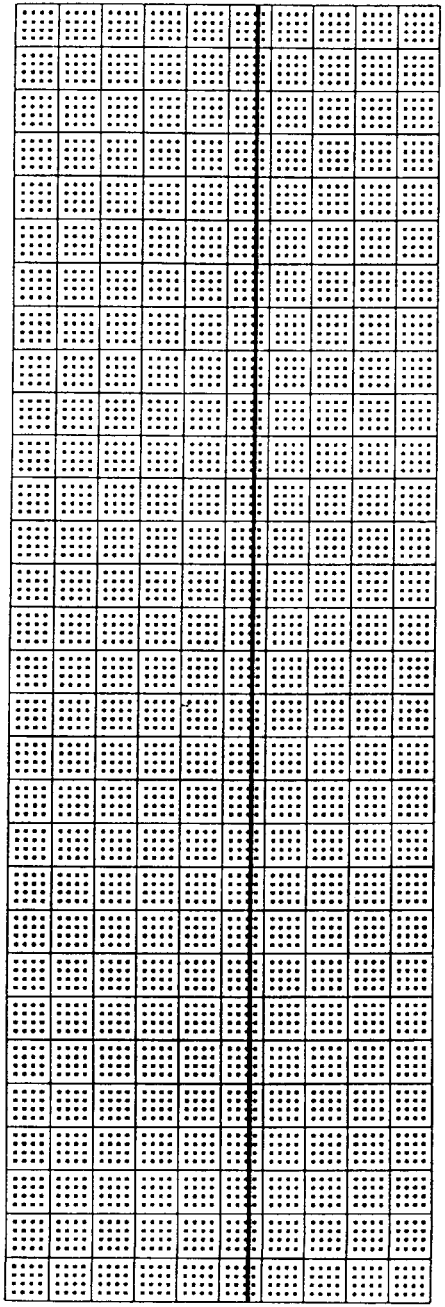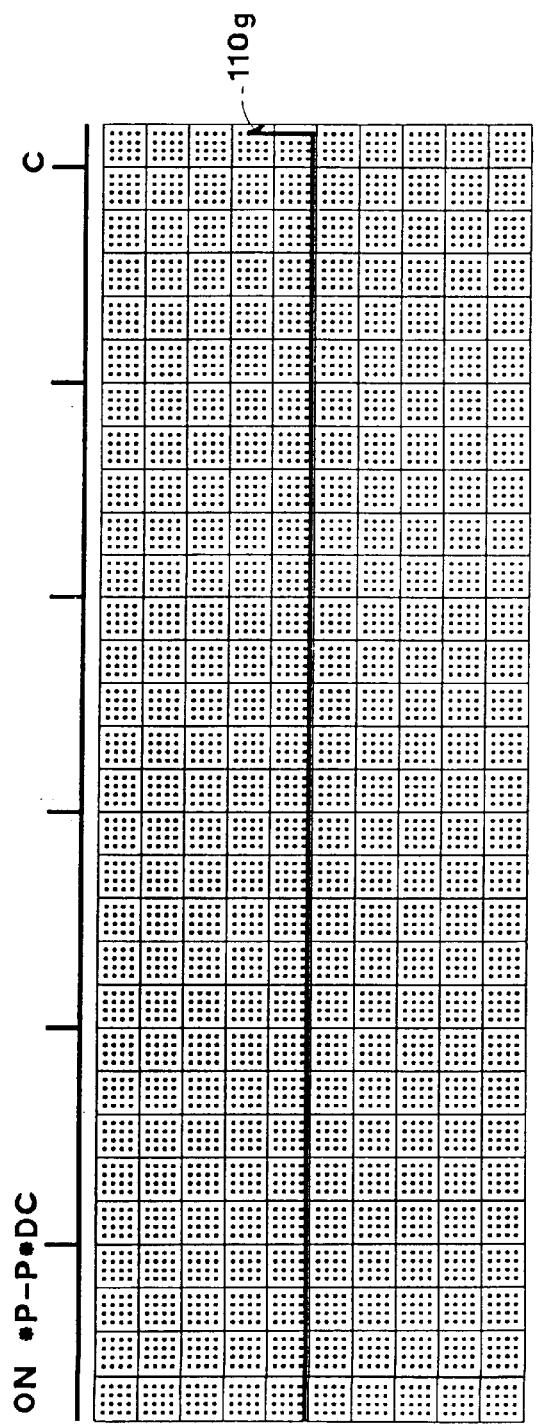
FIG. 10R

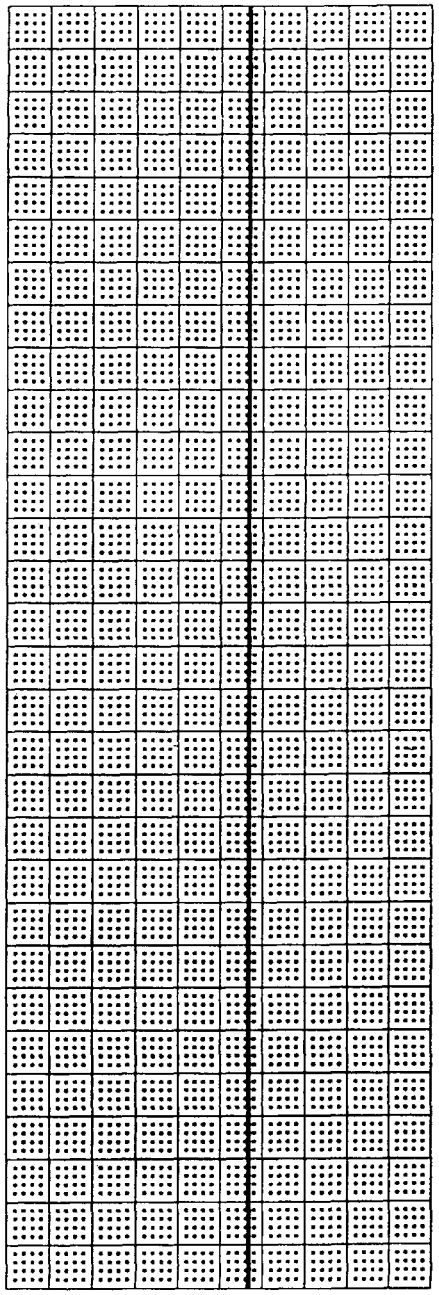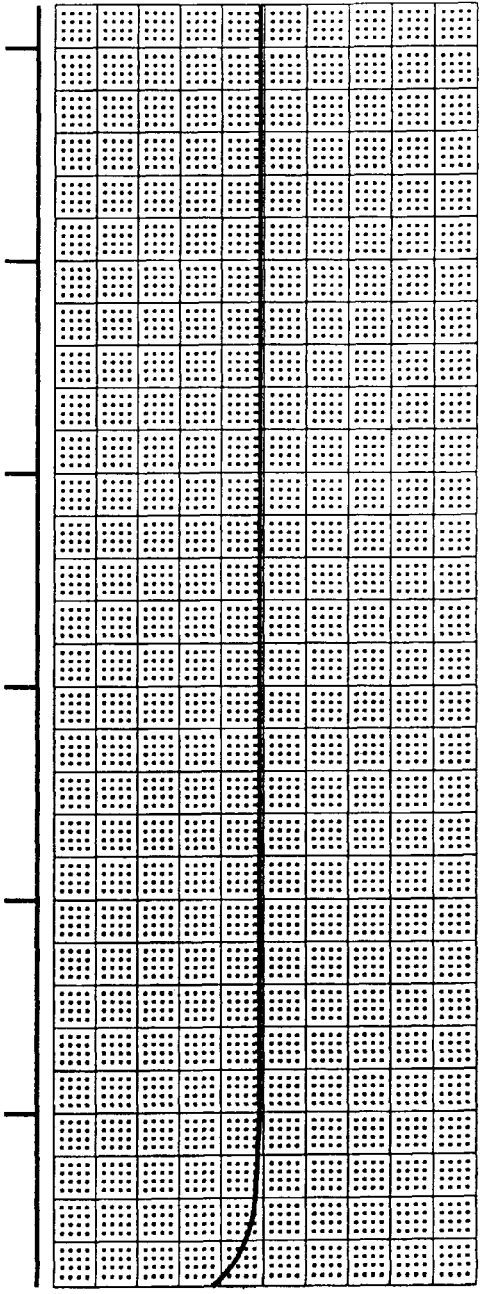
FIG. 10S

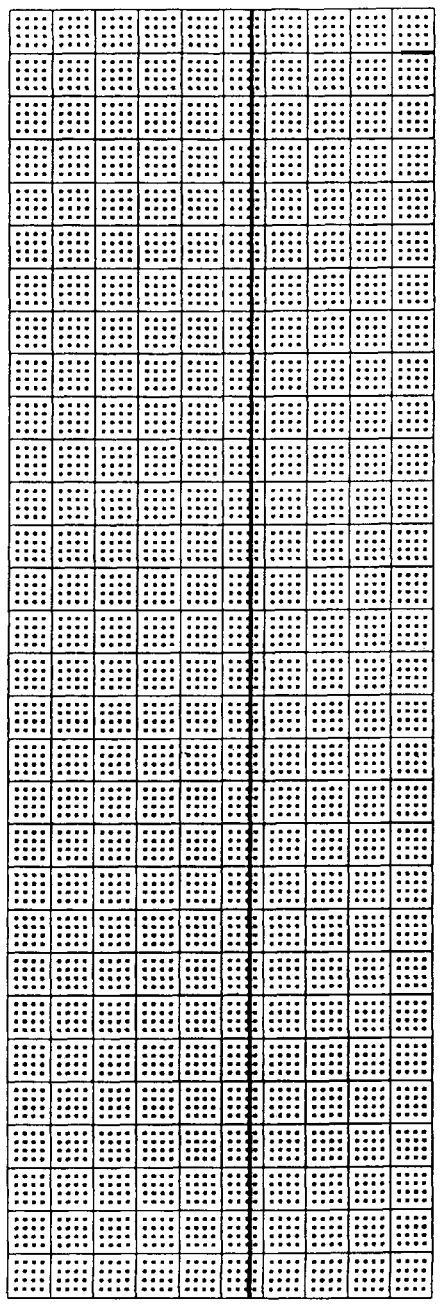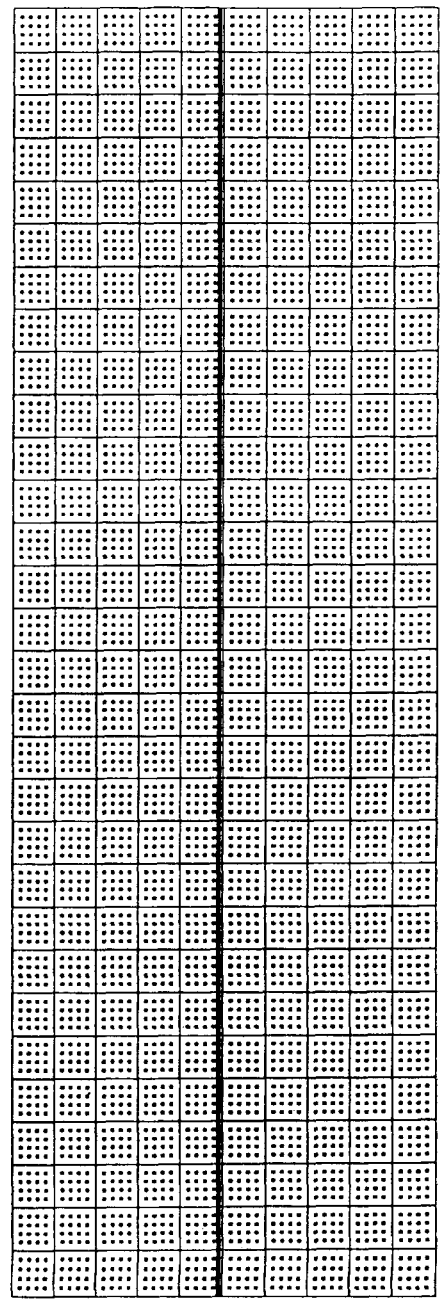
FIG. 10T

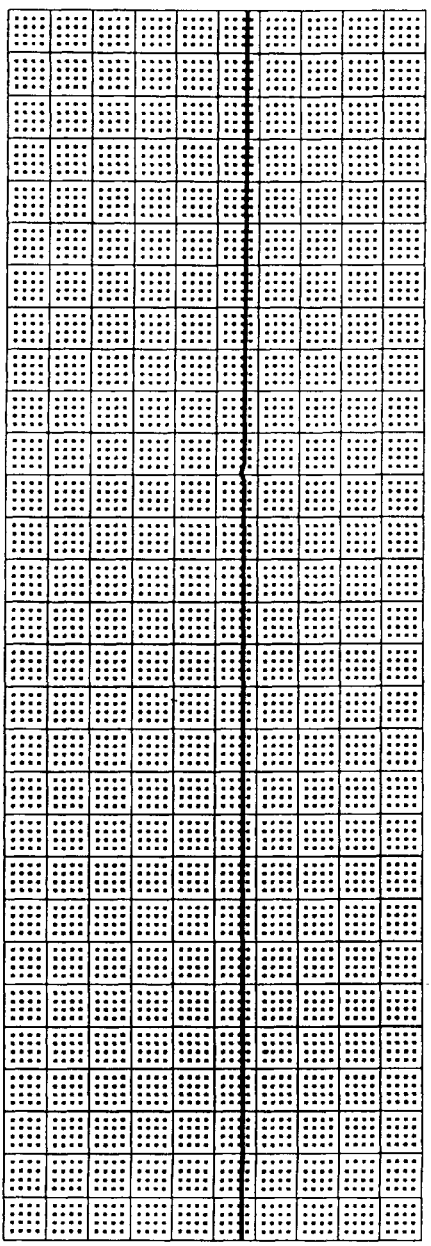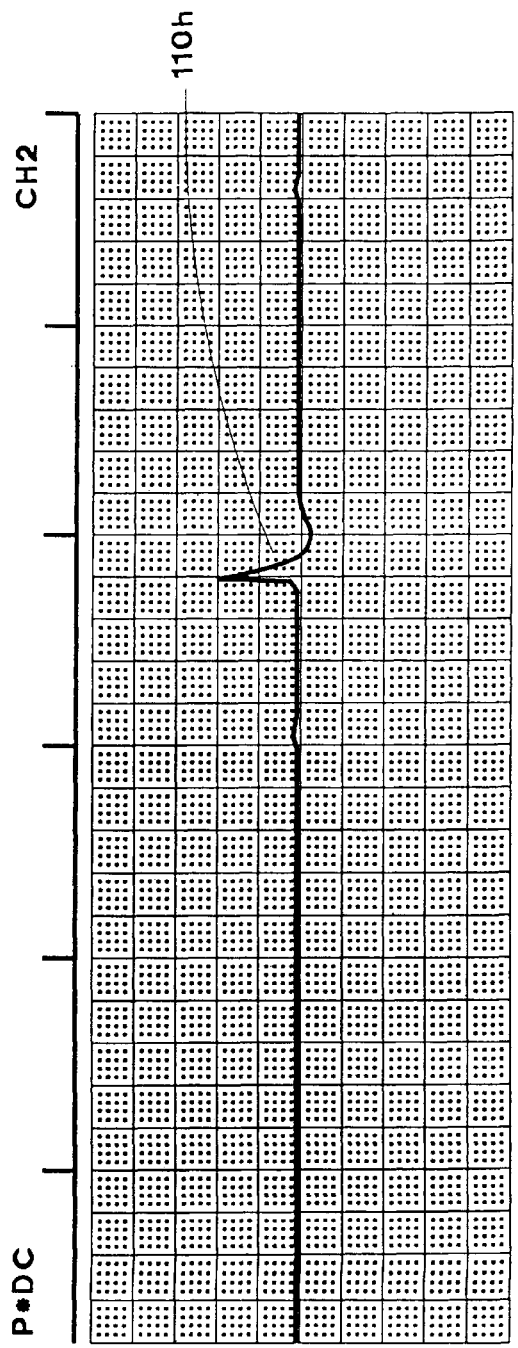
FIG. 10U

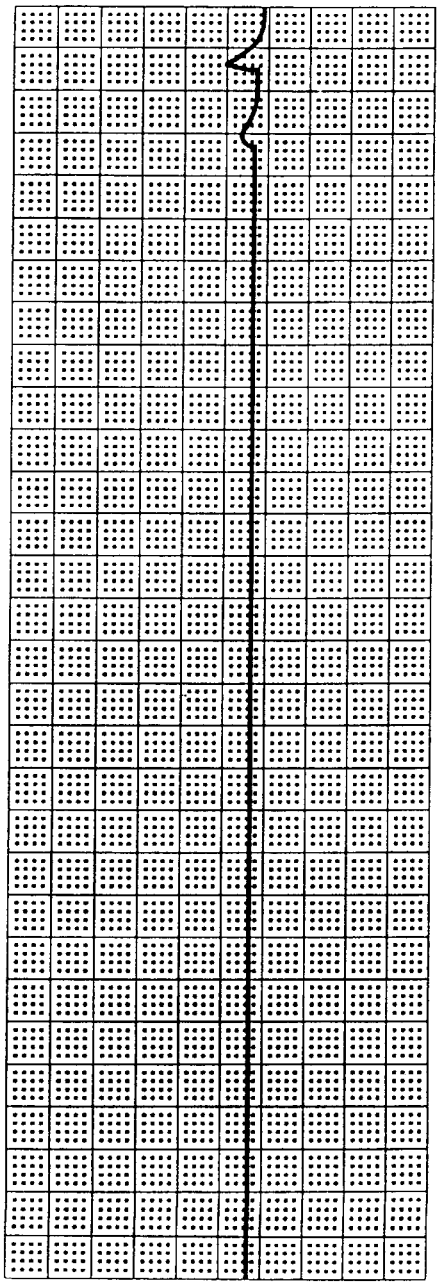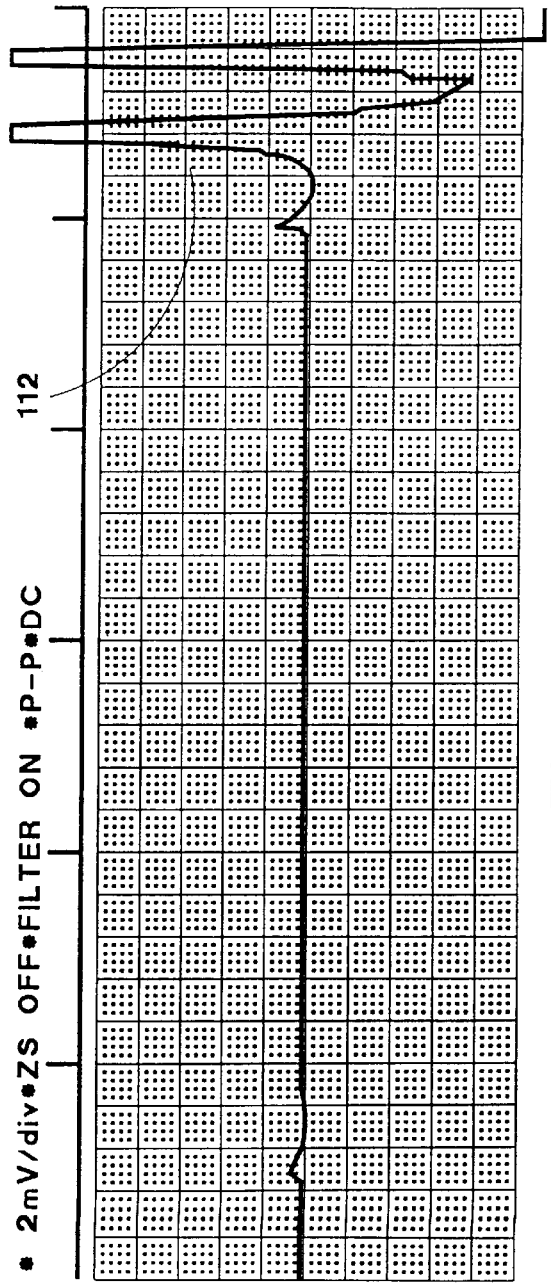
FIG. 10V

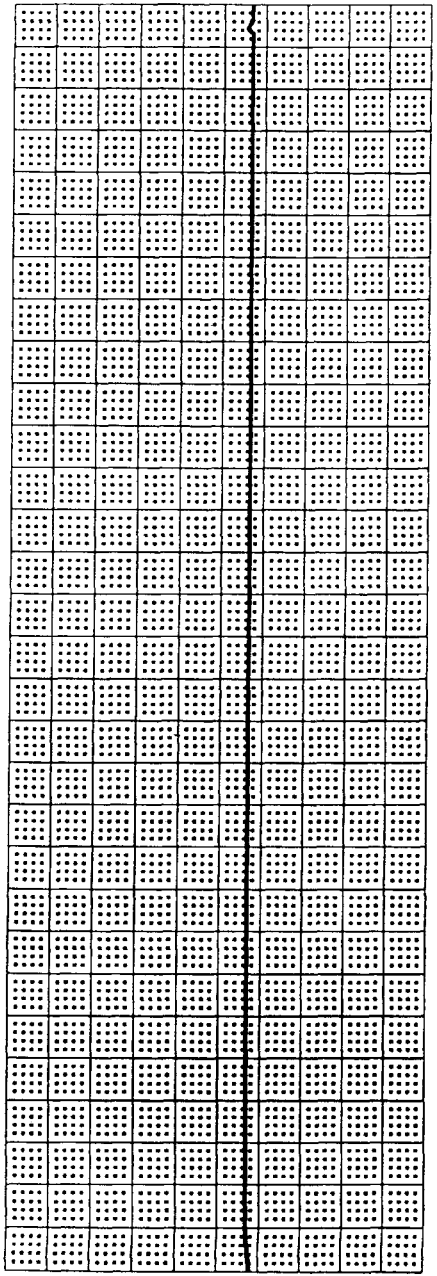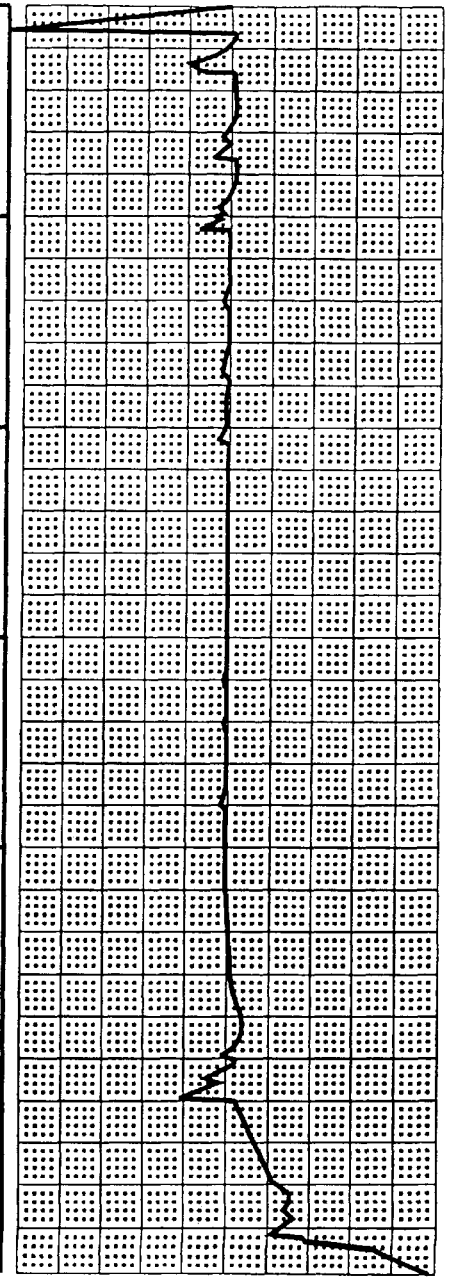
FIG. 10W

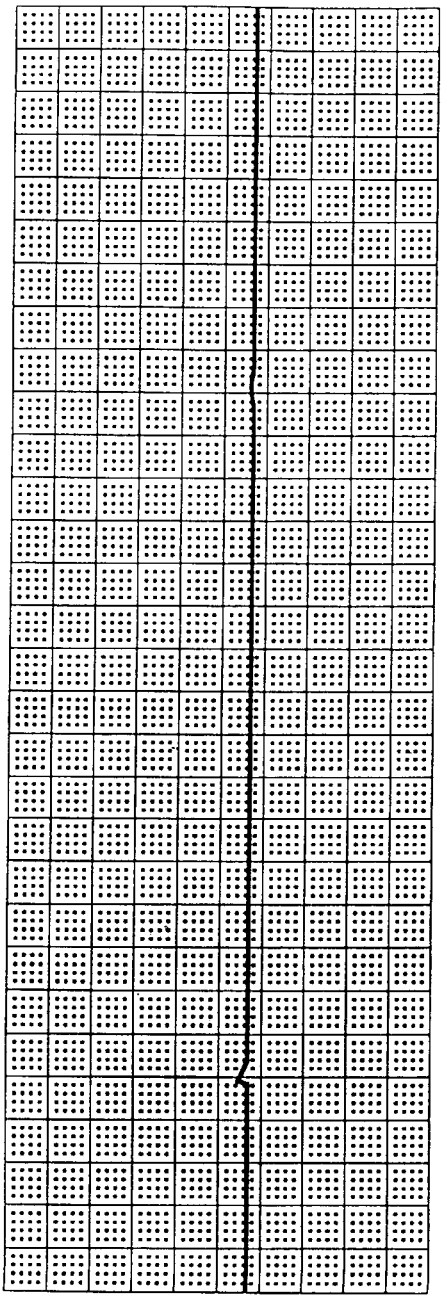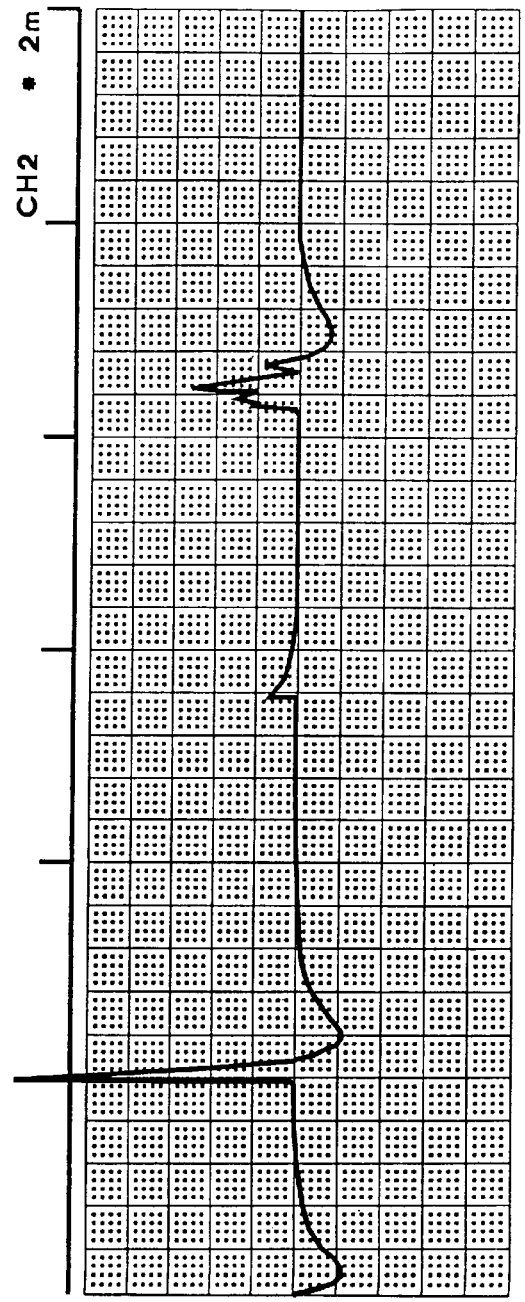
FIG. 10X

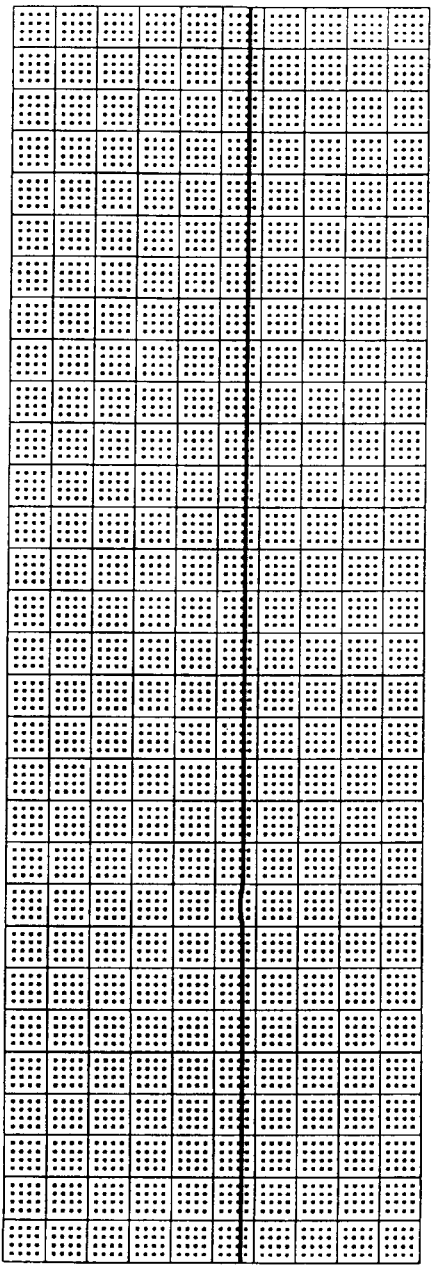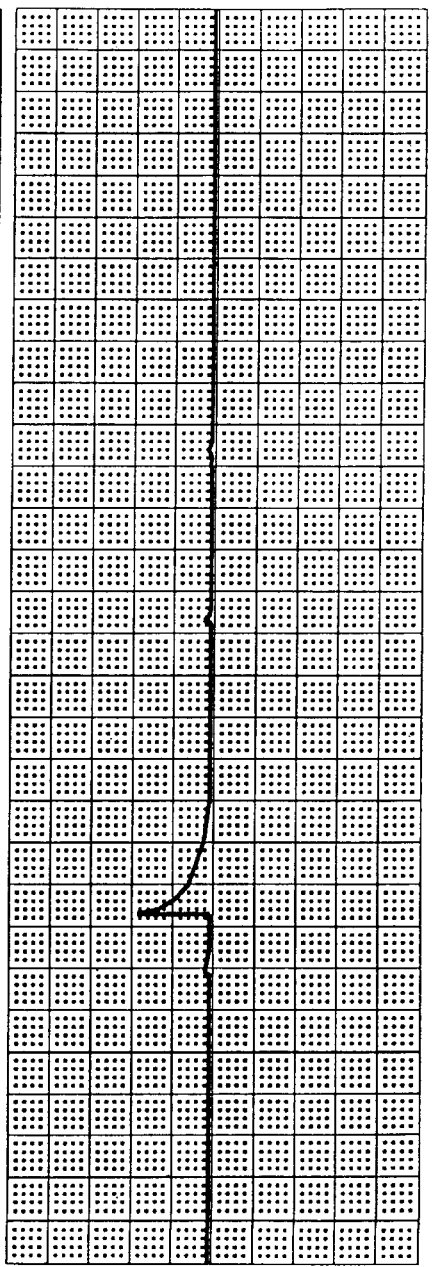
FIG. 10Y

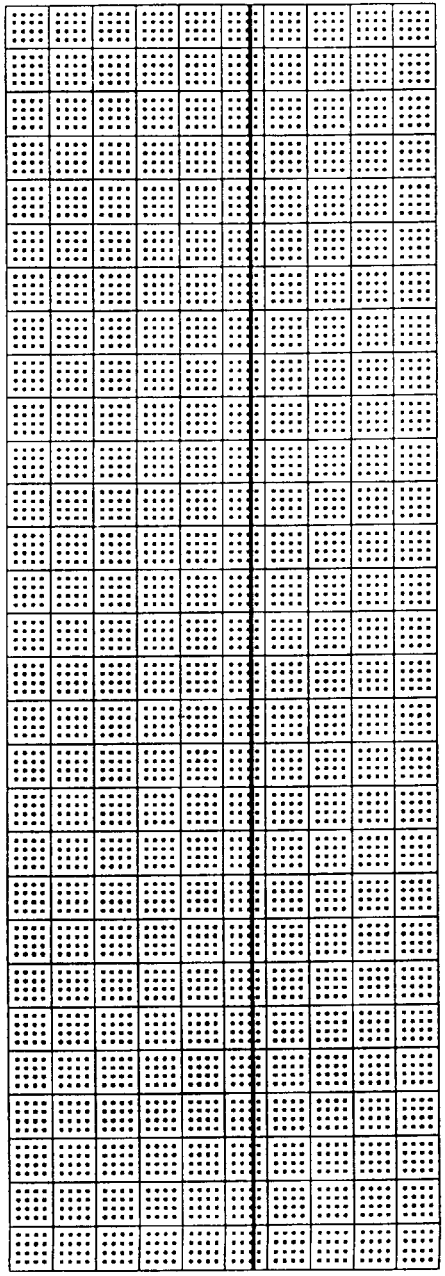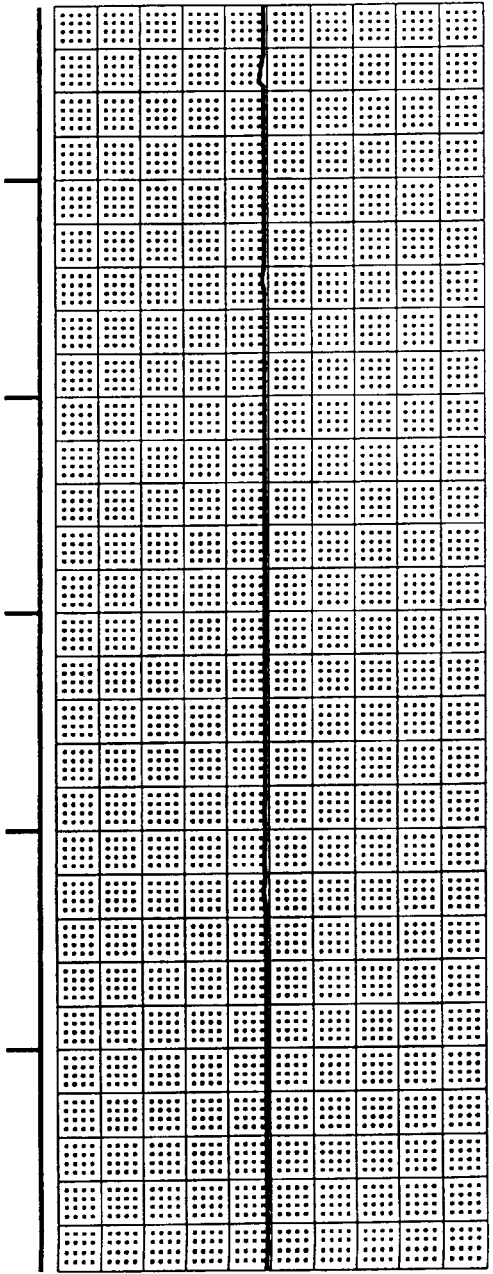
FIG. 10Z

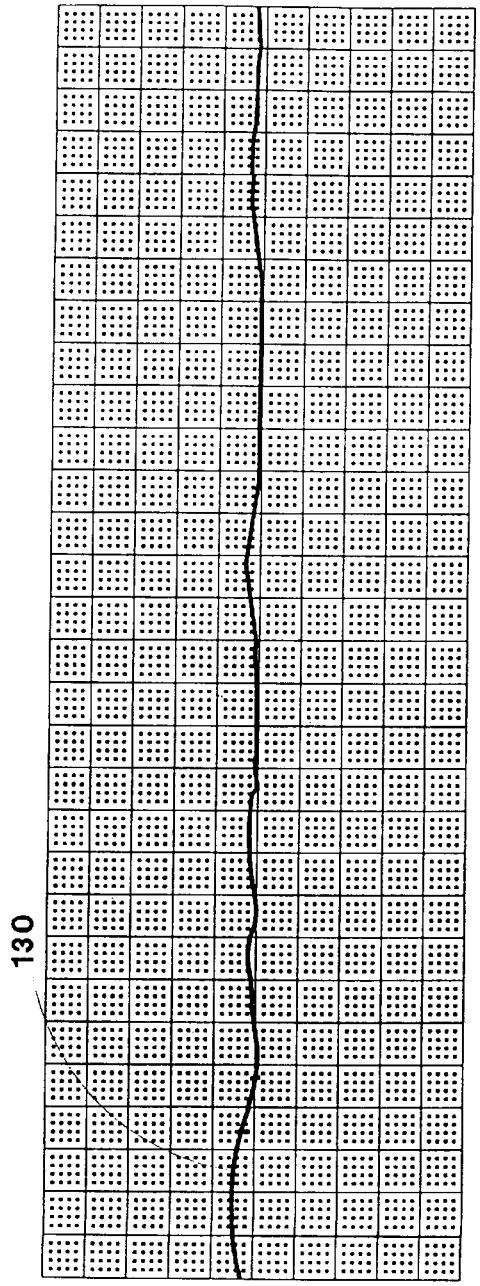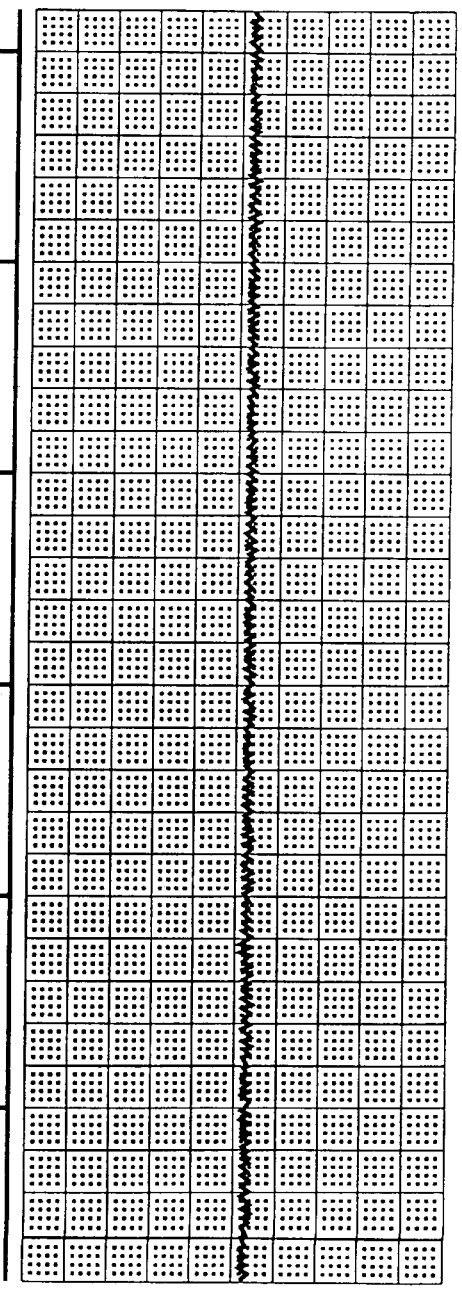
FIG. 11B

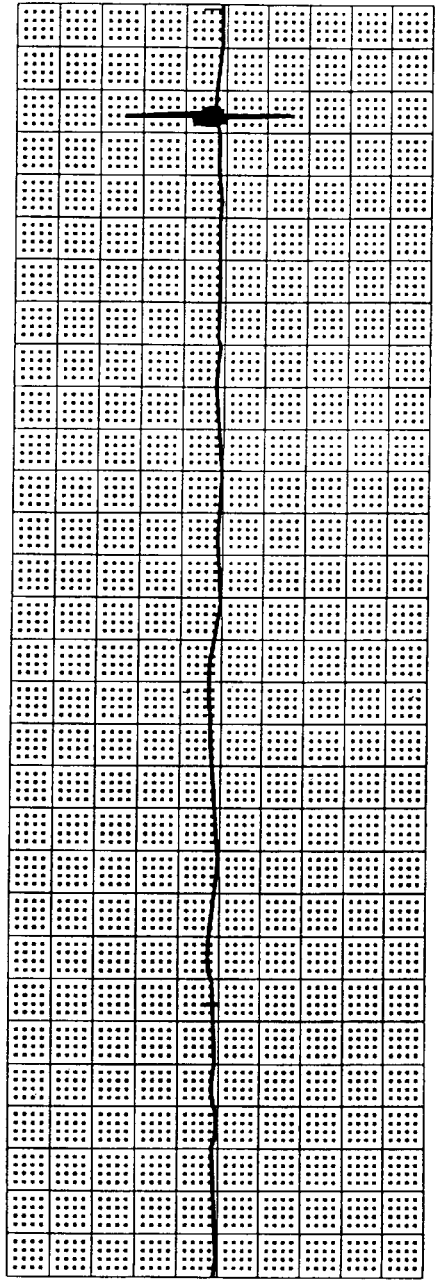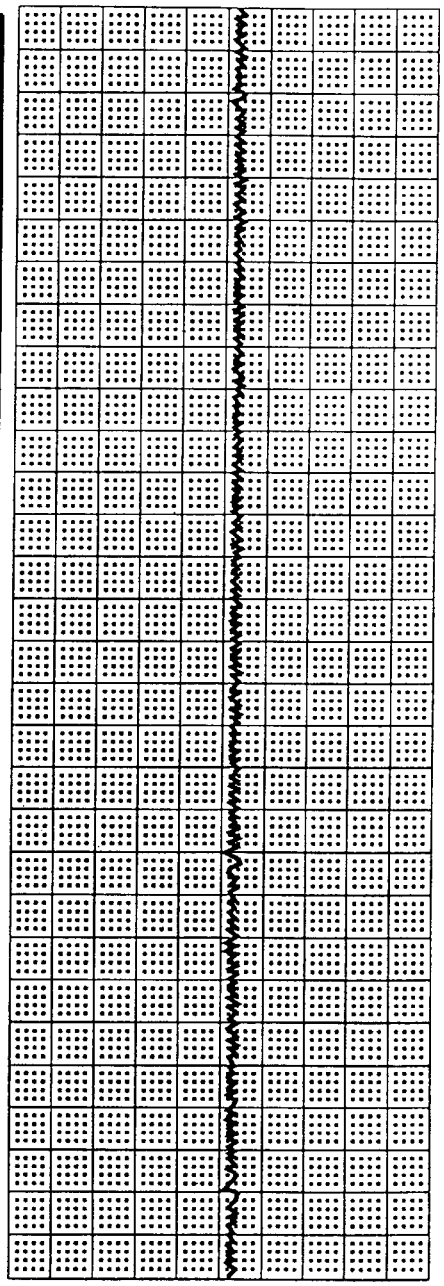
FIG. 11D

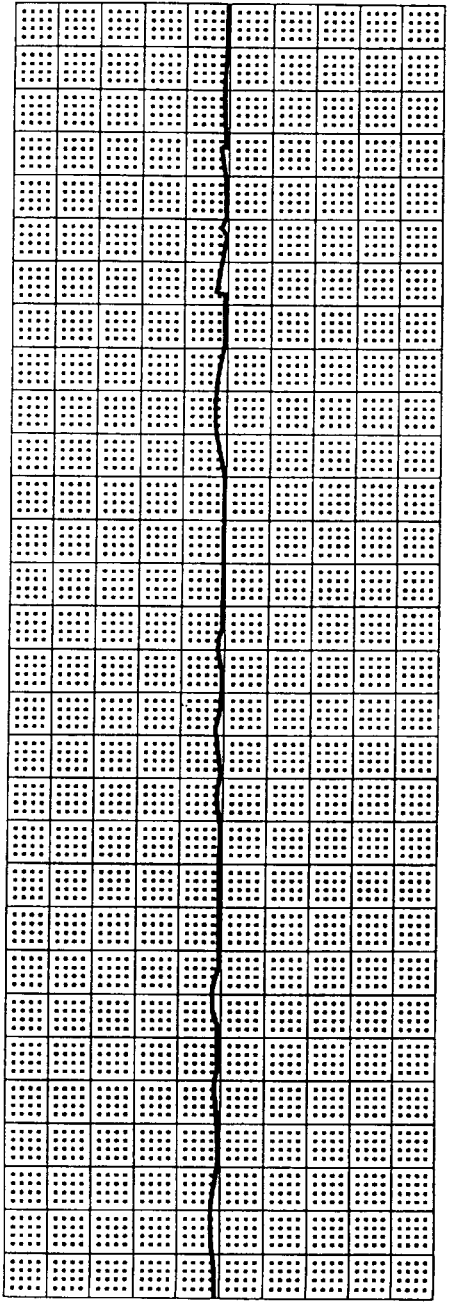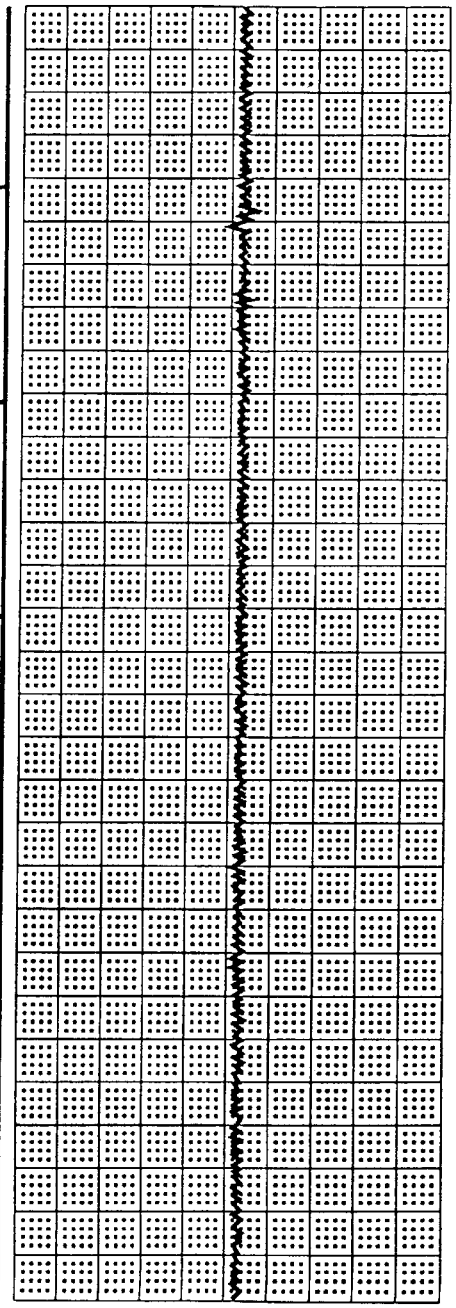
FIG. 11F

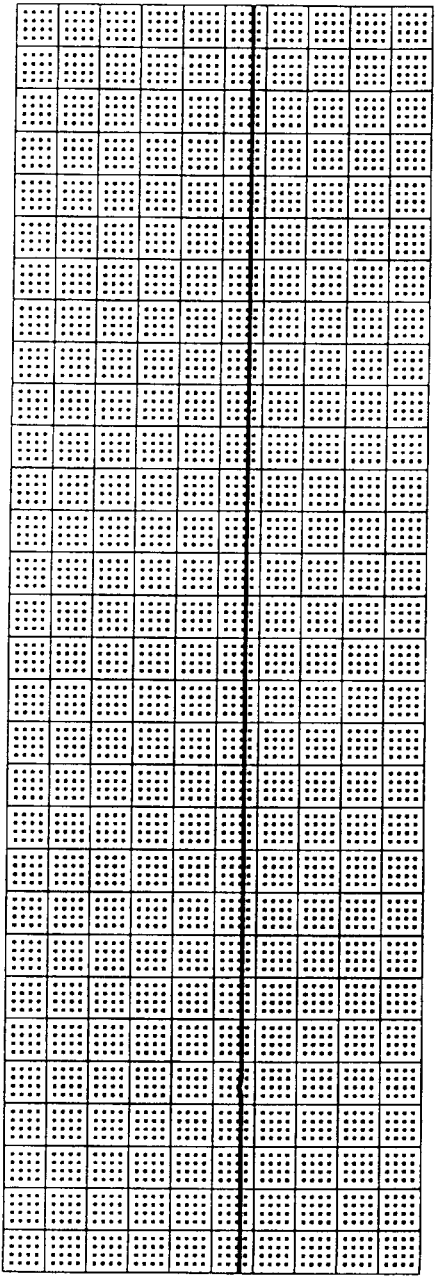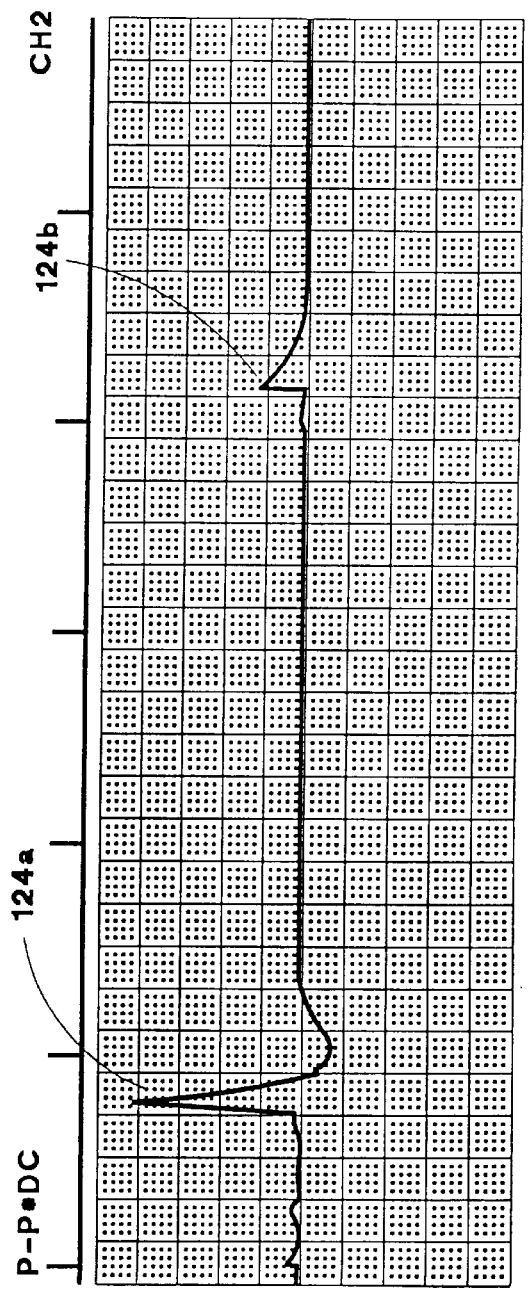
FIG. 12A

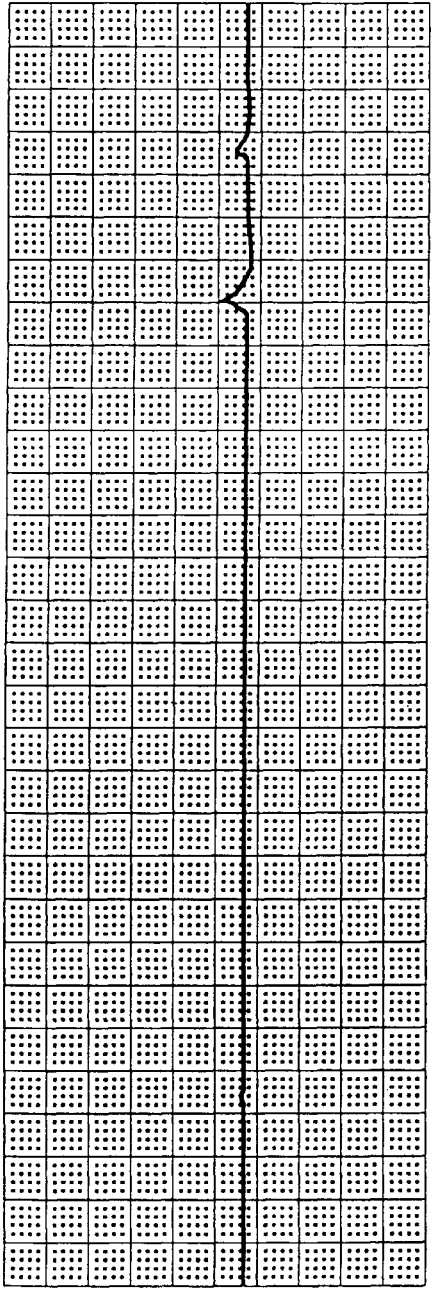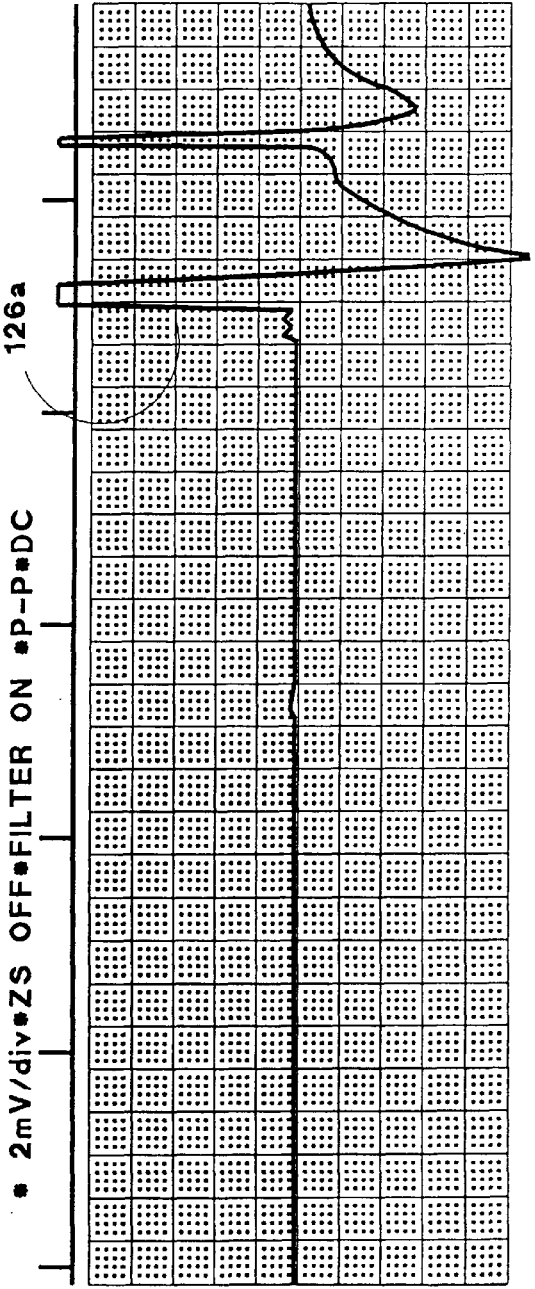
FIG. 12B

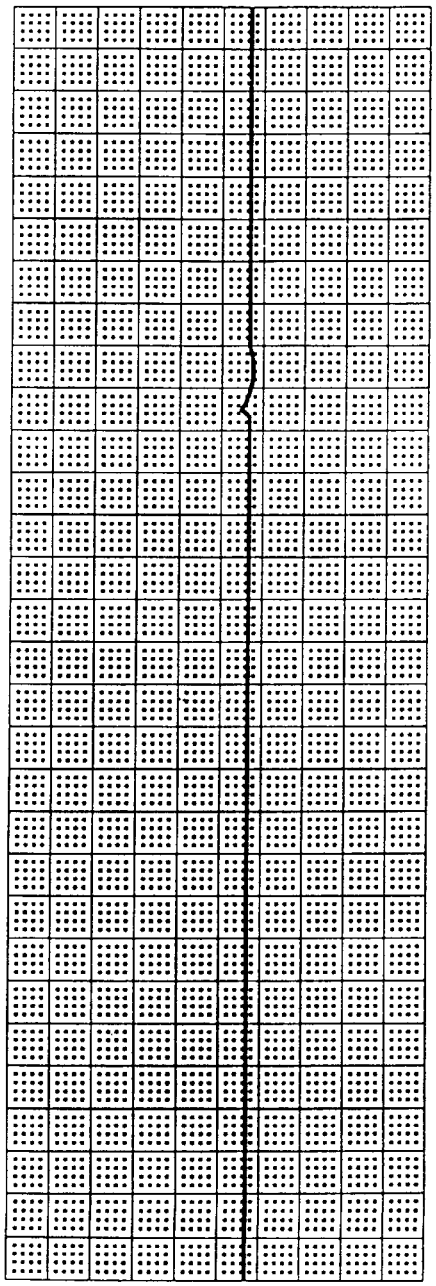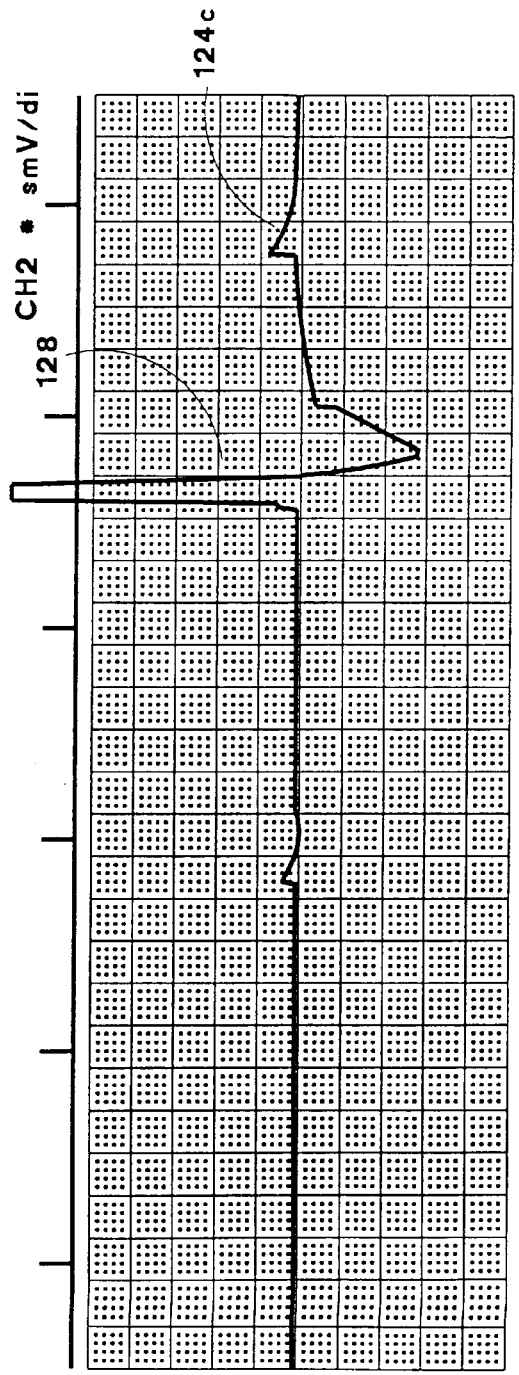
FIG. 12C

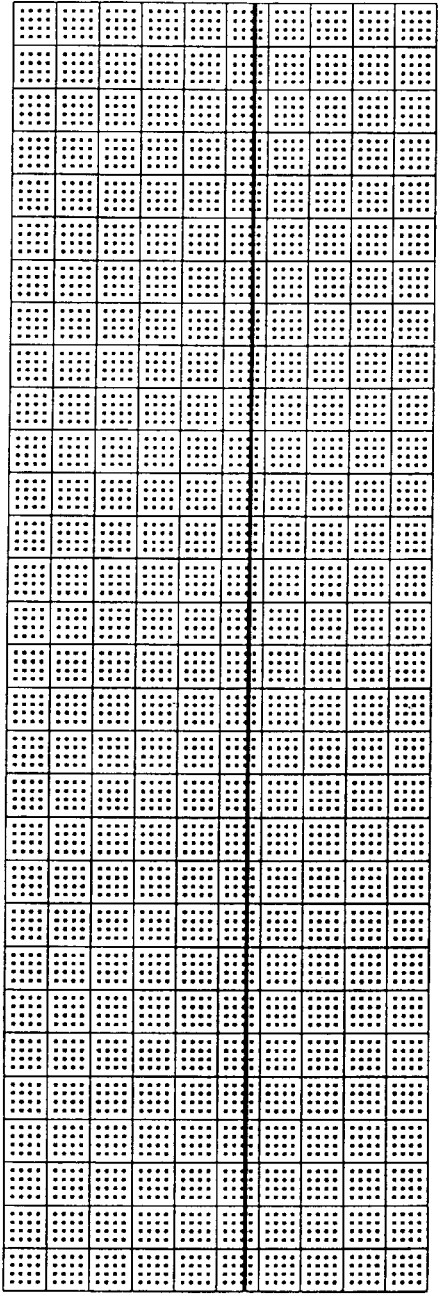
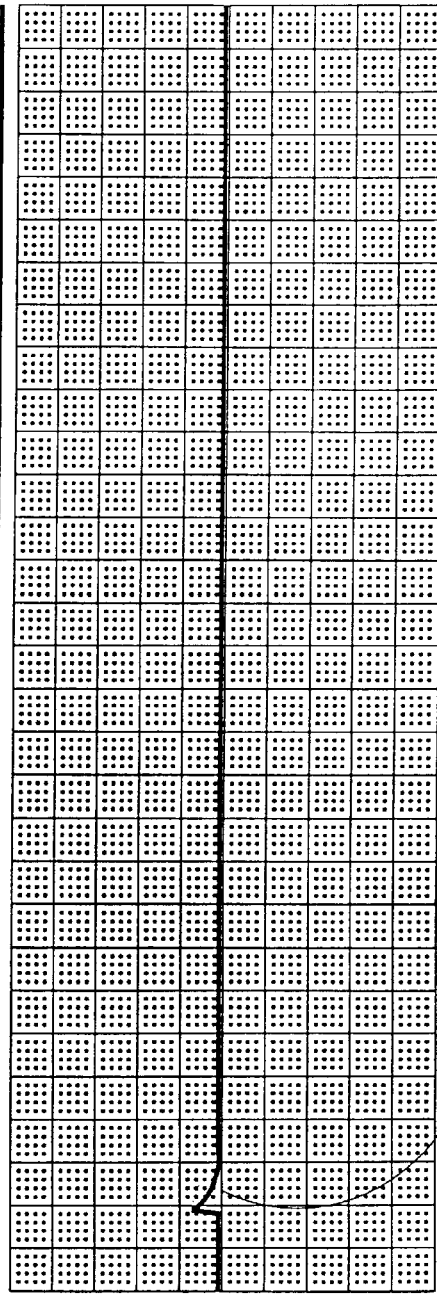
FIG. 12D

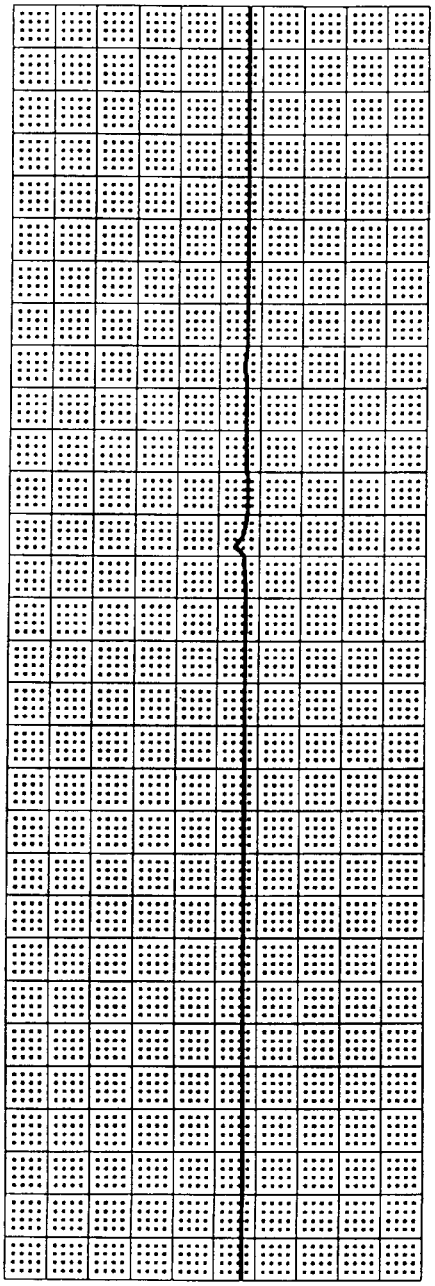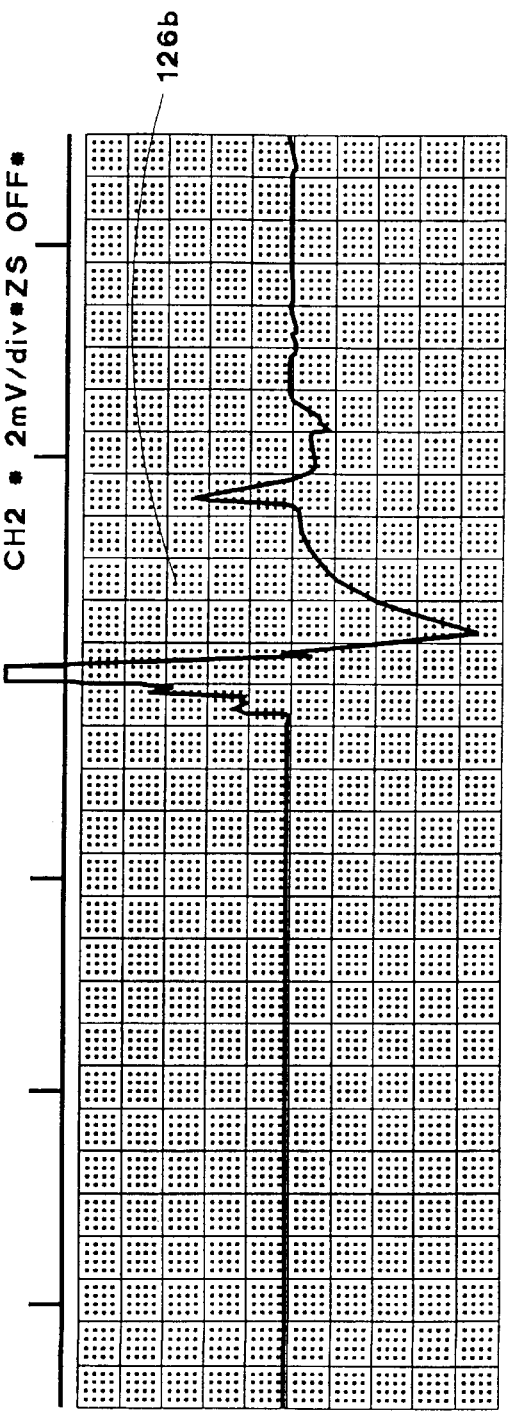
FIG. 12E

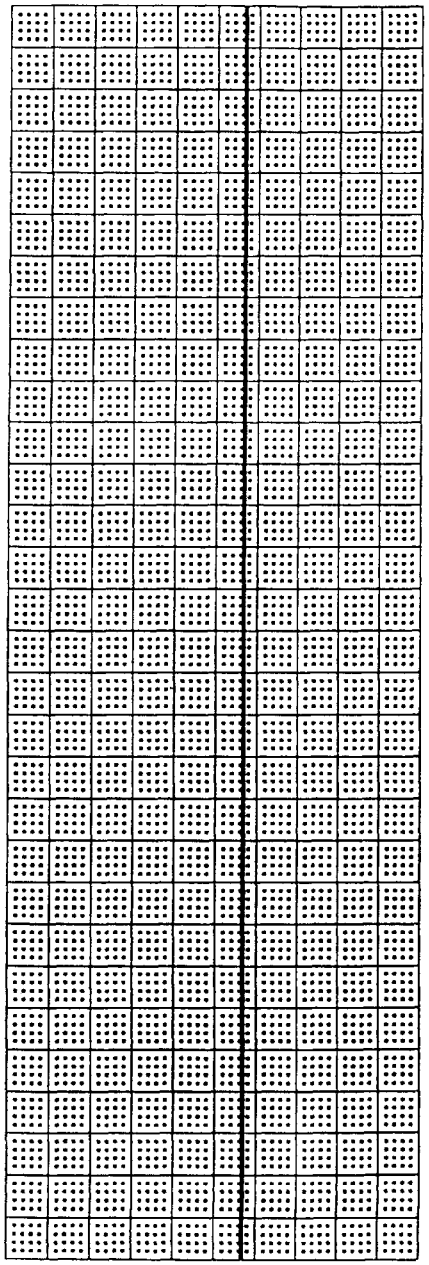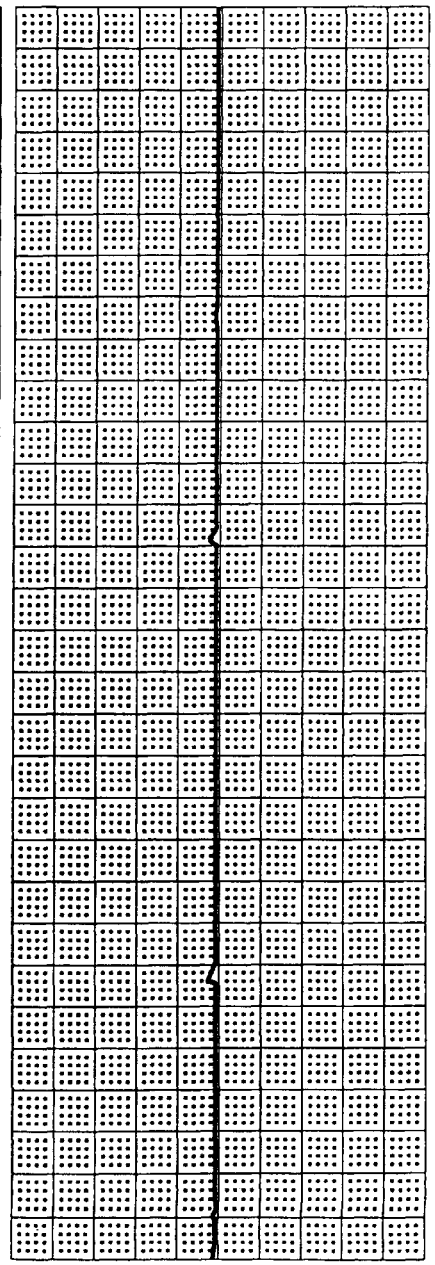
FIG. 12F

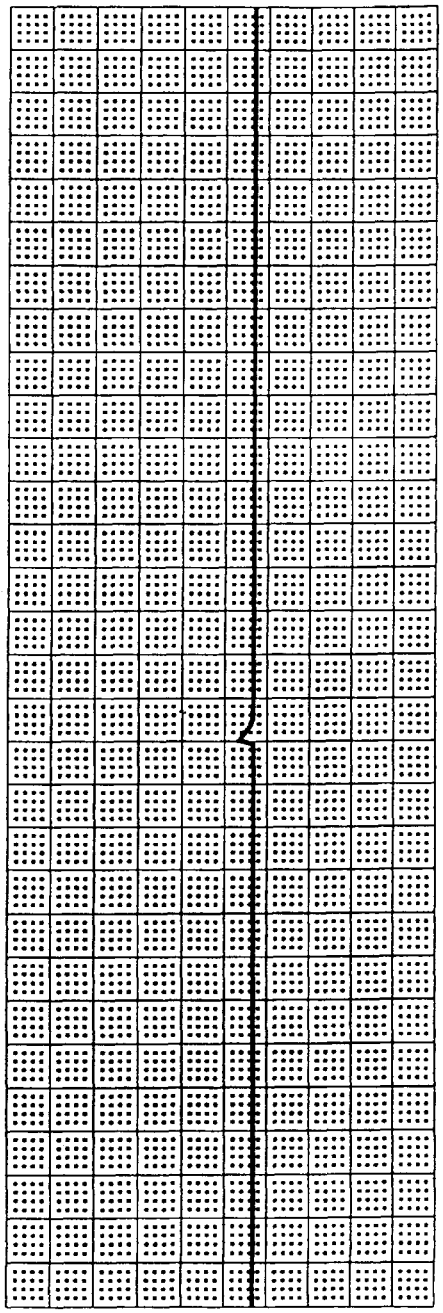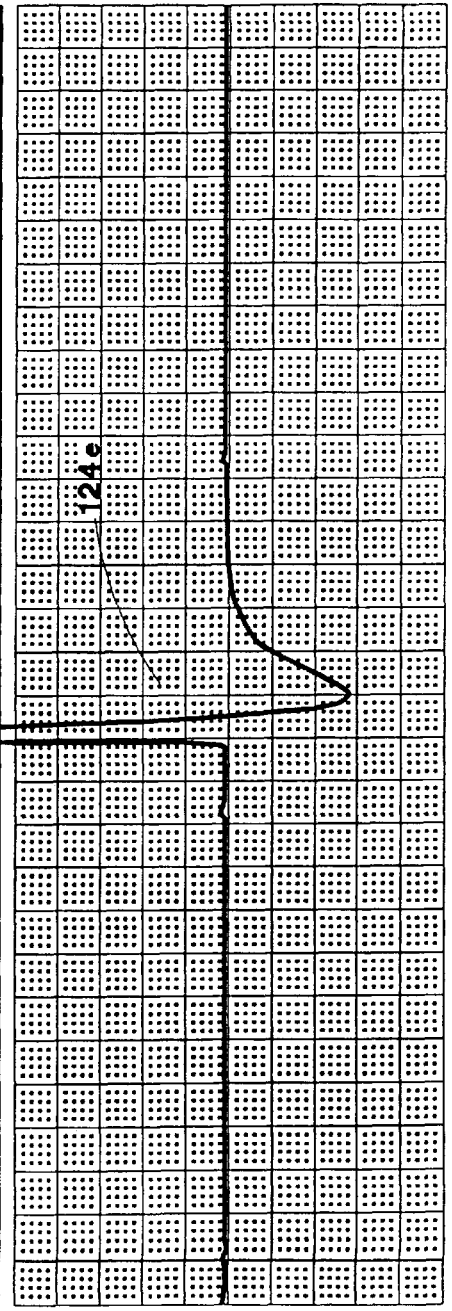
FIG. 12G

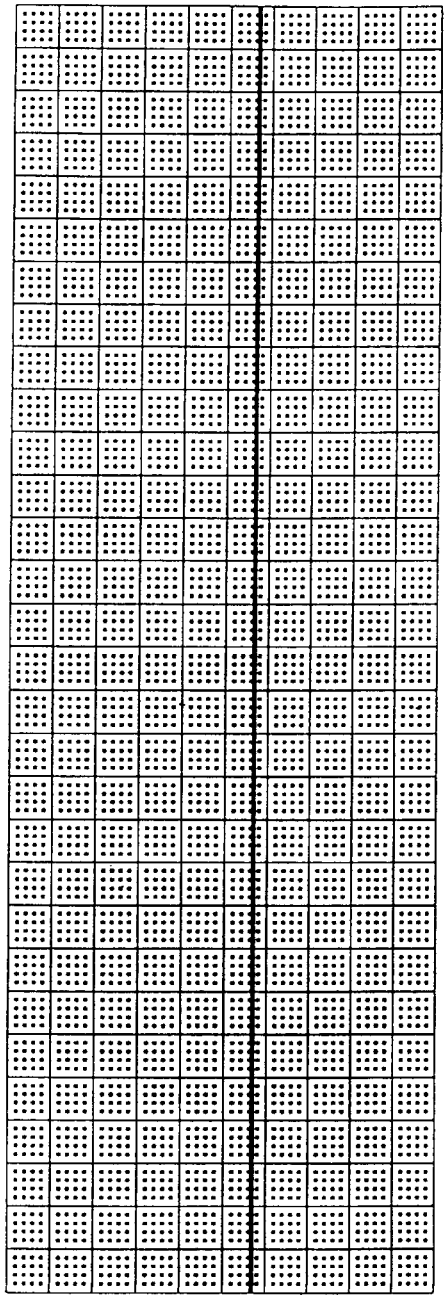
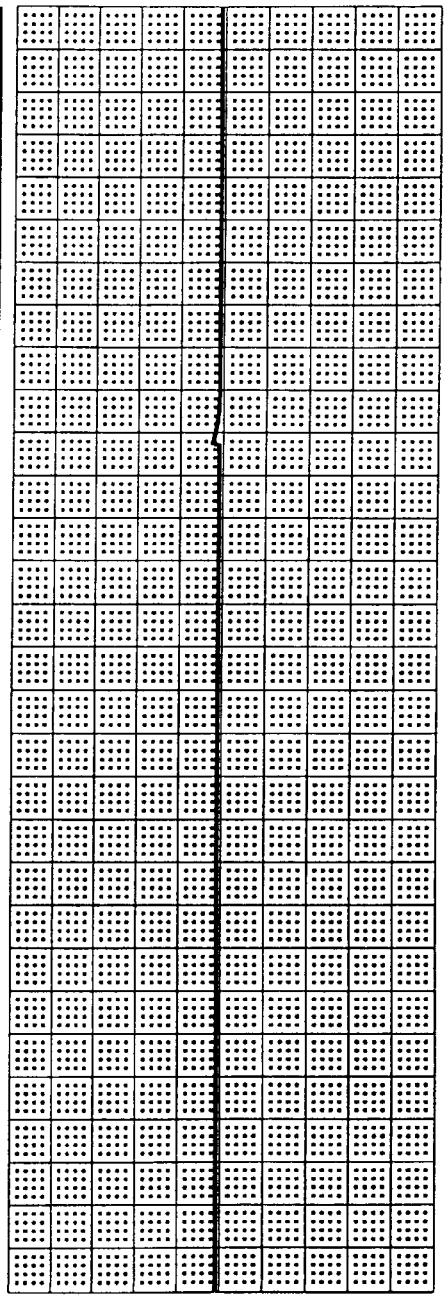
FIG. 12H

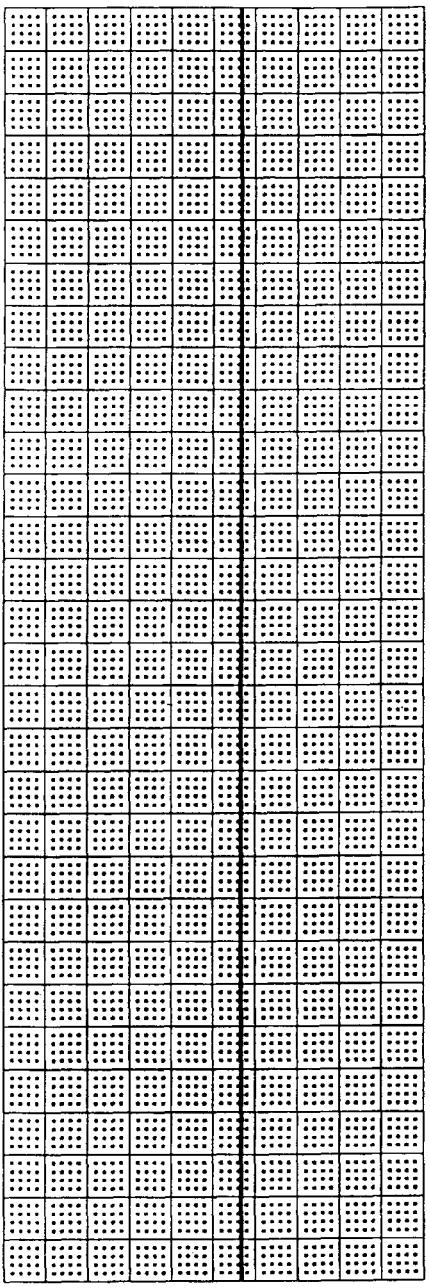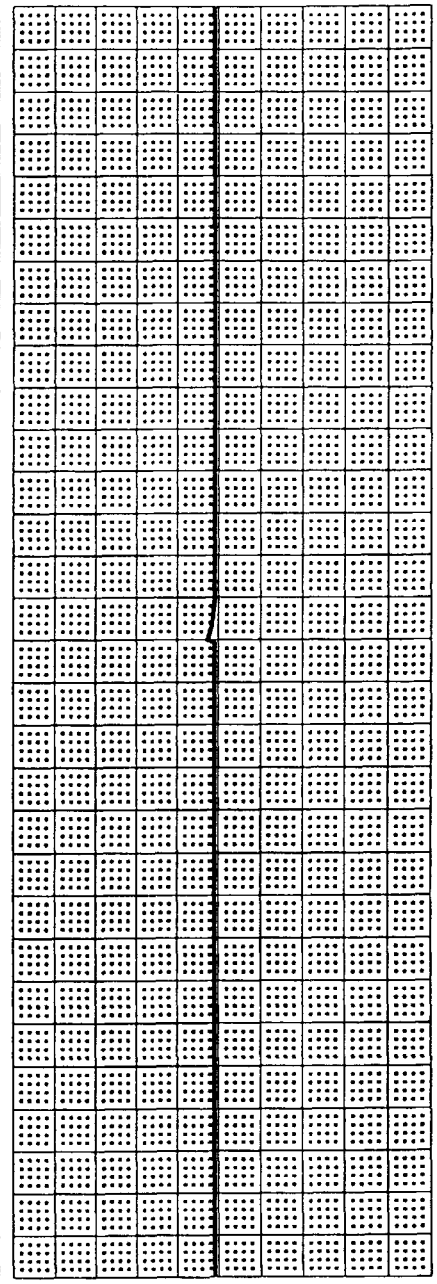
FIG. 121

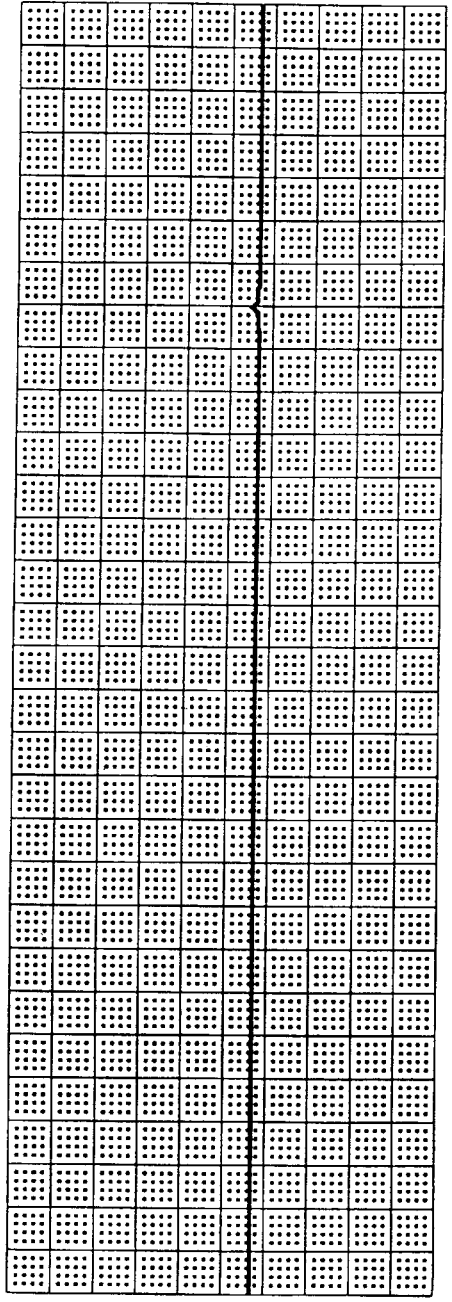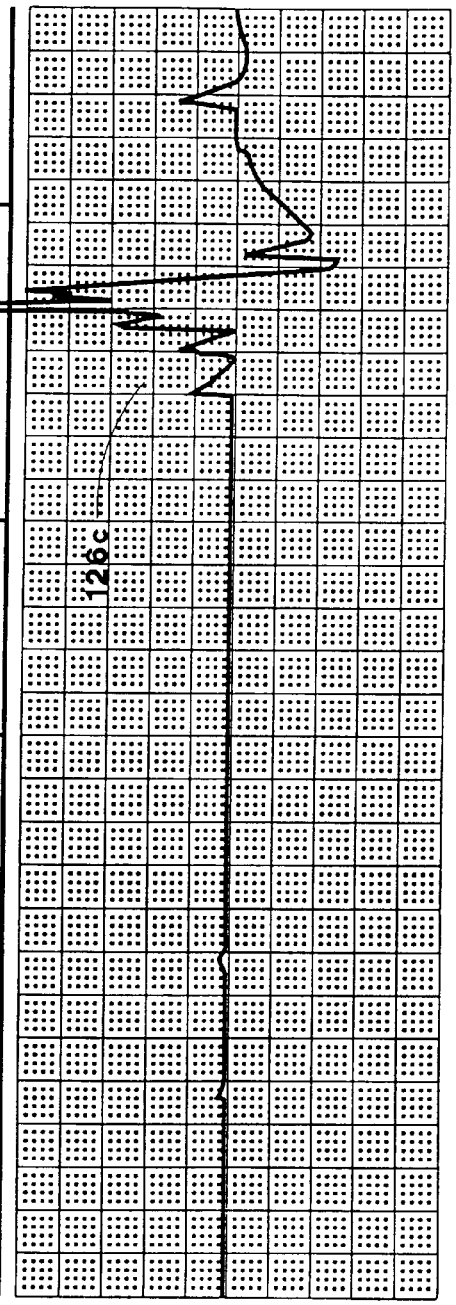
FIG. 12J

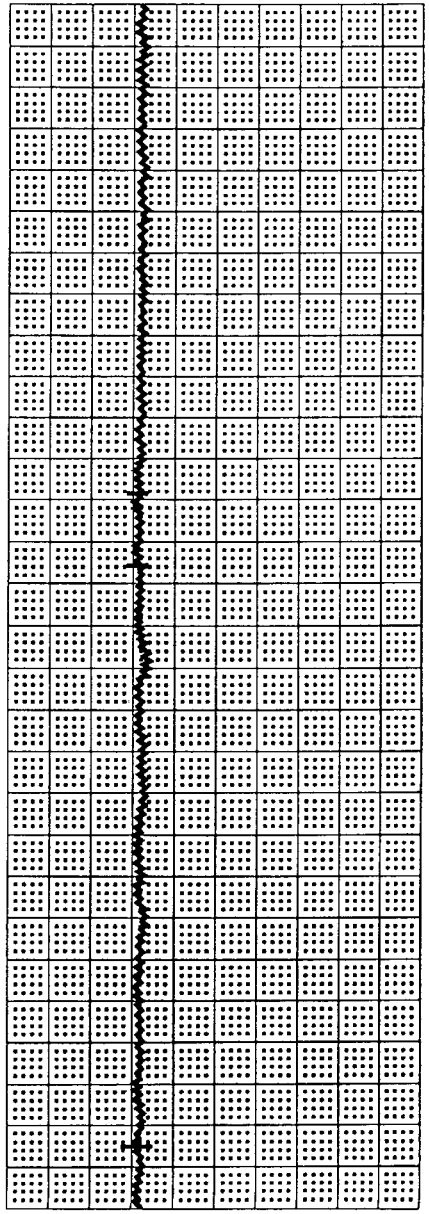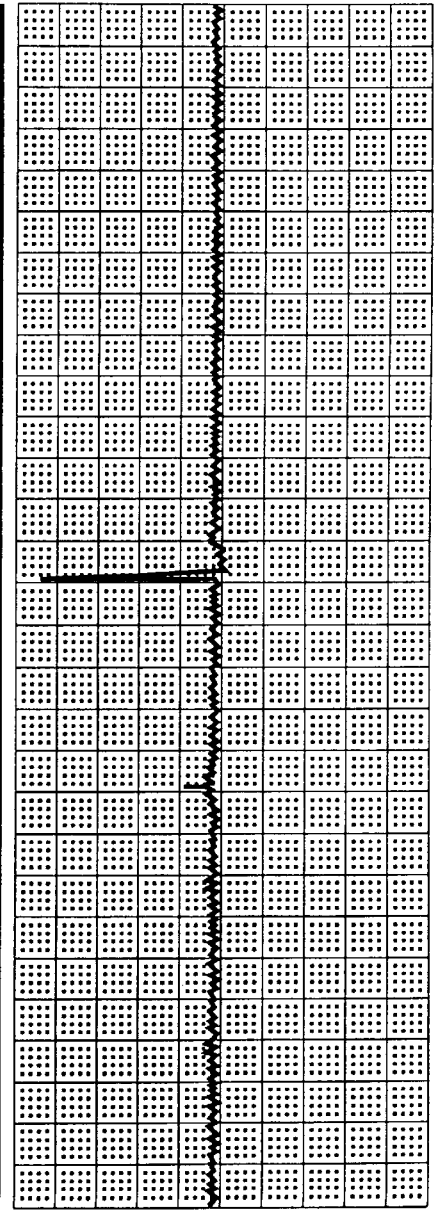
FIG. 24A

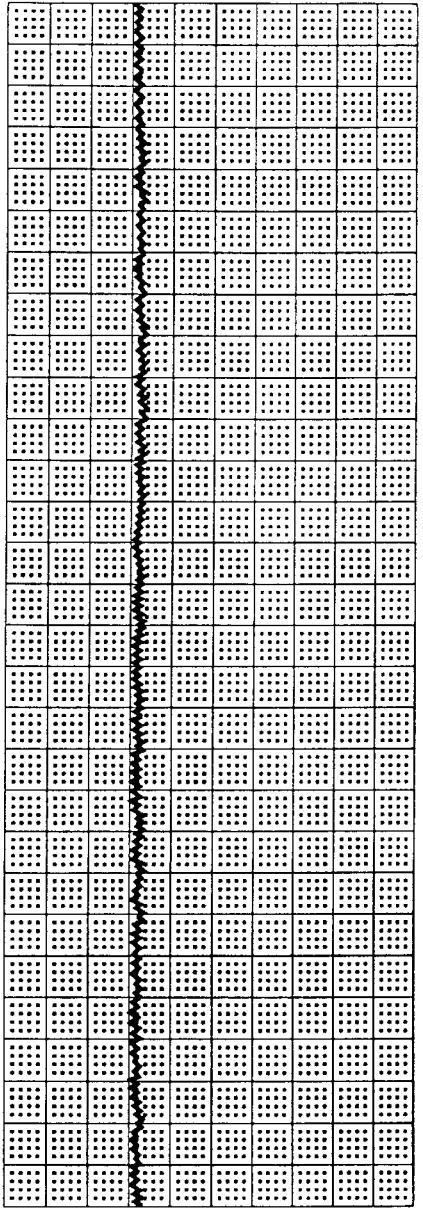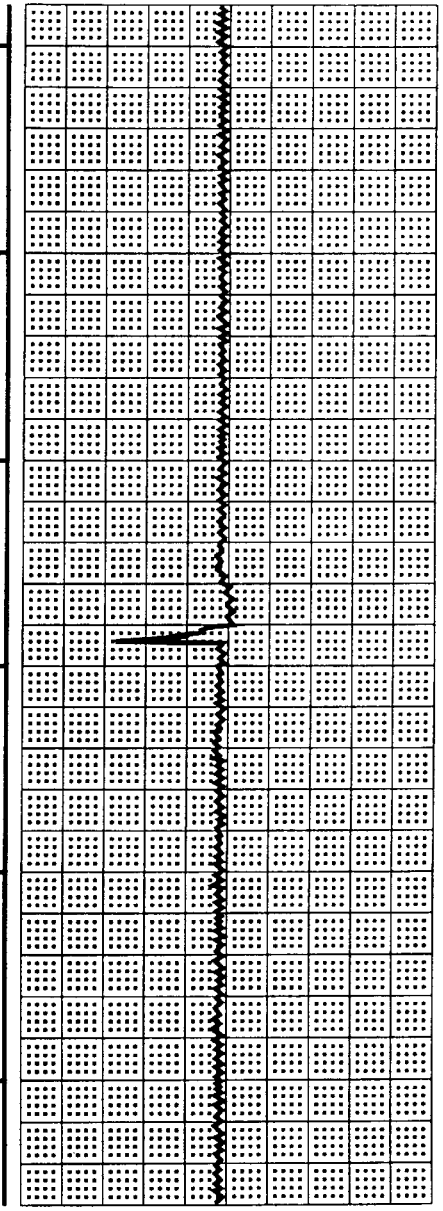
FIG. 24C

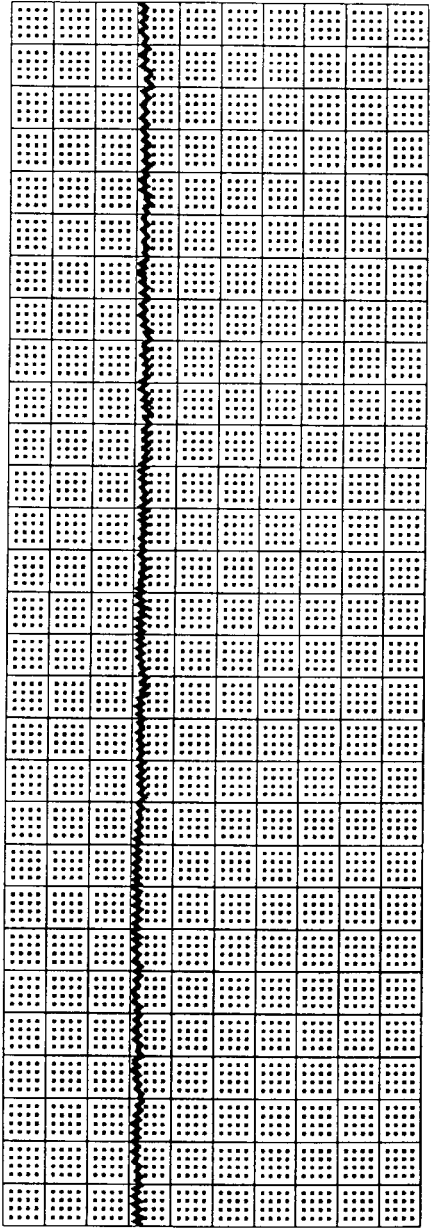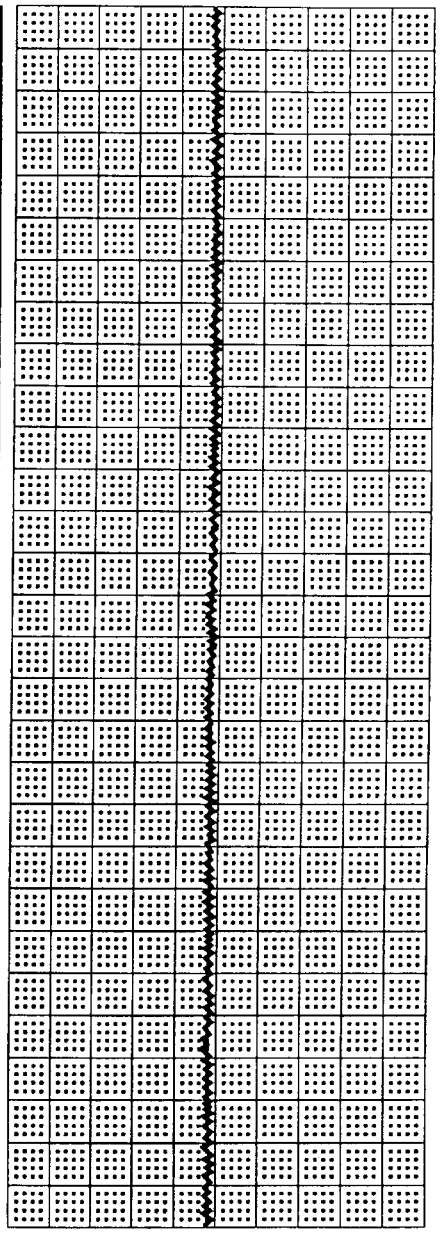
FIG. 24E

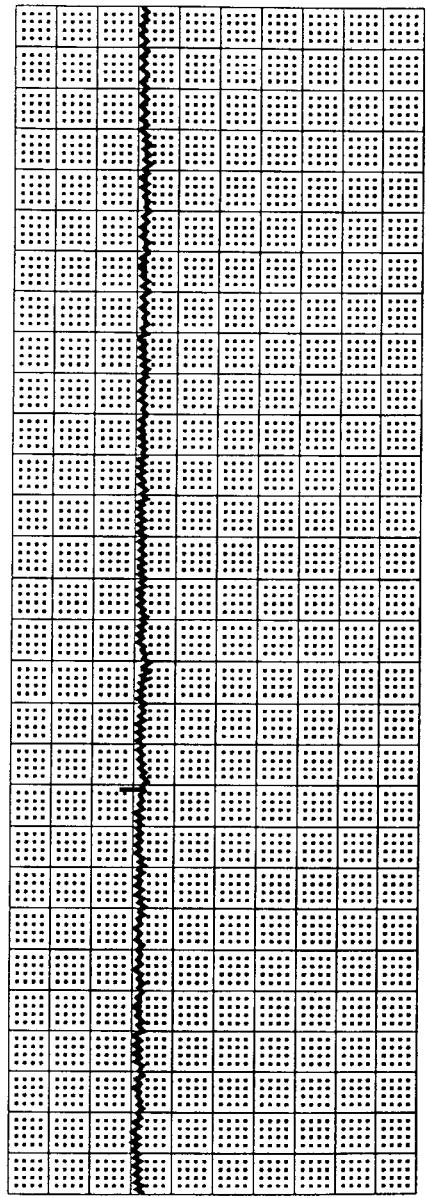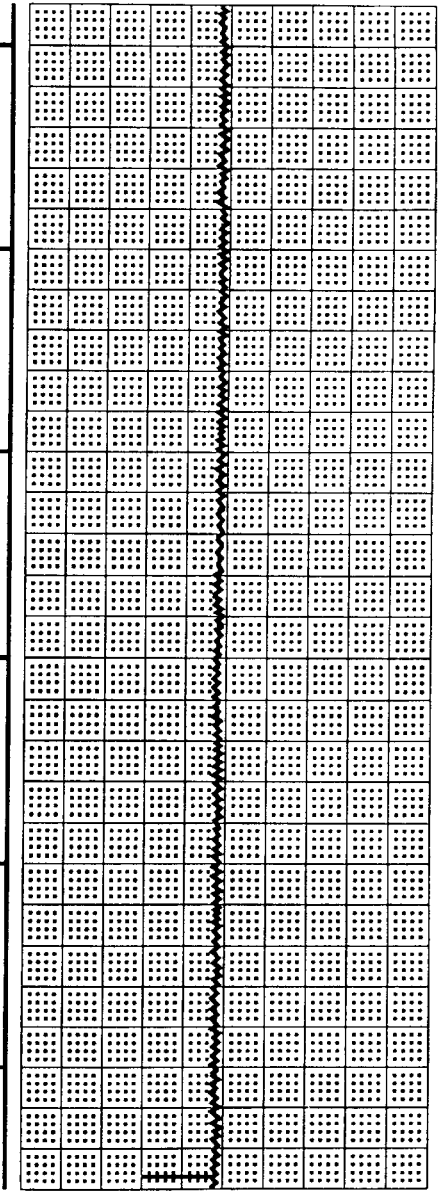
FIG. 24F

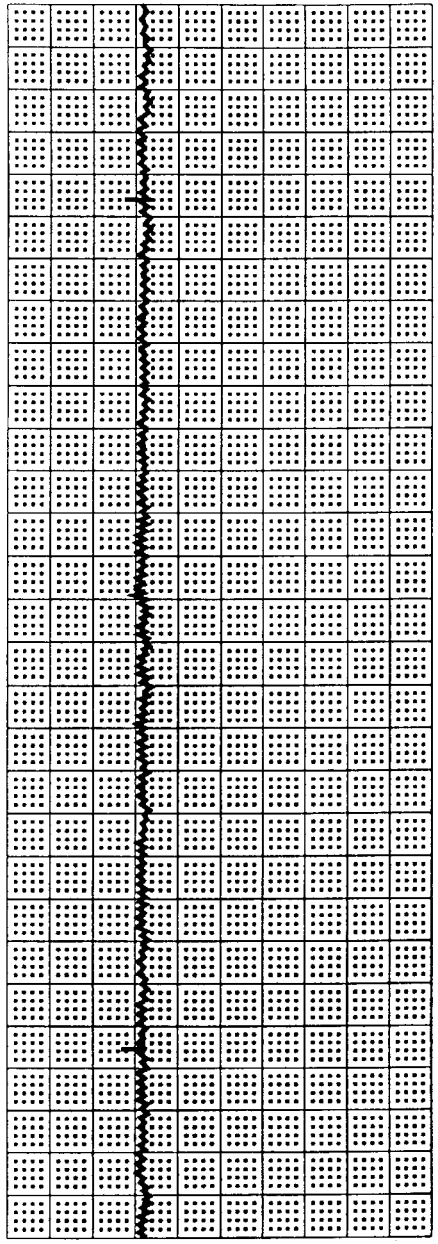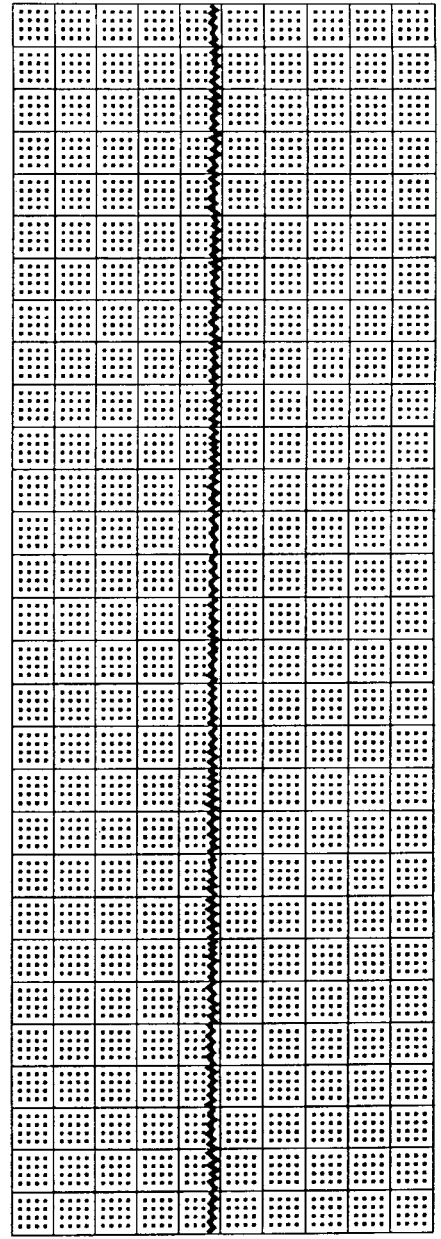
FIG. 24G

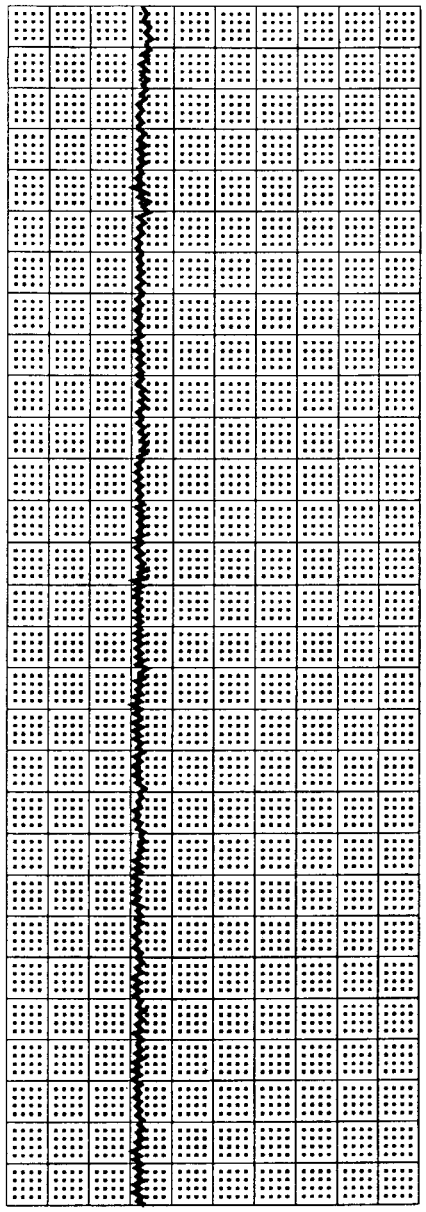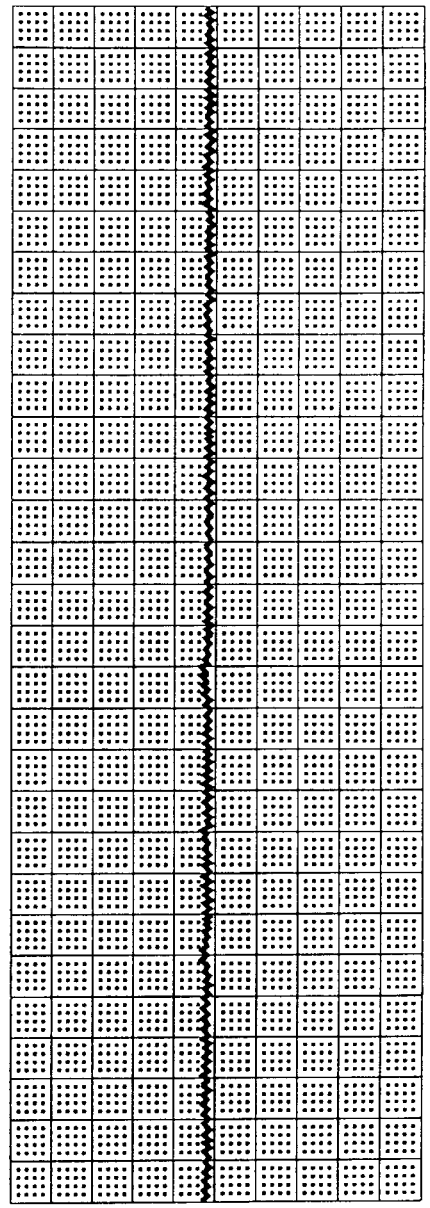
FIG. 24H

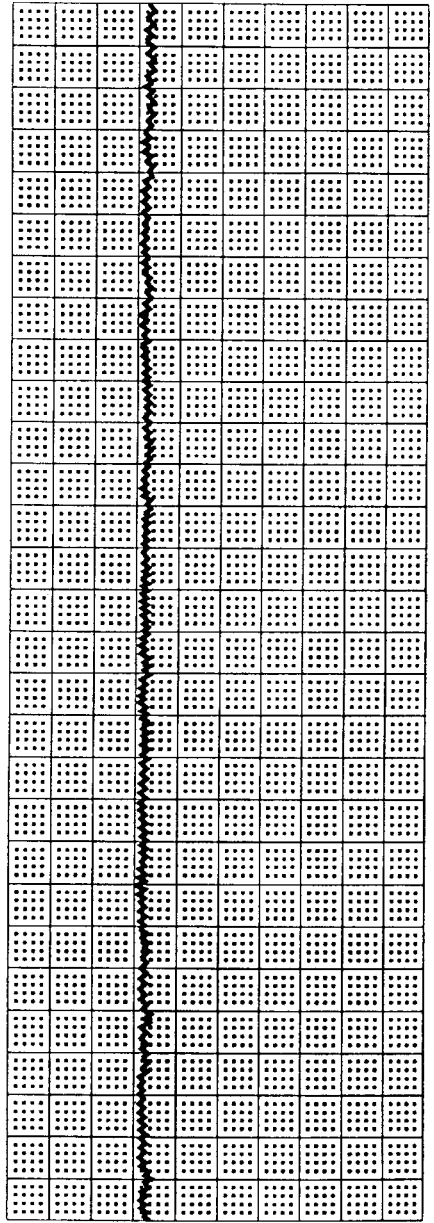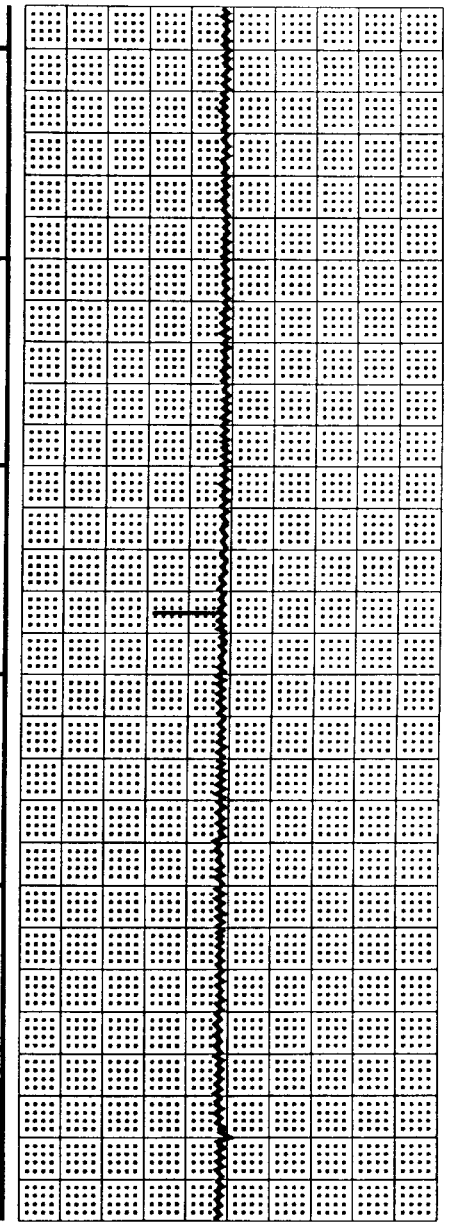
FIG. 24J

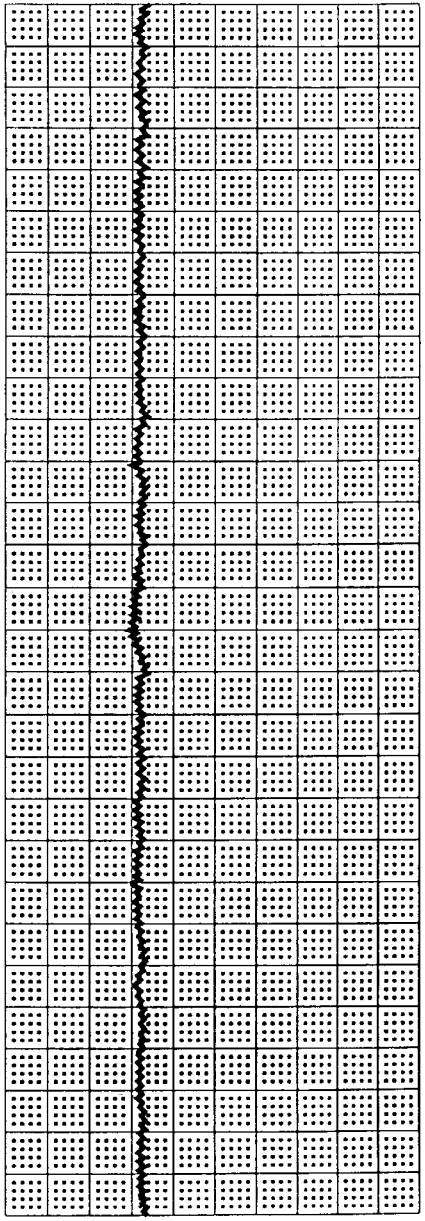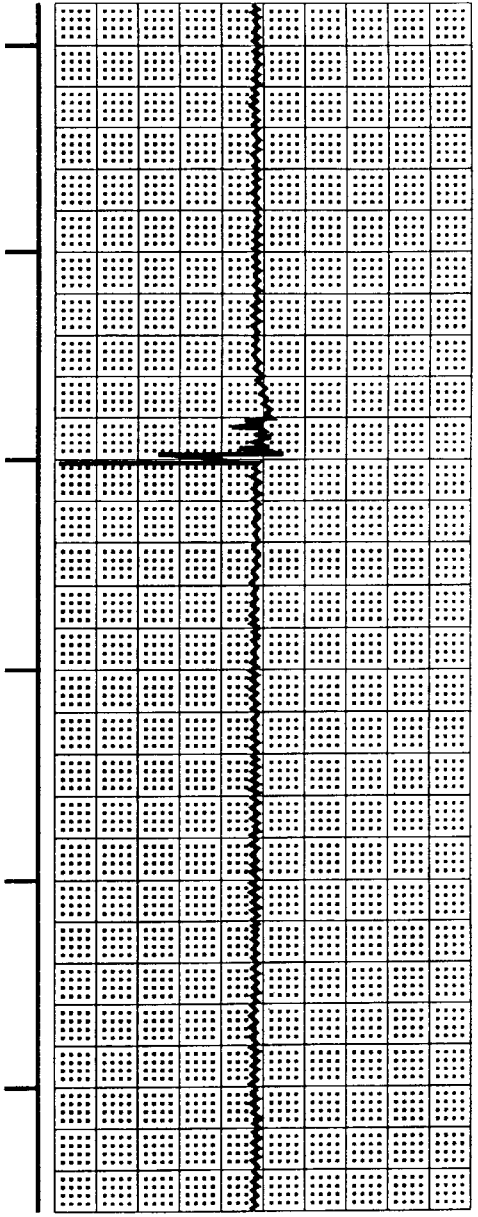
FIG. 24K

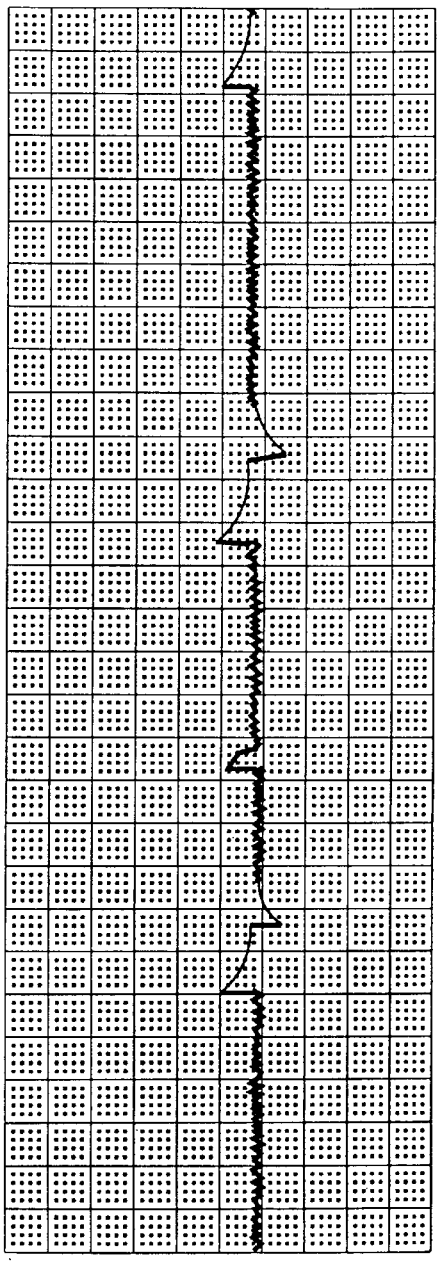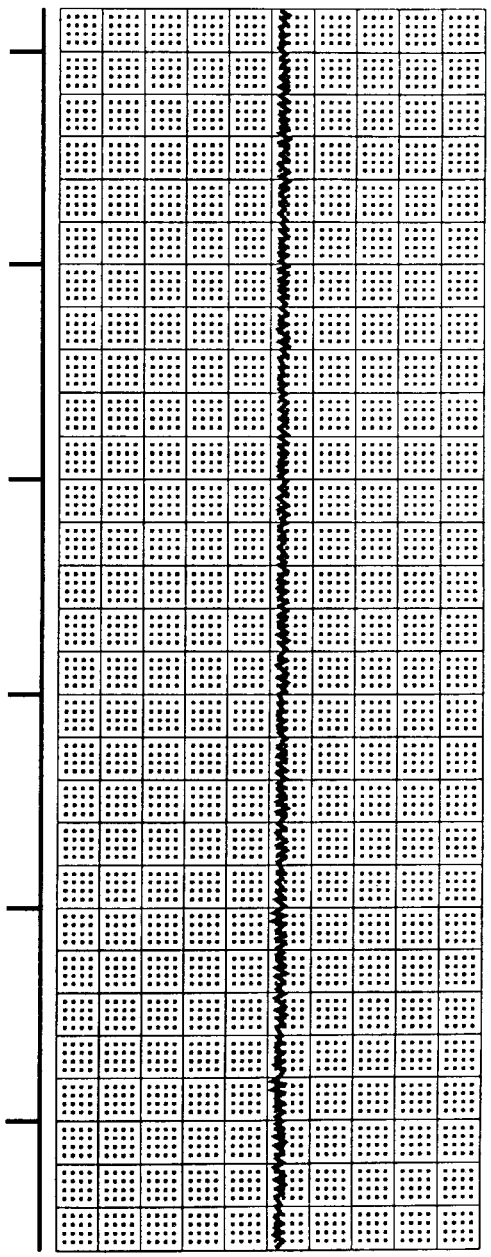
FIG. 25B

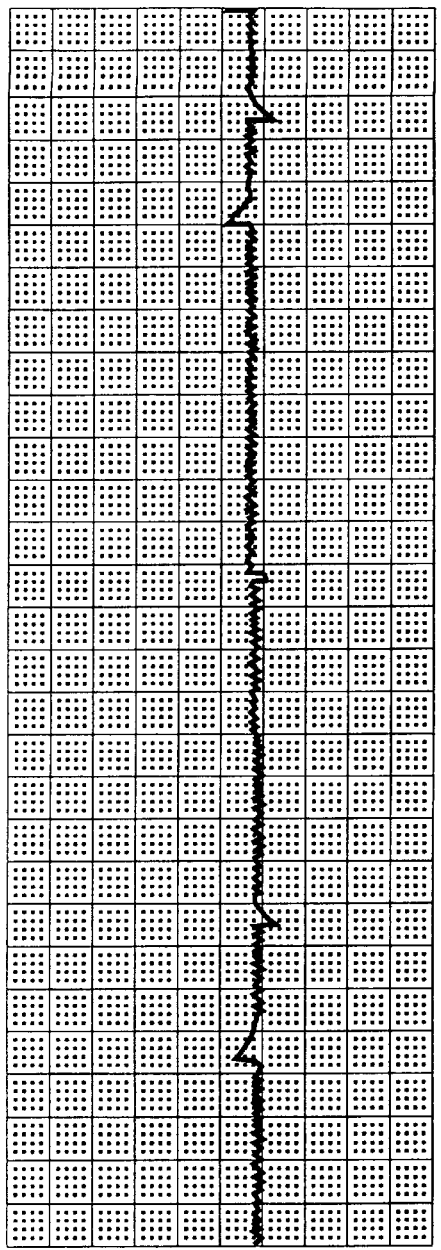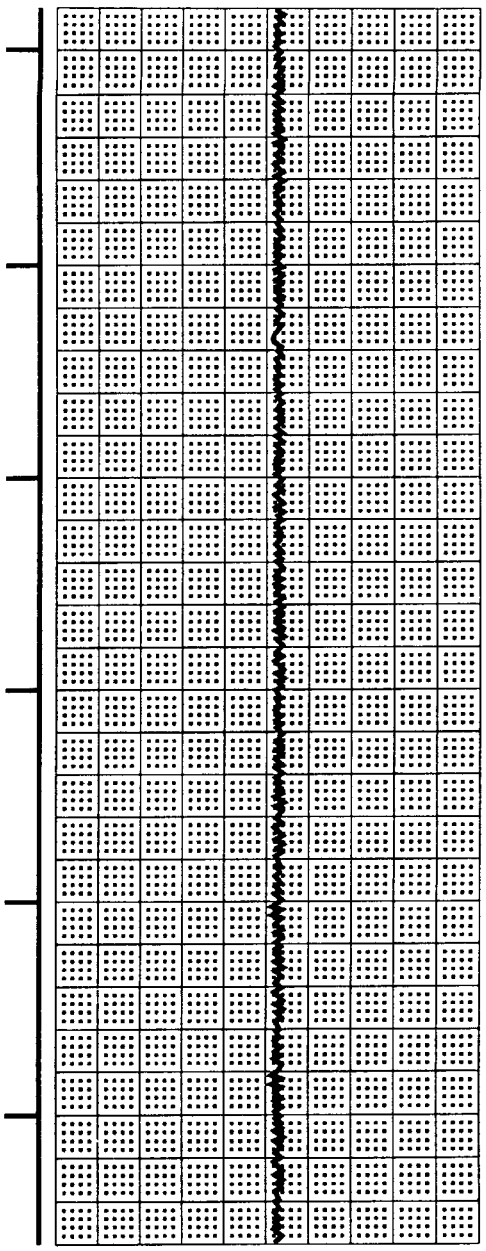
FIG. 25D

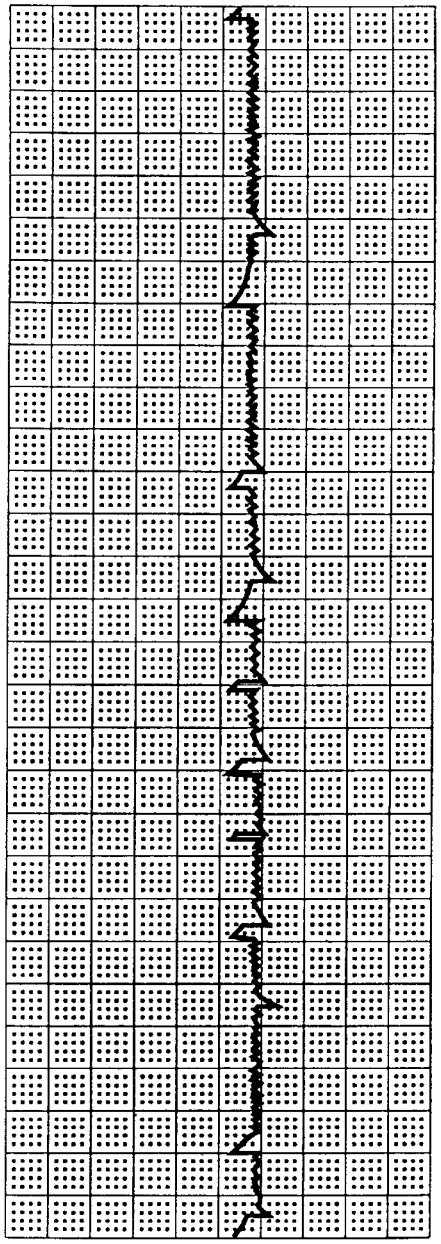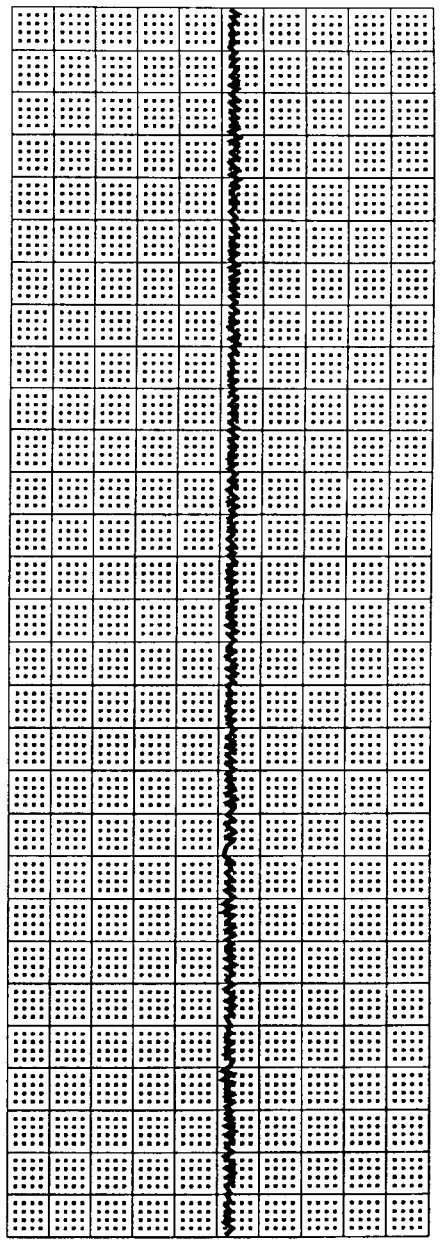
FIG. 25E

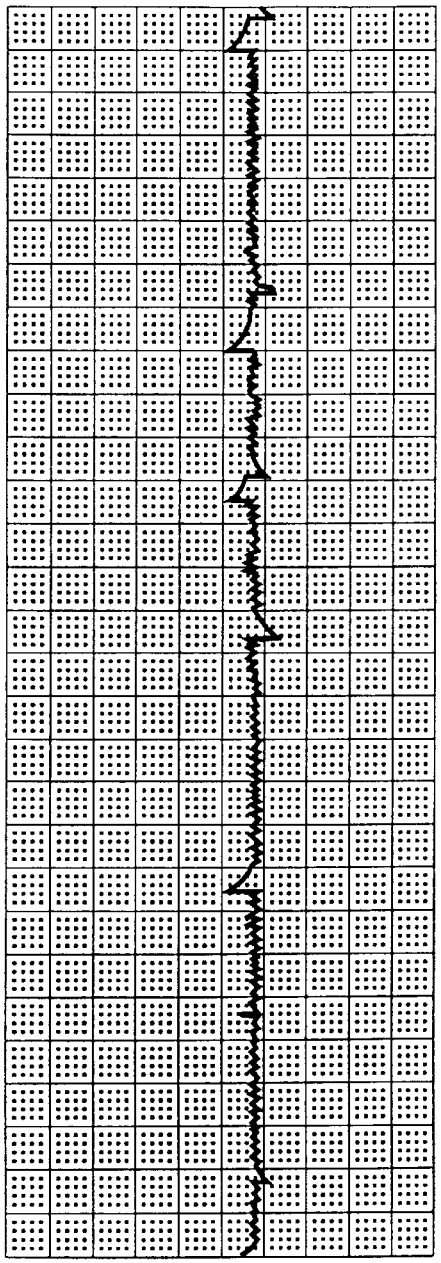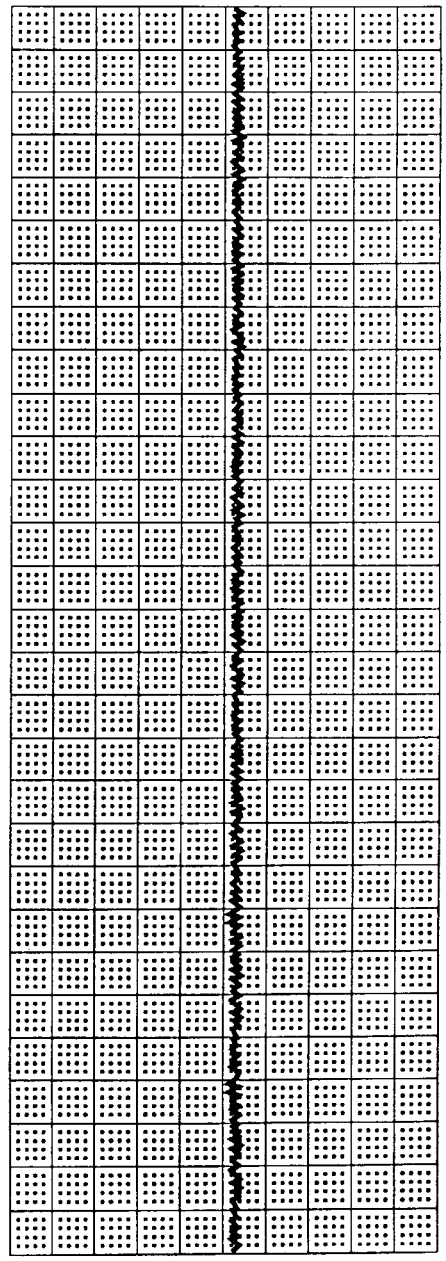
FIG. 25F

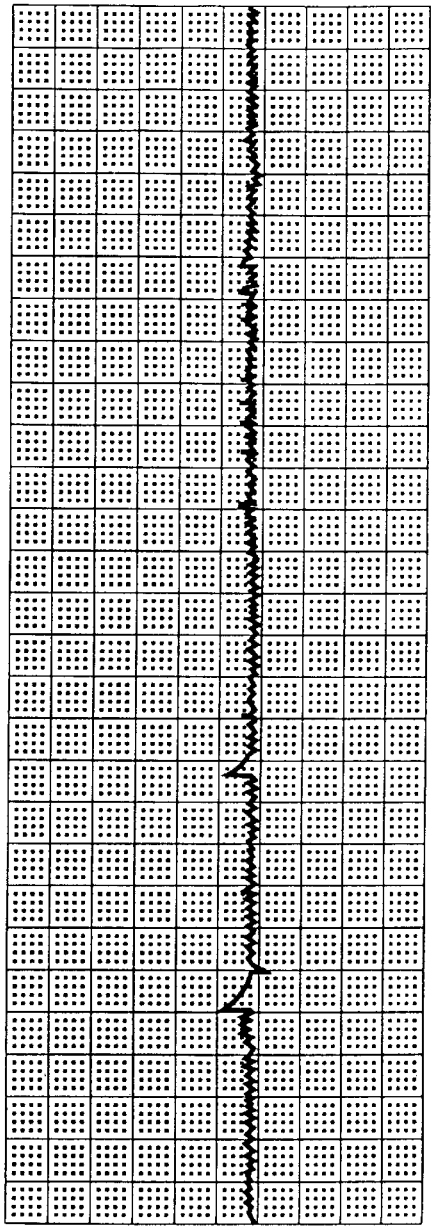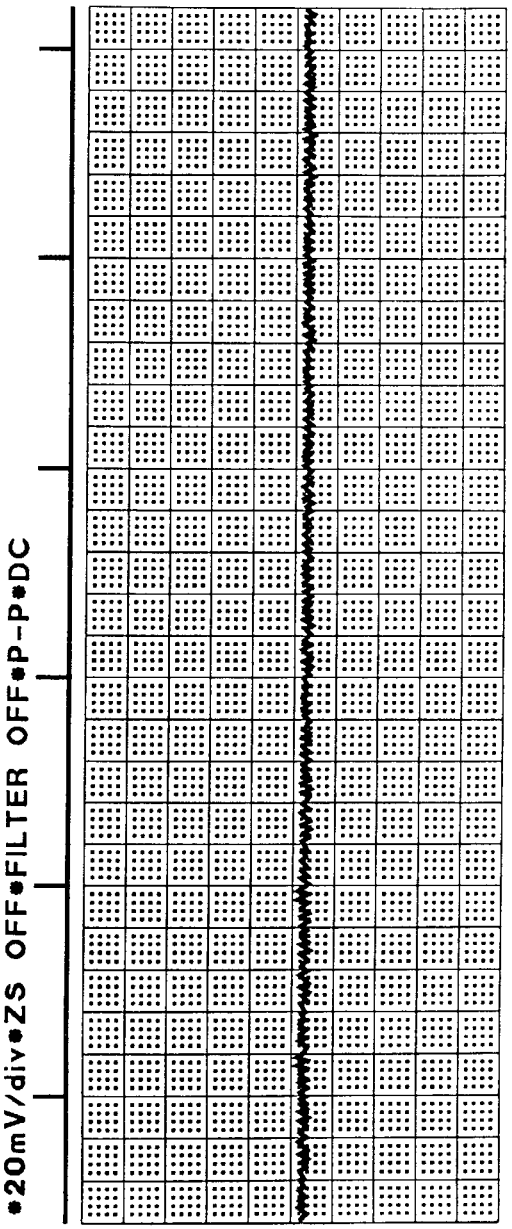
FIG. 25G

SEISMIC ACTIVITY PREDICTOR IN PROXIMITY WITH THE EARTH INCLUDING A DIELECTRIC FOR RECEIVING PRECURSOR SEISMIC ELECTROMAGNETIC WAVEFORMS

The present application is a continuation-in-part of application Ser. No. 08/743,909 filed Nov. 4, 1996, U.S. Pat. No. 5,742,166.

BACKGROUND OF THE INVENTION

The present invention relates to an electromagnetic detector system, and in particular a seismic electromagnetic detector system suitable to detect precursor electromagnetic waveforms of earthquakes.

Often a devastating toll in life and property is taken by earthquakes. It has long been recognized that the toll could be reduced if people within an impending quake's focal area were warned to prepare. Although preparations are unlikely to prevent structural damage to commercial and residential buildings, or to infrastructure such as bridges and roadways, preparation could reduce deaths and serious injuries by people seeking appropriate shelter or retreating from dangerous locations, such as unreinforced brick buildings. Moreover, preparation is likely to reduce the psychological trauma often attributable to an earthquake's sudden onslaught. In addition, preparation will likely reduce personal property causality, such as that related to structural or utility failures, and the fires often associated therewith. Accordingly, it is desirable to forecast the occurrence of earthquakes.

An earthquake's toll results from the seismic waves defining the earthquake. Seismic waves include two types: body waves and surface waves. Body waves comprise primary (or P) waves and secondary (or S) waves that propagate within the earth's body. P waves are longitudinal waves that alternately push (compress) and pull (dilate) the ground in the direction of propagation. S waves are transverse waves that shear the ground in planes perpendicular to the direction of propagation.

Surface waves comprise Love waves and Rayleigh waves that propagate at or near the earth's surface. Love waves shear the ground sideways at right angles to the direction of propagation, much like S waves, but without S waves' vertical shearing. Rayleigh waves displace the earth both vertically and horizontally in a vertical plane that lies in the direction of propagation, whereby a particle of earth will travel an elliptical path as the wave passes, much like a water molecule in rolling ocean waves.

Body waves travel more rapidly than surface waves. Of the surface waves, Love waves generally travel faster than Rayleigh waves and, of the body waves, P waves generally travel faster than S waves. When an earthquake is occurring, the P waves are felt first, like a thud or blow, and thereafter the S waves arrive, as indicated by up-and-down and side-to-side motion. Thereafter, the surface waves strike, causing the ground to shake side-to-side and to roll.

The body and surface waves generally are monitored during an earthquake to gauge the earthquake's intensity. Being contemporaneous with and defining earthquakes, these waves cannot be used for forecasting. Forecasting relies on identification of other physical parameters that, in their occurrence or variance, indicate an impending earthquake. These parameters, when indicating an impending earthquake, are sometimes referred to herein as "precursor seismic activity."

As reported by an article written by Evelyn Roeloffs, a team in 1989 from Stanford University happened to be listening for low-frequency magnetic noise in the Santa Cruz Mountains south of San Francisco with a large coil. On September 12, they noticed an unusual signal with a period between 5 and 20 seconds, which was followed by a background noise increase October 5. On October 17, the background noise rose to a high level, and three hours later the magnitude 7.1 Loma Prieta earthquake hit, rocking the San Francisco Bay area. The earthquake was centered less than five miles from their measurement coil. Since then, one explanation after another for these noise increases have been eliminated, leaving open the possibility that they truly were earthquake precursors. Hoping to repeat the experiment, they have deployed three similar instruments in California, two of them near Parkfield which is a site of intensive earthquake prediction research. Electromagnetic precursors are a controversial subject worldwide. An international group of scientists continues to deliberate whether "seismic electric signals" recorded in Greece are precursors to earthquakes. But there is growing consensus that the Earth's electrical resistance decreased in association with the 1976 Tangshan, China, earthquake. The article goes on to state that as with all potential earthquake prediction techniques, there won't be significant progress until a good-sized earthquake happens in a closely monitored location.

It would appear that the Stanford detector may have detected precursors to the Loma Prieta earthquake so its design has been the basis for further earthquake prediction devices. The Stanford detector is a large coil of wire designed to be resonant in the range of approximately 1–30 hertz. To obtain sensitivity within this range the number of coils and the core for the coils are both selected accordingly. Unfortunately, such a coil is also sensitive to man-made noise, lightning and electromagnetic fields from storms and atmosphere. Accordingly, the Stanford detector needs to be located in remote areas to minimize the detection of extraneous noise. Furthermore, other researchers have had difficulties using the Stanford detector to detect any precursor activity to earthquakes, let alone actually predict earthquakes, so it would appear that the Stanford detector would need to be located near the epicenter of a large earthquake to be effective.

Varotsos et al., U.S. Pat. No. 4,612,506, disclose a method of forecasting earthquakes as a function of transient variations in electric earth current. Varotsos discovered that the electric currents which normally flow in the earth, termed telluric currents, undergo transient changes or variations of a specific nature or character at times before the occurrence of an earthquake. Specifically, Varotsos found that earthquakes are preceded by a first transient variation in telluric earth current measurable as a voltage on the order of hundreds of microvolts per earth-meter having about one minute duration that occurs from six to eight hours before the quake, and a second transient change in earth current measurable as a voltage on the order of tens of millivolts per earth-meter having a duration of a few milliseconds and occurring between thirty seconds and four minutes before the quake. While such a method is useful for prediction of impending earthquakes, the detection of precursor electromagnetic seismic activity only up to eight hours before a quake is an inadequate length of time to warn the public.

Varotsos' detection system involves the simultaneous measurement of pre-earthquake long waves or earth currents at a number of points in the earth by using multiple elongated conductive cylinders. More specifically, the pre-earthquake long waves or earth currents are measured simultaneously at two or more points on the earth surface. Each of the cylinders measures a transitory current that propagates in the crust. The distance that the waves travel in the earth between cylinders results in a small voltage drop of the waves between them. An operational amplifier produces a signal which is the differential potential between the cylinders. The point of origin of the electromagnetic waves or earth currents is computed from the amplitude ratio of the detected signals. As described in Varotsos the cylinders are vertically aligned with axes in orthogonal planes to the direction to the epicenter. Presumably, the theory is that the electromagnetic waves from seismic activity propagate radially outwardly from the epicenter of the pending quake striking the cylinders. With axes in orthogonal planes, the cylinders are oriented to expose the maximum surface area in a direction normal to the epicenter in order to maximize the detected potential difference. Unfortunately, Varotsos' system has noted that periodically earthquakes occur where there were no electromagnetic precursors detected prior to the earthquake.

For the system taught by Varotsos, the changes in earth current preceding an earthquake of a given intensity must be determined empirically for each location because the intensity changes in the earth current are a result of the distance from the earthquake's epicenter, earth conductivity, and the magnitude of the quake itself, all of which vary from location to location. This uncertainty is unacceptable for use in areas that do not experience frequent earthquakes suitable to calibrate the detector. For regions that have infrequent but devastating earthquakes, it would take several disasters to calibrate the detector. In addition, it is difficult to predict earthquakes if the detectors are located on opposing sides of a subterranean feature, such as a fault line.

Tate et al., U.S. Pat. No. 4,628,299 disclose, a seismic warning system using a radio frequency energy monitor. However, such a system is not accurate because changes in the tides and other factors influence the radio frequency field strength which requires statistical calculations for which it attempts to compensate. Accordingly, it is not feasible to discriminate small seismic activity.

Takahashi, U.S. Pat. No. 5,904,943, discloses a system similar to Varotsos et al. that includes a three dimensional distribution of the sources and intensities of the long waves or earth currents, and predicts the focal region, scale and time of occurrence of earthquakes. Takahashi defines the long waves and earth currents as sinusoidal measurements having a frequency not exceeding 300 khz. With the premise that the waves are sinusoidal in nature, Takahashi teaches the use of an antenna for the long waves and measuring the voltage difference between a pair of vertical cylinders for the earth currents. Further, Takahashi teaches that electromagnetic waves over 300 kHz are attenuated at 0.01–1.0 dB/m and therefore seldom observed near the earth surface so no attempt is made to detect waves with higher frequencies. Accordingly, the detectors (cylinders or antennas) are located between 100 km and 500 km from the epicenter depending on the earthquake size to be detected. Takahashi's method includes many of the problems associated with the method taught by Varotsos.

Takahashi proposes that an earthquake is a sudden shifting of the earth's crust along a fault plane that occurs when the stress within the crust comes to exceed the deformation limit. However, as the rock forming the crust of the earth is not homogeneous, small-scale disintegration and dislocation of the rock occurs locally at points within the fault plane destined to become the focal region before the earthquake actually occurs. This gives rise to electromagnetic waves (long waves and earth currents). As a result, Takahashi teaches that it becomes possible to predict the occurrence of an earthquake from the electromagnetic waves from the wave source region. However, this method is further limited to about one week prior to the earthquake.

Helms, U.S. Pat. No. 4,507,611, discloses a method of detecting surface and subsurface anomalies of the earth using vertical current measurements. The vertical current manifests itself as alternating current signals which can be measured and represents surface and subsurface anomalies. Local variation in the detected current signals are measured and correlated with the spatial relation to the points of measurement to determine significant measurements indicative of surface and subterranean anomalies.

Weischedel, U.S. Pat. No. 4,219,804, teaches a circuit suitable for identifying electromagnetic radiation signals caused by nuclear detonations and discriminating against false indications by lightning. The circuit is designed to detect the electromagnetic waveform from the nuclear detonation or lightning strike, as a single negative-going waveform. In order to detect the signal an antenna is used. If a signal is detected that exceeds a threshold magnitude, then three circuits are enabled: a zero crossover discriminator, a rise time discriminator, and a precursor discriminator. The zero threshold detector determines whether the signal crosses the zero axis within a required time period, and if this occurs, it provides an output pulse to an "AND" gate. The rise time discriminator determines whether the signal rises to its peak within a required time period, and if this occurs, it provides an output pulse to the "AND" gate. The precursor discriminator compares the peak amplitude detected with a previous signal detected, if any, occurring within a certain previous time. If the previous signal was detected within the prescribed time period then no signal will be provided to the "AND" gate, indicative that this was lightning. If no previous signal was detected within the prescribed time period then a signal is provided to the "AND" gate, indicative of the possibility of a nuclear detonation. The circuit of Weischedel is designed to detect nuclear detonations by sensing a single waveform and discriminate this against a prior waveform within a prescribed time period in order to discriminate against lightning. While suitable for lightning and nuclear detonations, this circuit is not capable of predicting earthquakes.

There are numerous systems for geophysical exploration of the earth primarily for the detection of mineral and oil deposits. These systems are principally based on the detection and analysis of alternating currents, such as generally sinusoidal currents, from within the earth. Some systems impose a waveform into the earth, while other detect changes in existing earth currents. Such systems include, for example; Nilsson, U.S. Pat. No. 3,701,940; Miller, et al. U.S. Pat. No. 4,041,372; T. R. Madden et al., U.S. Pat. No. 3,525,037; Hearn, U.S. Pat. No. 3,976,937; Barringer, U.S. Pat. No. 3,763,419; L. B. Slichter, U.S. Pat. No. 3,136,943; G. H. McLaughlin et al., U.S. Pat. No. 3,126,510; and Weber, U.S. Pat. No. 4,044,299.

BRIEF SUMMARY OF THE INVENTION

The present invention overcomes the aforementioned drawbacks of the prior art by providing a method of detecting precursor seismic electromagnetic waveforms and predicting future seismic activity in the form of an earthquake based thereon by placing a detector including a dielectric material in contact with the earth. The detector receives at the dielectric material precursor seismic electromagnetic waveforms traveling within the earth emanating from a region of seismic activity. A sensor responsive to the dielectric material senses a series of individual discrete signals imposed by the waveforms at the dielectric material wherein each of the signals has the characteristic of a rise time that is shorter than its fall time. Then predicting an earthquake based on the series of signals.

In a another embodiment of the present invention a discrete signal is sensed that is characterized by a plurality of overlapping waveforms with fast rise times of both a positive and negative polarity. Predicting an earthquake based on the detection of the discrete waveforms.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIGS. 10A–10Z show data from the detector of FIG. 2 showing actual SPI and MPB waveforms.

FIGS. 11A–11F show data from the detector of FIG. 1 showing an actual earthquake which was predicted by the data from FIGS. 10A–10Z.

FIGS. 12A–12J show data from the detector of FIG. 2 showing additional SPI and MPB waveforms.

FIGS. 24A–24K show data from the detector of FIG. 19.

FIGS. 25A–25G show data from the detector of FIG. 22.

DETAILED DESCRIPTION OF THE PREFERRED EMBODIMENT

The present inventor started development of a seismic detector on the premise that precursor electromagnetic waves to seismic activity existed in the form of extremely low frequency alternating electromagnetic waves, as indicated by the Stanford detector. The Stanford detector, as previously described, appeared to detect some sort of alternating current hum from the earth. The earth may be thought of as a conductor which has a skin effect (waves tend to propagate along the outer portion of a conductor) so that a detector placed in connection with the surface of the earth would detect the low frequency waveforms.

Figure 1:
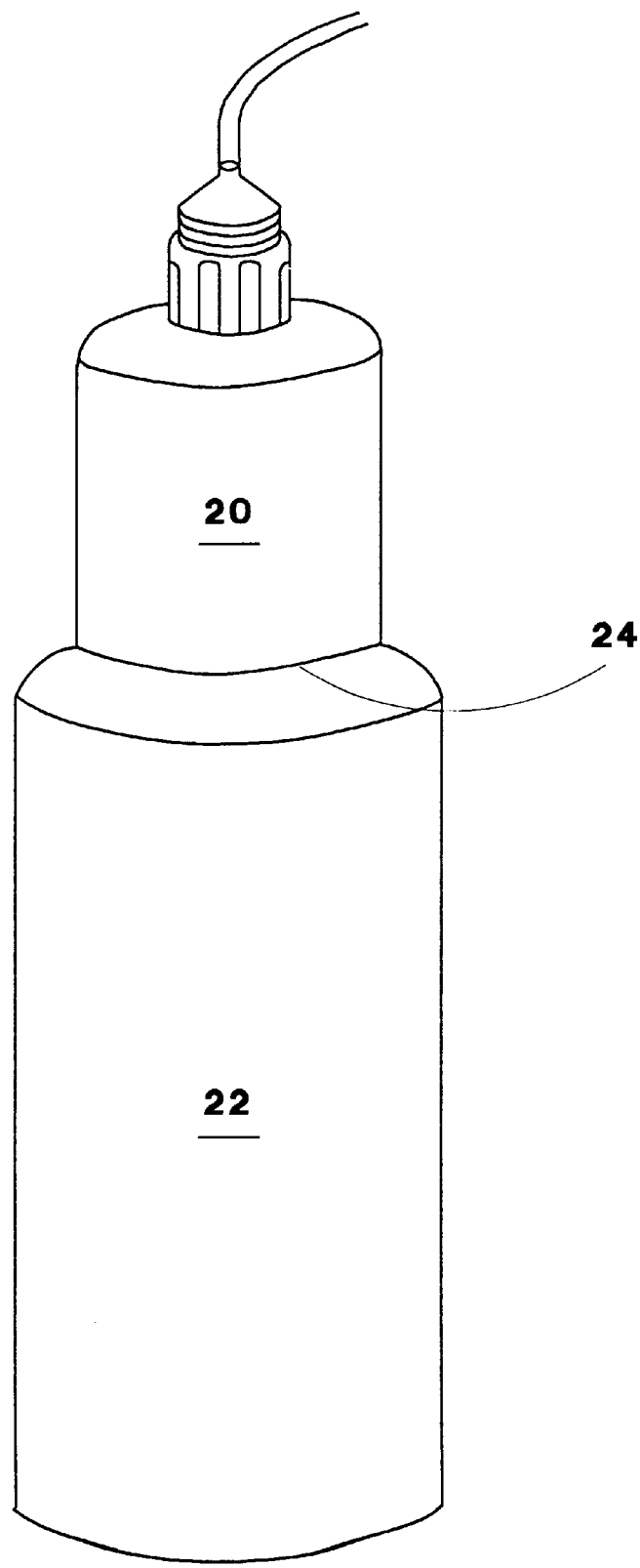
FIG. 1 is a seismic detector including an accelerometer connected to a mass antenna.

Referring to FIG. 1, an accelerometer 20 model 393B31, 10 V/G Ultra-Quiet Seismic, available from PCB Piezotronics, was coupled with a threaded rod by the present inventor to a custom mass resonant antenna 22 (2½ inch diameter stainless steel rod) to form an ultra extremely low frequency (UELF) electromagnetic wave detector. The junction 24 between the accelerometer 20 and the antenna 22 is sealed. UELF signals are detected in the detector from the shift in the quiescent bias point of the accelerometer 20. The present inventor theorized that the energy in the earth would react with the mass antenna 22 to give a resulting detectable charge in the crystal within the accelerometer 20. The result was a detector that produced a signal with a frequency of several seconds to minutes, as theorized. This demonstrated the reaction of the mass antenna 22 to the ultra extremely low frequency waves in the earth crust, otherwise known as the alternating current hum. The resulting data from this experiment was studied to detect and characterize the resulting alternating current waveform. After characterization the present inventor hoped to identify a precursor signature to earthquakes which is hopefully related to the amplitude of the impending quake.

However, periodically waves with large amplitudes would develop within the detector but no subsequent earthquake would occur. This meant that the detection scheme was unreliable for the detection of electromagnetic precursors to earthquakes. To continue development of the aforementioned seismic detector in an area where no present seismographs were located, another detector was needed to sense the actual earth movement (vibrations) resulting from earthquakes in order to validate the results of the electromagnetic precursor detector of FIG. 1 under development.

Figure 2:
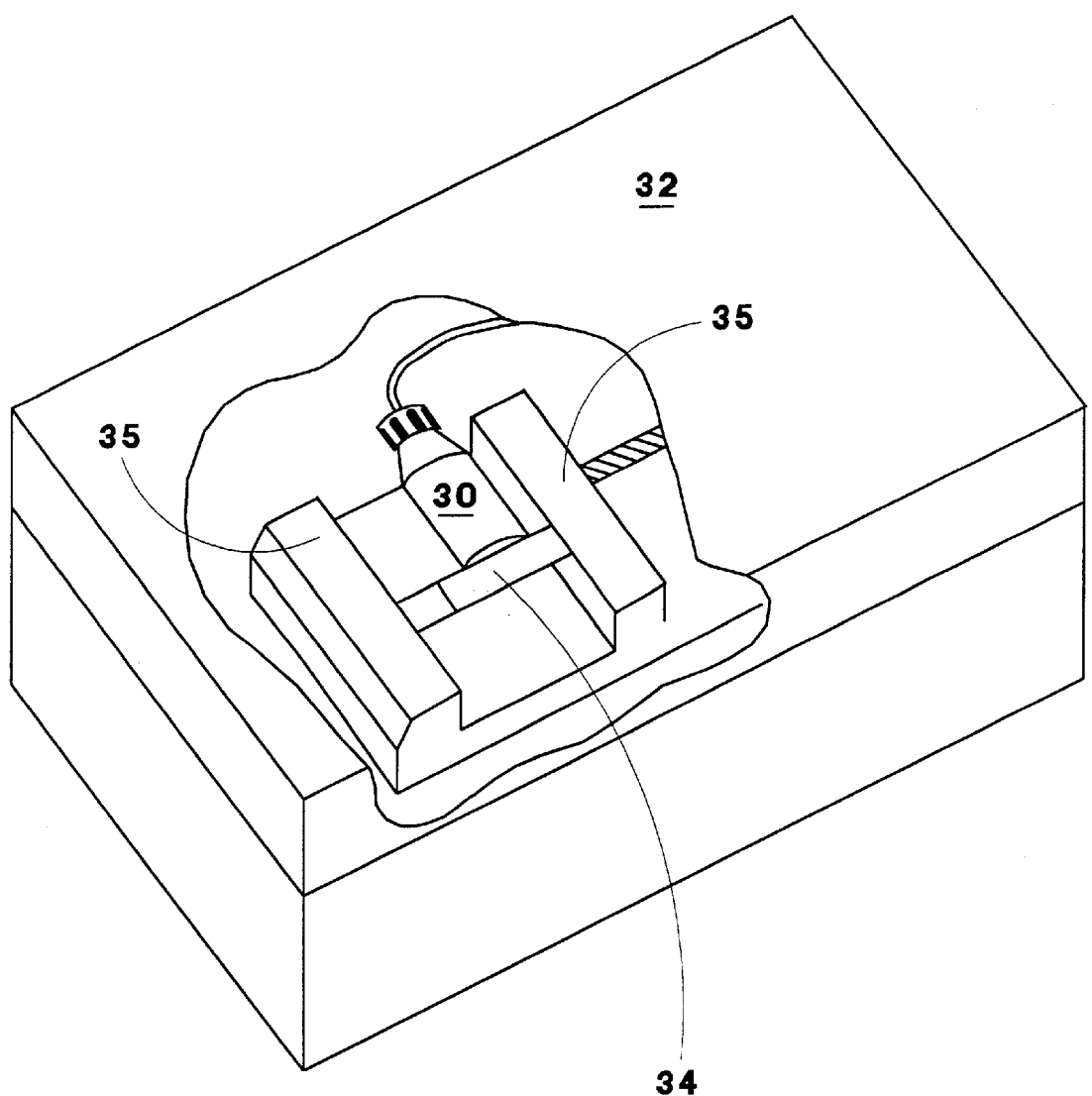
FIG. 2 is another seismic detector including an accelerometer isolated within an enclosure.
Figure 3:
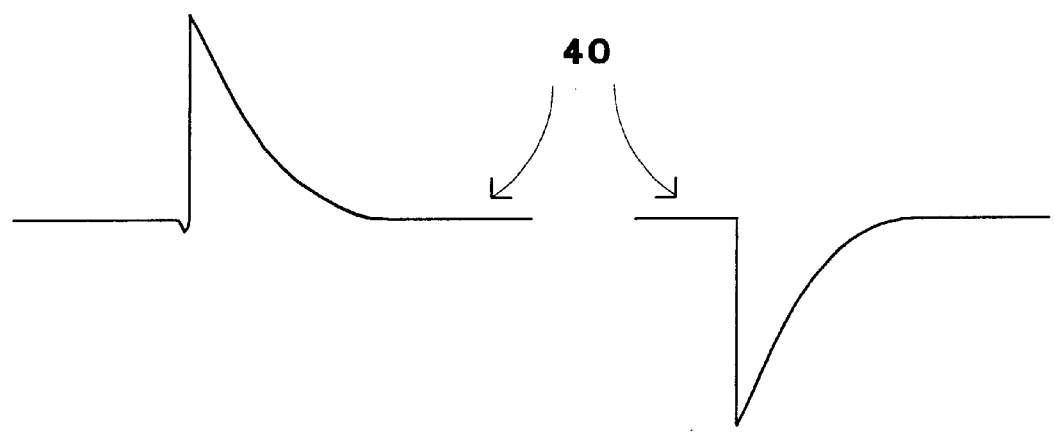
FIG. 3 is a waveform of a pair of single phase impulses detected with the detector of FIG. 2.
Figure 4:
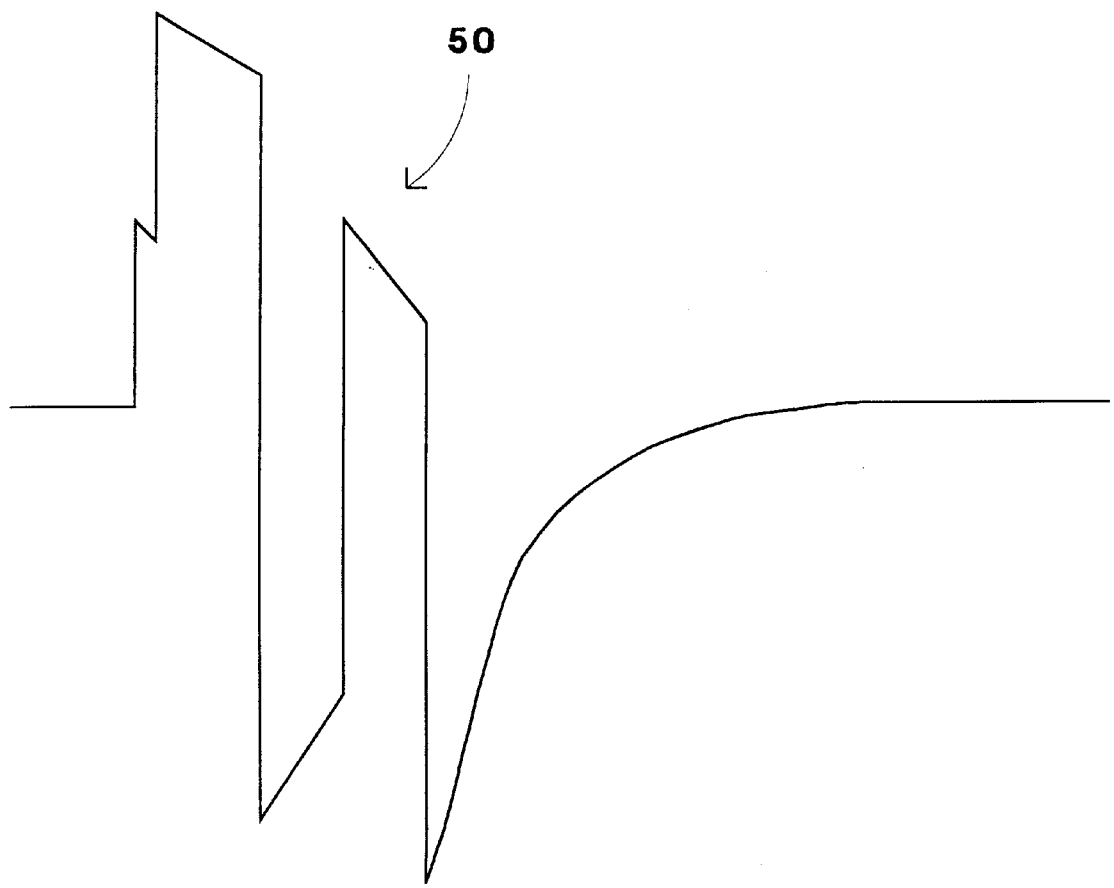
FIG. 4 is a waveform of a multiple phase burst detected with the detector of FIG. 2.

The present inventor selected a 393B12 10 V/G seismic accelerometer, available from PCB Piezotronics, as the earthquake validation detector for vibrations of the earth's surface. Referring to FIG. 2, the accelerometer 30 was placed in a sealed enclosure 32 on a plastic block 34 held by a vise 35 for thermal stability and positioned on the surface of the ground. The structure of the validation detector of FIG. 2 was all mechanical so as to detect earth vibrations from earthquakes. The data from the vibration detector were small variations in the output signal as the present inventor expected, akin to a standard seismograph. However, much to the astonishment of the present inventor, in addition to the mechanical vibrational motion waveforms, there were also waveforms that had the appearance of discrete impulses 40 with a decay time, having either a positive or negative polarity, as shown in FIG. 3. The rise time of the signal, in reference to signals with the general characteristic of FIG. 3, refers to the time required for the signal to change from its baseline to its maximum amplitude either in the positive or the negative polarity of signal. Then a series of positive and negative polarity impulses 50 were detected in rapid succession, as shown in FIG. 4. The present inventor refers to the single isolated impulses 50 as single phase impulses (SPIs) and the multiple impulses that occur in groups as multiple phase bursts (MPBs). After further research the present inventor came to the astonishing realization that these SPI and MPB signals actually correlated with earthquakes occurring in the range of 8 to 80 hours later. Accordingly, these SPI and MPB signals provide an indication of an earthquake much earlier than any system previously developed. However, these impulse signals are unlike anything previously detected from the earth as precursor seismic activity and the theory for their existence is likewise unknown.

In an effort to detect additional precursor impulse waveforms to earthquakes and optimize the configuration of the detector, the present inventor constructed several detectors similar to FIG. 2 and put them side by side, each in their own metal boxes sealed with air inside. Several of the boxes were shaped differently in order to determine if the shape of the box influenced the sensitivity of the detector. However, to the astonishment of the present inventor, it was noticed that some detectors would detect most of the impulse waveforms while adjacent detectors would not detect many of them. After much bewilderment, the present inventor made still a further discovery that the surface area of the enclosure had some relationship to the ability to detect the impulse waveforms. Then the present inventor further discovered that it was not the metal enclosure that was the primary influence on the ability to detect the impulses but in fact detection was related to the volume, the shape of the air contained within the enclosure, and the orientation of the crystal material within the accelerometer 30. After further consideration by the present inventor, he postulated that it was the shape of the air and the orientation of the crystal within the accelerometer that were the primary factor influencing the detection of the impulse waveforms.

The present inventor, after further consideration of the air as a primary factor influencing the ability to detect the impulses, came to the realization that the air contained in the container with the detector primarily determines the decay rate of the impulse signal and its amplitude. A small volume with a large surface area has a large amplitude with a fast decay rate, e.g. a tubular enclosure. A large volume with a small surface area, such as a box, has a smaller amplitude with a slower decay rate in comparison. However, it was also noticed that the box enclosure detected these mysterious SPI and MPB waveforms more often than the tubular enclosure.

Because some detector configurations failed to detect some of the waveforms, the present inventor then came to still a further realization that the waveforms being detected are in fact polarized. Therefore, it is not enough to simply place a detector in the ground, as taught by Varotsos, but the orientation of the detector is critical. If the waveforms are polarized such that the polarization matches the angle of the present inventor's tubular detector, then the tubular detector will detect the waveforms with a large amplitude. However, if the tubular detector is out of alignment with the polarization of the waveforms, then the waveforms will appear small or not be detectable. In contrast, a box is generally square so its orientation does not greatly change the ability to detect the impulse waveforms. While the development of the earthquake sensor and prediction methodology to this stage was an improvement over the prior art, the detector is still expensive and requires multiple high quality accelerometers, at substantial expense.

In studying lesser cost accelerometer-based sensors, the present inventor happen to have a 321A03 general purpose accelerometer, available from PCB Piezotronics. This accelerometer is a less expensive, low cost device, that was used as part of the development. Presumably, such a device is less sensitive to the impulse waveforms than the more expensive devices for the detection of seismic activity. However, to the astonishment of the present inventor the inexpensive accelerometer 321A03 was in fact more sensitive to some types of the mysterious SPI and MPB waveforms than a more expensive yet same-volts-per-G accelerometer 353B01. The present inventor thereafter examined the construction of the different accelerometer devices attempting to determine what was the source of such a counterintuitive result. The present inventor realized that the 321A03 accelerometer included internal epoxy material, which is a dielectric material, in its construction in order to save expense. The more expensive 353B01 detectors are hermetically sealed within a stainless steel case and contain no epoxy. It turns out that the 393B12 seismic accelerometer has a detection crystal that is electrically isolated from its case. The present inventor then formed the connection that the dielectric epoxy acts in a manner similar to air in the enclosure which seemed to permit the impulses to be detectable.

After determining that epoxy was one of many differences in the construction of the two aforementioned accelerometers, the present inventor encapsulated a 393B12, which is a good seismic accelerometer, in epoxy. The accelerometer was used as a detector, akin to FIG. 2. The result was a dramatic increase in the sensitivity of the device.

Figure 5:
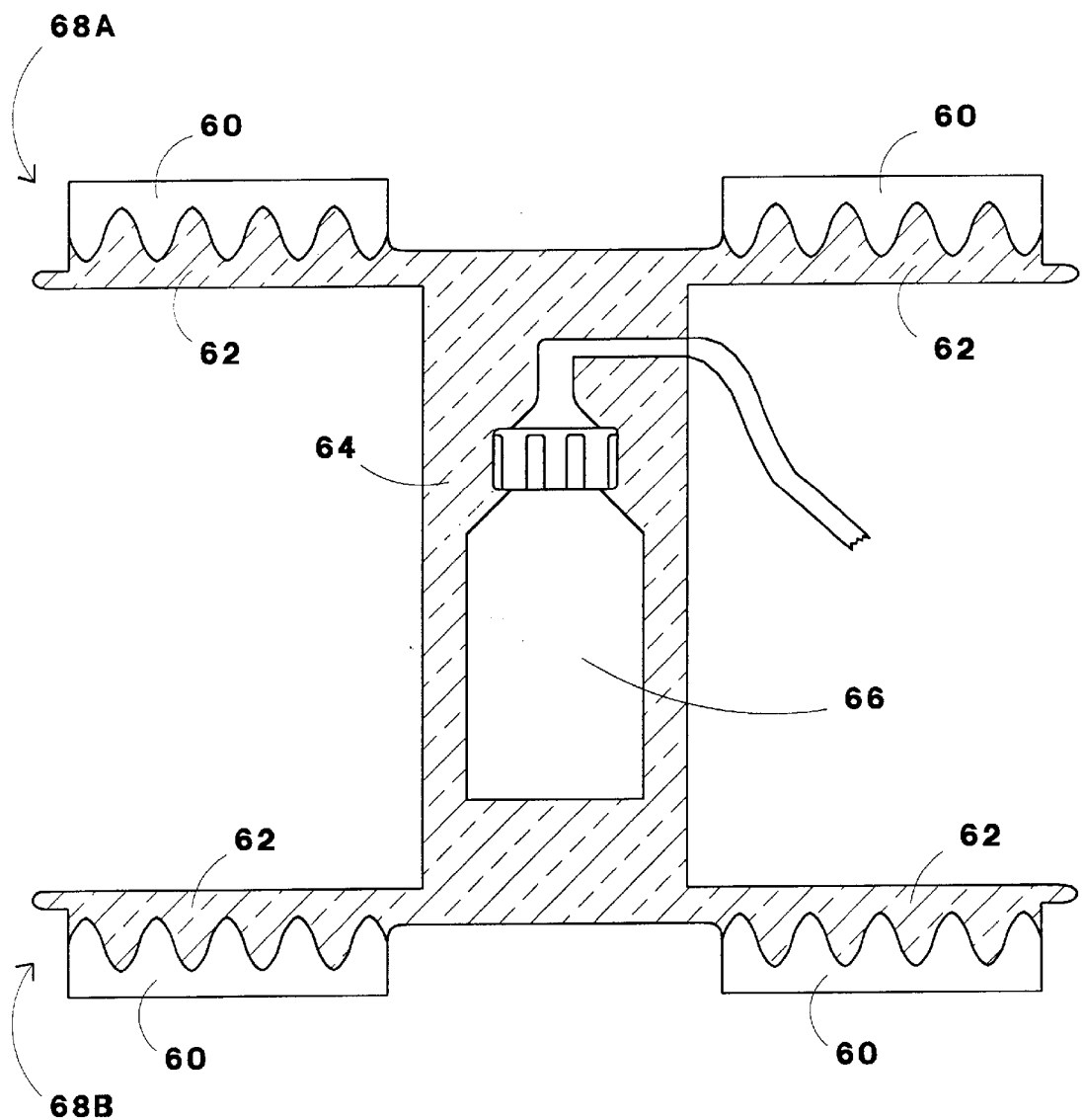
FIG. 5 is another embodiment of a seismic detector including metal plates partially encapsulated in epoxy together with an accelerometer encapsulated in epoxy located therebetween.

With the connection to a dielectric material established as a primary influence on the capability to detect the impulses a further modified detector was developed. Referring to FIG. 5, aluminum heat sinks 60 were partially encapsulated in epoxy 62 (dielectric material). The 393B12 accelerometer 66 is encapsulated in epoxy 64 and arranged as a column between two planar sets 68a and 68b of heat sinks 60 and epoxy 62. The present inventor is attempting to maximize the aluminum surface area in order to couple the charge injection into the dielectric material 62 and 64, in a manner akin to the skin surface area of the metal enclosures previously used by the present inventor. The present inventor postulized that the dielectric material, which has a much higher dielectric constant than air, would result in greater electrostatic field therein and maintain a polarization of charge imposed therein a longer duration. The present inventor theorized that within the accelerometer that the dielectric material develops a sudden electrostatic potential, as if the dielectric is becoming suddenly changed electrostatically (from SPI/MPB's) and that the stainless steel body of the accelerometer attenuates this field from optimal sensing in the crystal within the accelerometer. The present inventor then postulated that a large surface area crystal or equivalent reactive material could improve the reception of weaker SPI/MPB signals were it mounted directly to the dielectric material.

Figure 6:
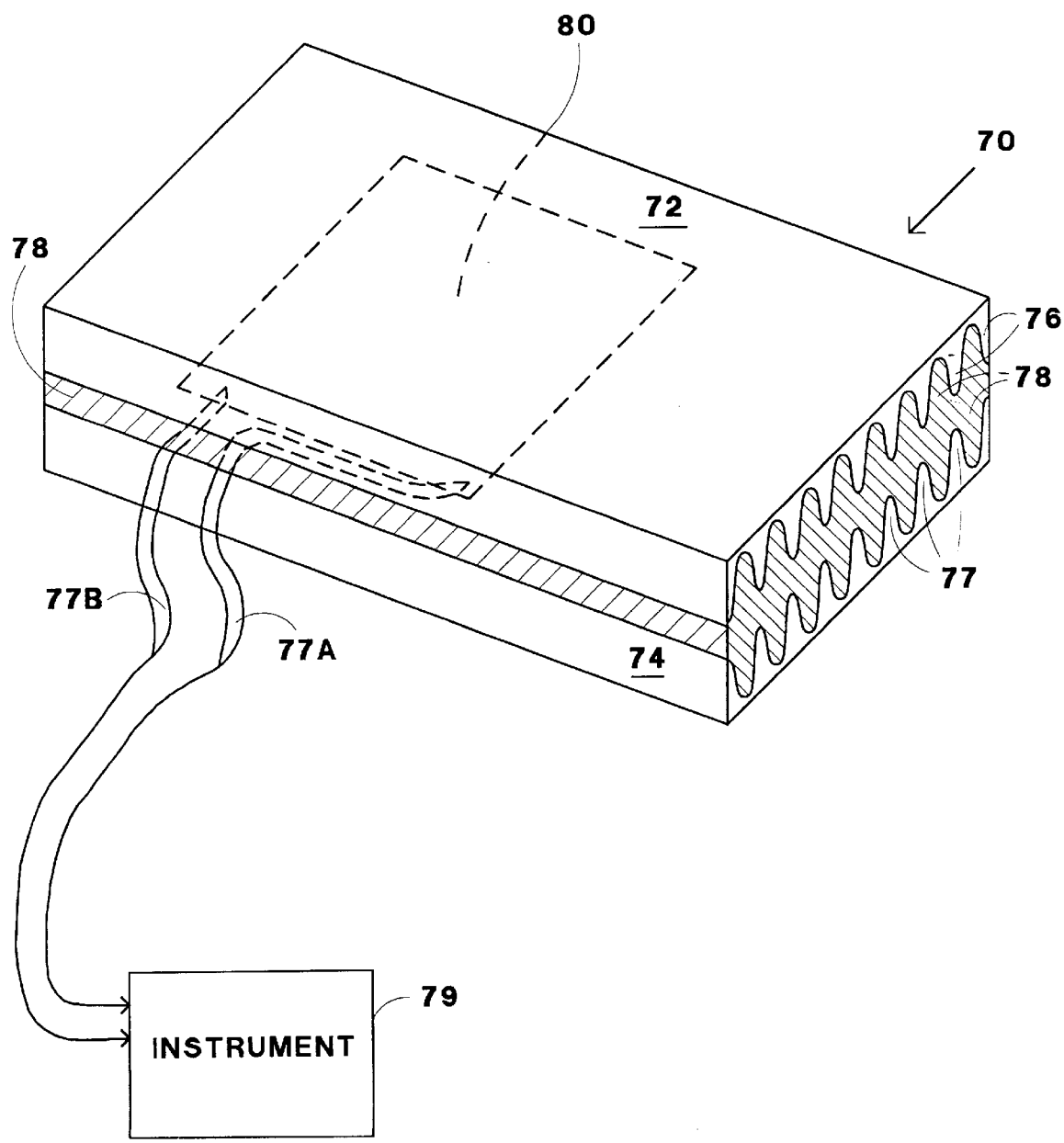
FIG. 6 is still another embodiment of a seismic detector including metal plates partially encapsulated in epoxy with a solar cell detector therebetween.

Referring to FIG. 6, an improved detector 70 is illustrated for the detection of electromagnetic pulses traveling through the earth as precursor's to seismic activity. The detector 70 is located in contact with the ground, preferably imbedded within the ground so it can sense the spectrally rich precursor seismic activity waveforms. The detector 70 includes aluminum exterior plates 72 and 74 with internal fins 76 and 77, respectively, imbedded in epoxy 78.

The detector is designed to be highly sensitive to the impulse waveforms. The mass of the earth resonates the precursor impulse energy at resonant frequencies which are matched by the dielectric material. In essence, there is a transfer of the precursor electromagnetic impulse waveforms from the earth to the aluminum 72 and 74 and further injected into the epoxy 78. The electric field generated within the dielectric material presents itself to a photovoltaic (solar) cell 80 contained within the epoxy 78. The cell 80 detects the ejection of electrical charge and produces a corresponding proportional voltage. The preferred cell material is a solar cell from Iowa Thin Film Technologies, 2501 North Loop Drive, Ames, Iowa 50010. The solar cell has a PIN lateral construction. The P referring to P type semiconductor, the I referring to an intrinsic layer such as a high quality insulator, and the N refers to N type semiconductor. The intrinsic material helps to prevent degradation of the PN junction over time. The PIN material is adhered to a base of polyamide plastic insulating material with a lower stainless steel layer. The PN junction is externally reversed biased to provide a stable and balanced leakage current condition through the PN junction. Small changes in the voltage imposed on the P type material changes the leakage current and thus the electromagnetic waves are detectable. In addition, the higher internal resistance of the insulating material provides a better dynamic signal range. A pair of electrical connectors 77a and 77b interconnect the cell 80 to an instrument 79 suitable to record and analyze the data.

The present inventor found that a very large increase in sensitivity to SPI and MPB impulses resulted. However, the design of FIG. 6 lacks the detection of some polarized SPIs/MPBs because there is only one solar cell in one orientation.

The result is an inexpensive detector that is immune to mechanical vibrations from surrounding activity, such as road traffic, walking, trucks, etc., to which the sensitive accelerometers reacted to. In addition, is has been determined that the detector is also immune to normal electromagnetic currents within the earth, such as 60 hertz currents, which permits the detector to be located in electrically noisy areas, such as cities.

Unfortunately, there exists no satisfactory theory in the literature for why such spontaneous SPI and MPB electromagnetic impulse signals should emanate during the time preceding an earthquake. A coil-based detector would seem to indicate that the waveforms should be low frequency and of an alternating current nature, as other scientists have thought when attempting to design a detector, although with limited success. Without a theory for the basis of SPI and MPB bursts, scientists have no motivation to search for or examine any impulse type electromagnetic signals as a means of predicting the occurrence of earthquakes, presuming that the scientist believes they exist at all.

The present inventor is unsure of the origin of the electromagnetic bursts but proposes the following basic theory for their origin. The tremendous pressure and other phenomena associated with earthquake conditions causes an implosion of matter, some of which is converted to energy. The energy source may come from what is referred to as the zero-point energy of matter. Zero-point energy refers to a special class of ether theories which describe space as a sea of fluctuating energy. Quantum physics predicts that vacuum fluctuations exist and gives them the name of zero-point energy. The words "zero-point" refer to the fact that these fluctuations persist even at zero degrees Kelvin. By merging theories of the zero-point energy with the theories of system self-organization, it becomes theoretically possible to cohere the zero-point energy as a source. The theory of self-organization identifies the conditions for self-induced coherence. The system must be nonlinear, far from equilibrium, and have an energy flux through it. The dynamics of the zero-point energy and its interaction with matter are nonlinear. The zero-point energy can be driven from its equilibrium with abrupt motions of matter (e.g., electric discharges), and it may be a manifestation of an electrical flux that flows orthogonally through our three dimensional space from a hyperspace. The dynamics of the zero-point energy can fulfill the conditions for self-organization. A description of zero-point energy is provided in *Tapping The Zero-Point Energy* by Moray B. King, and is incorporated herein by reference.

The zero-point energy likely manifests itself as a low frequency electromagnetic wave with high frequency signals superimposed thereon and traveling through matter itself. Earth forces, such as tectonic plate movement, create intense pressure points within the crust, and more often near faults in the crust. At a critical point of the right conditions (pressure, heat, mass) a "mass" implosion occurs. Because of the tremendous pressures, heat, etc. developed during electromagnetic burst activity, the electromagnetic waves produced are saturated over the frequency spectrum. Another way to consider the waves are as being spectrally rich, e.g. having an extensive number of individual frequency components, not merely a range of low frequency signals as the standard detector attempts to detect. The waveforms produced may even be so spectrally rich as to have nearly all (or all) of the frequencies in the entire spectrum within a given range, such as 0 hertz to several gigahertz.

The duration of these precursor electromagnetic waves or impulses are not of a long duration as the Stanford device would suggest. Instead it turns out that the electromagnetic waves are in the form of single phase impulse (SPI) and multiphase bursts (MPB) that are very transitional in nature. The present inventor has determined that the generally observed duration of these bursts varies depending on the detector but the rise time is normally less than 40 milliseconds. Accordingly, the detector has to be designed to detect and record activity that has an extremely short time duration, as opposed to a waveform that has a long duration. Prior electro-magnetic detectors that attempt to detect long duration waveforms over many slow alternating cycles detect little, if anything, of earthquake precursor activity because they were not designed to detect the impulse signal for which previous designers did not know existed.

It is also the present inventor's theory that the alternating current precursors are the result of the impulses over time that the present inventor discovered and correlated with precursor seismic activity. The impulses induce slow pressure variations in the crust of the earth that manifest themselves as AC electromagnetic waves.

With spectrally rich electromagnetic waveforms the objective is to produce as many ions as possible, which result in extensive momentary electron charge movement, in the dielectric material of the detector. The photo-electric effect and "band-theory" teaches that selected wavelengths of signals are needed to excite electrons from low valence levels to higher valence levels, and to remove the electron from the atom. This energization of electrons results in ions and the movement of electrons within the dielectric that are detectable as impulses. With a spectrally rich electromagnetic waveform emanating from a future location of seismic activity, the required frequencies are readily matched for most any dielectric material.

A conceptually analogous phenomena occurs in the incandescence of a solid. When atoms are close-packed, as in a solid, electrons of the outer orbits make transitions not only within the energy levels of their "parent atoms," but also between the levels of neighboring atoms. These energy-level transitions are no longer well known, but are affected by interactions between neighboring atoms, resulting in an infinite variety of energy-level differences—hence the infinite number of radiation frequency. The same impulses in the earth from seismic activity can be thought of in the same conceptual way, except that instead of light, there is a large variety of electromagnetic energy levels that are transmitted through the mass of the earth.

The present inventor desired to characterize the difference in the ability to detect the SPI/MPB impulse waveforms with respect to first, a detector with dielectric material and metal plates (FIG. 6), and second, a dielectric material without the metal plates. The present inventor constructed a square block of epoxy without metal plates and encapsulated a solar cell therein. The present inventor was startled to realize that dielectric material alone strongly responded to the SPI/MPB impulses. The preferred epoxy material for all the sensors (dielectric material) is 3M DP270 Potting Compound which is a good insulator with a high dielectric constant. It turns out that the dielectric material itself has a strong reaction to the impulses, so the charge injunction from the metal plates turns out not to be a primary factor in the detection of SPI and MPB waveforms.

Figure 7:
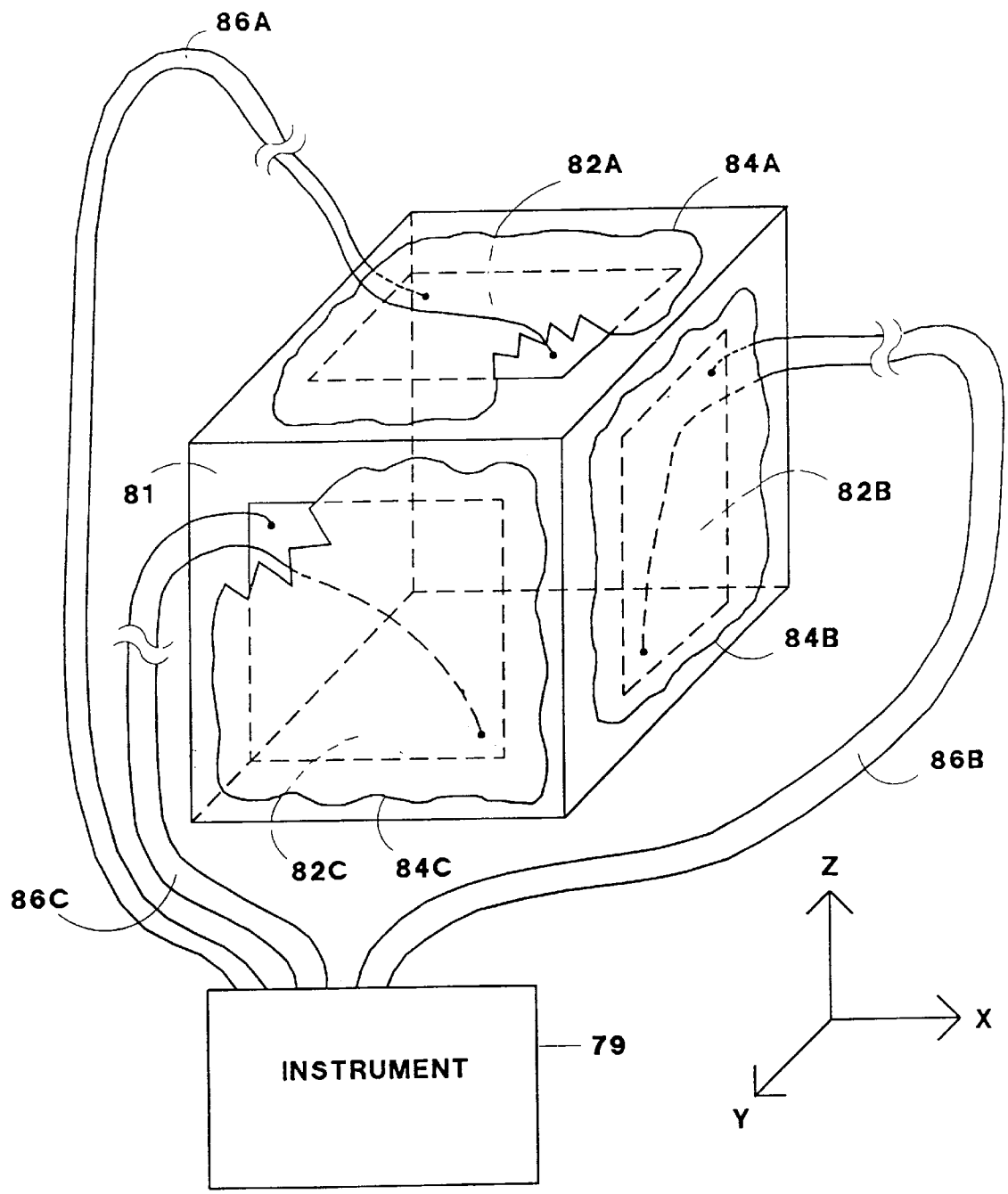
FIG. 7 is an exemplary embodiment of the preferred embodiment of the seismic detector with a block of dielectric material with three solar cells on three adjoining faces of the block, each of which is partially encapsulated in epoxy.

Referring to FIG. 7, based on the aforementioned experiment the preferred precursor seismic detector includes a block of dielectric material 81. The preferred dielectric material 81 is an acrylic plastic, which has a high dielectric constant, consistent crystalline structure, and uniform charge development as a result of the impulses. A set of solar cells 82a, 82b, and 82c, such as the solar cell previously described from Iowa Thin Films, are located on three adjacent sides to the same corner of the dielectric material 81. The cells 82a, 82b, and 82c are secured with a thin layer 84a, 84b, and 84c, of 3M DP270 Potting Compound, respectively. The top cell 82a reacts most strongly to impulses with polarization in the 'z' direction. The right side cell 82b reacts most strongly to impulses with polarization in the 'x' direction. The left side cell 82c reacts most strongly to impulses with polarization in the 'y' direction. By measuring the resulting signals on each set of lines 86a, 86b, and 86c from each of the solar cells 82a, 82b, and 82c, respectively, the absolute magnitude of the impulse can be determined without reference to its polarization. The combination of the signals on each line 86a–86c also provides an indication of the location of source of the potential earthquake.

Figure 8:
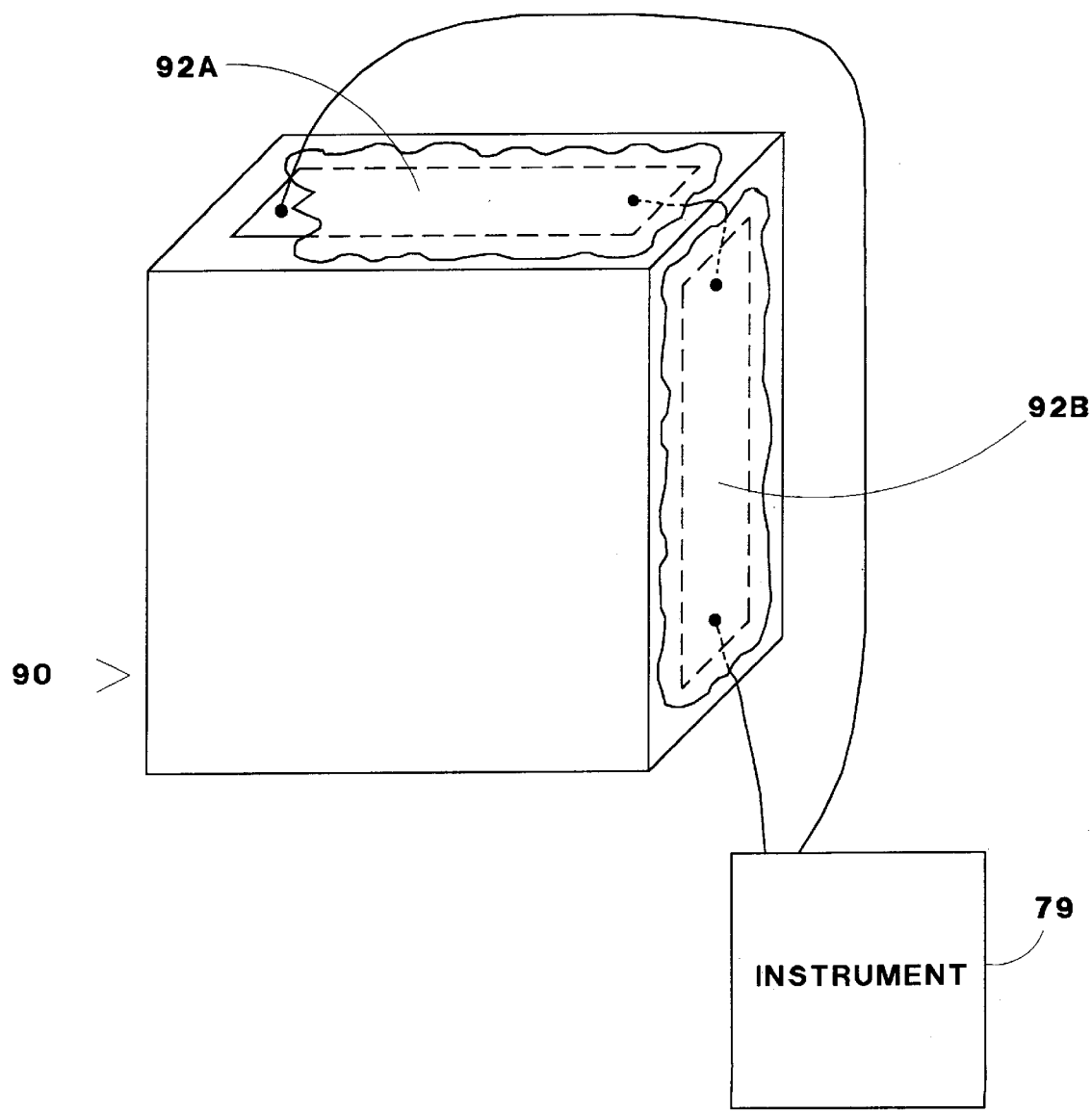
FIG. 8 is a thin seismic detector including a block of dielectric material with two solar cells on two adjoining faces of the block daisy chained together, each of which is partially encapsulated in epoxy.

Referring to FIG. 8, a further alternative embodiment of the detector of FIG. 7 involves using several thin slice detectors 90, each with a solar cell 92a and 92b on a pair of adjoining edges that are daisy chained together. A group of detectors 90 are arranged in a hemispherical arrangement with a signal line from each to a central instrument (computer) 79. The polarization of an electromagnetic waveform is perpendicular to its direction of travel. Accordingly, by selecting the sensor with the greatest magnitude output signal, the source of the precursor seismic activity is known as the perpendicular direction to the plane of the particular detector 90.

Figure 9:
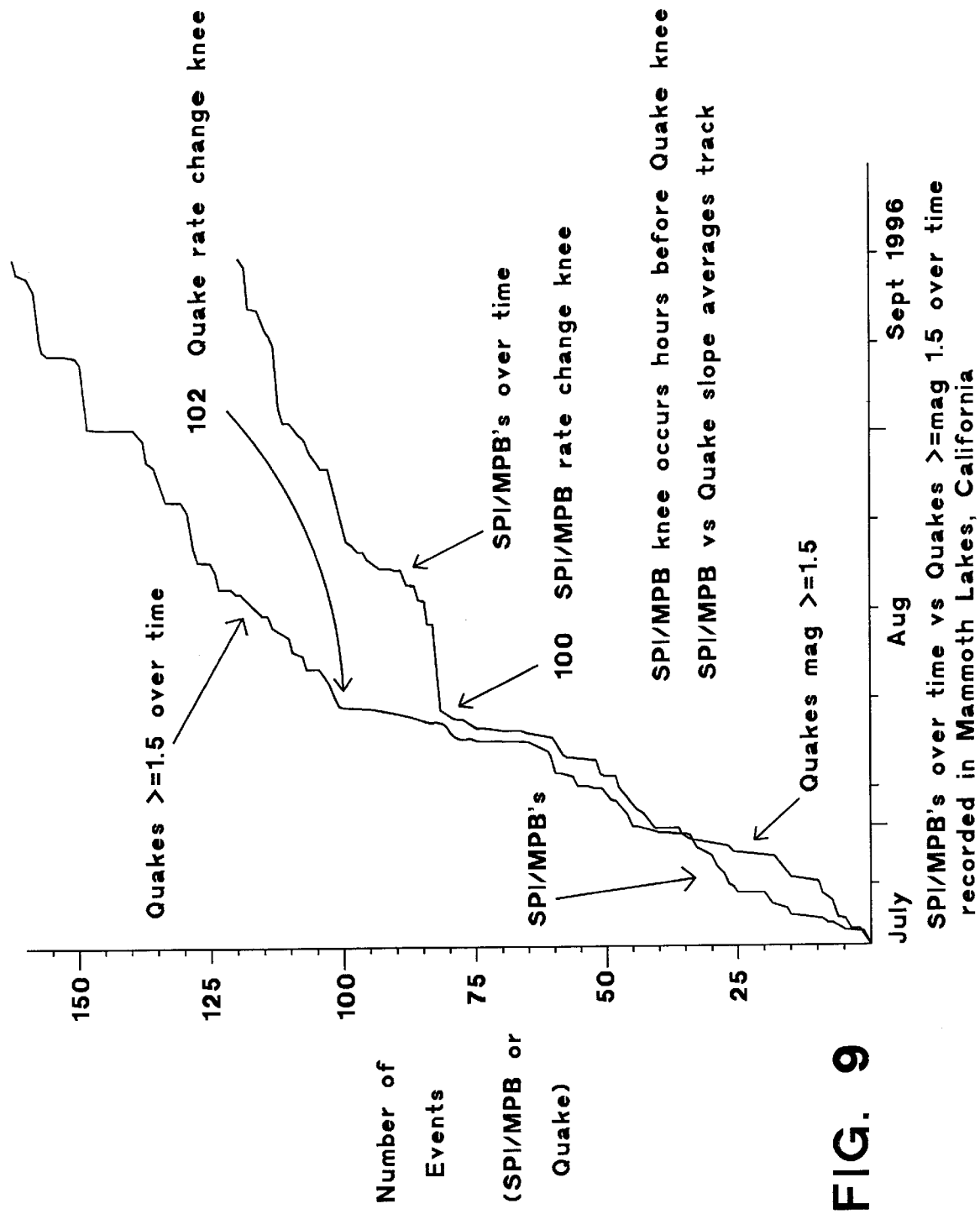
FIG. 9 is a graph of the occurrence of SPI/MPBs and actual earthquakes detected over time in the Mammoth Lakes, Calif. area illustrating that the SPI/MPBs are precursors to seismic activity.

Referring to FIG. 9, the present inventor compared the number of events detected for both actual earthquakes from a seismograph and SPIs/MPBs from a detector, as shown in FIG. 6, recorded in the Mammoth Lakes, Calif. area over time. The earthquake data was obtained from United States government seismographs. More specifically, the U.S. Council of the National Seismic System [CNSS]. The slope of the number of events for the SPIs/MPBs and earthquakes versus time correlate closely. A knee 100 occurred in the frequency of occurrence of precursor SPIs/MPBs in early August 1996. A knee 102 occurred in the frequency of the occurrence of actual earthquake activity 1.8 hours after the knee 100 from the precursor detector. Accordingly, the knees 100 and 102 (FIG. 9) provide empirical data to support the fact that the SPI/MPB waveforms are actually precursors to future seismic activity.

Figure 10A:
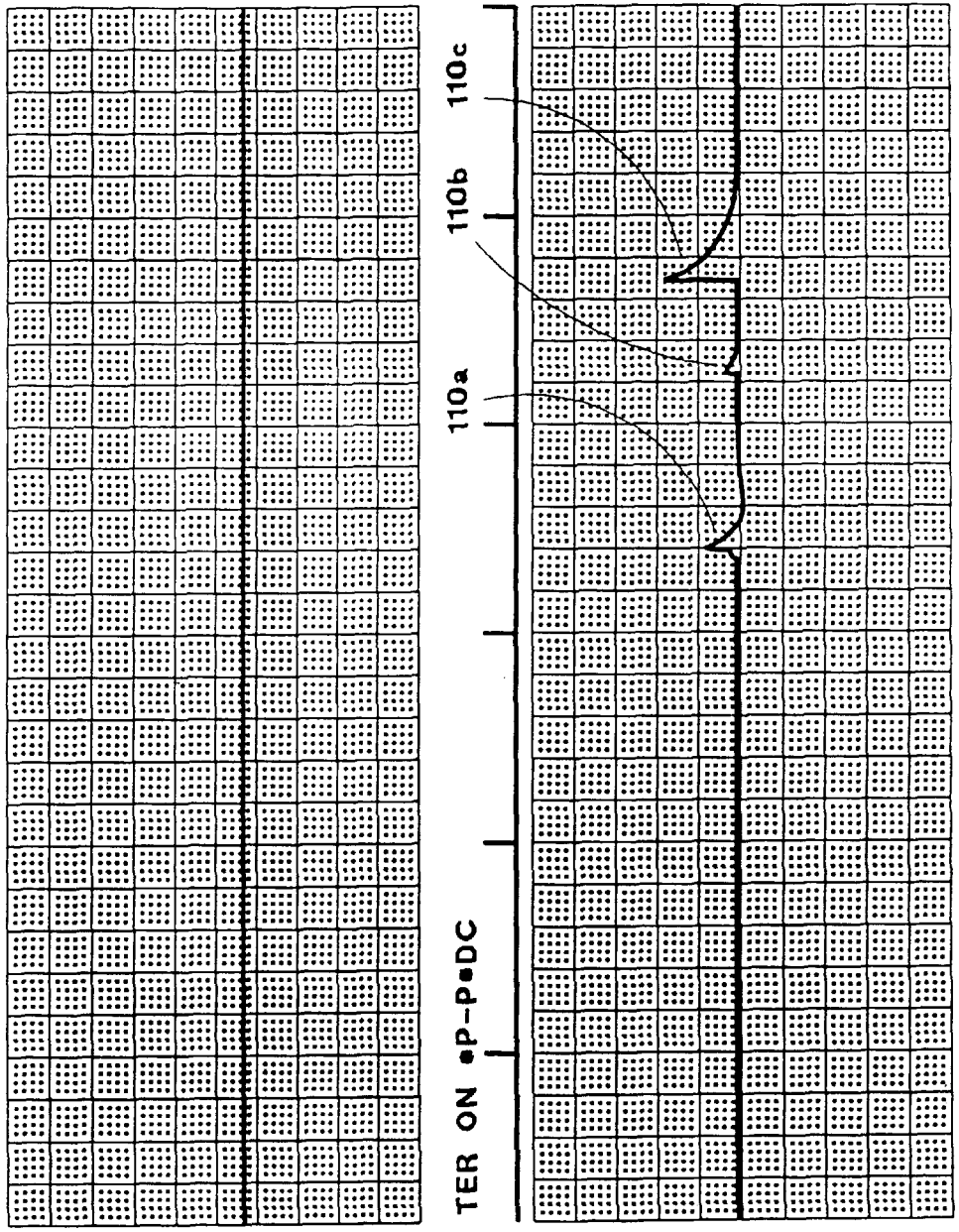

Referring to FIGS. 10A–10Z graphical measurement data from a precursor seismic detector, as shown in FIG. 2, was obtained over several days from the Mammoth Lakes area. The upper portion of the data has a vertical scale of 0.1 volts per dot and a horizontal scale of 2.4 seconds per dot. The lower portion of the data has a vertical scale of 2 millivolts per dot and a horizontal scale of 2.4 seconds per dot. The upper and lower portions of the graph are the same signal with different vertical scaling factors. A series of SPI impulses 110a–110h were detected predicting the occurrence of future seismic activity. The rise time of the SPI impulses 110a–110h are very short, indicating an extremely fast rise, such as less than 20 to 40 milliseconds. The decay time of the SPI impulses 110a–110h is significantly longer than the rise time, with a generally exponential decay which the present inventor believes is primarily dependent on the properties of the dielectric material and the nature of the frequency spectrum of the particular impulse. Shortly after the series of SPIs 110a–110h, a MPB burst 112 occurred followed by SPI impulses 114a and 114b. The occurrence of several significant SPIs and/or a MPB(s) predict the occurrence of future seismic activity.

Figure 11A:
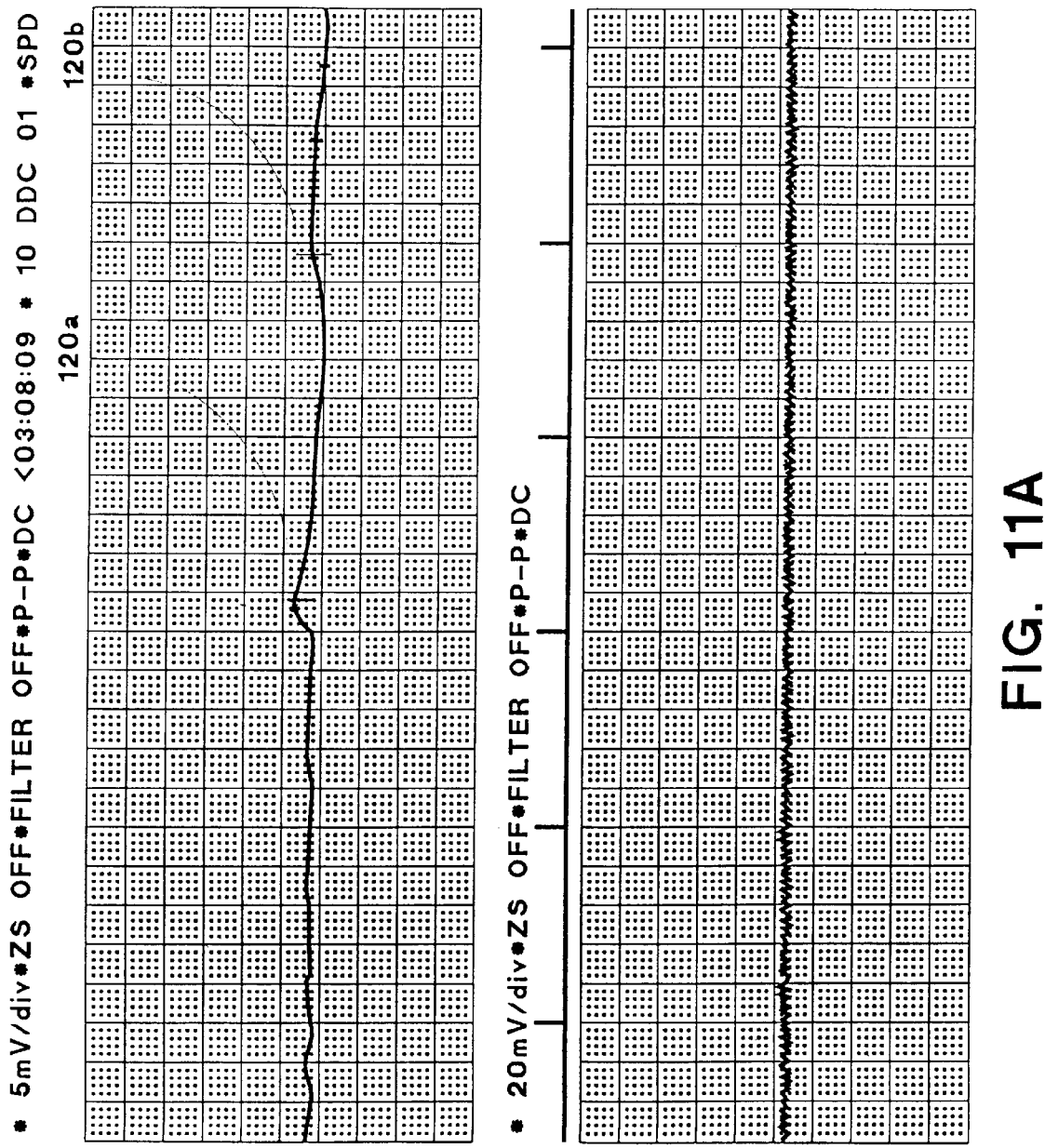
Figure 11C:
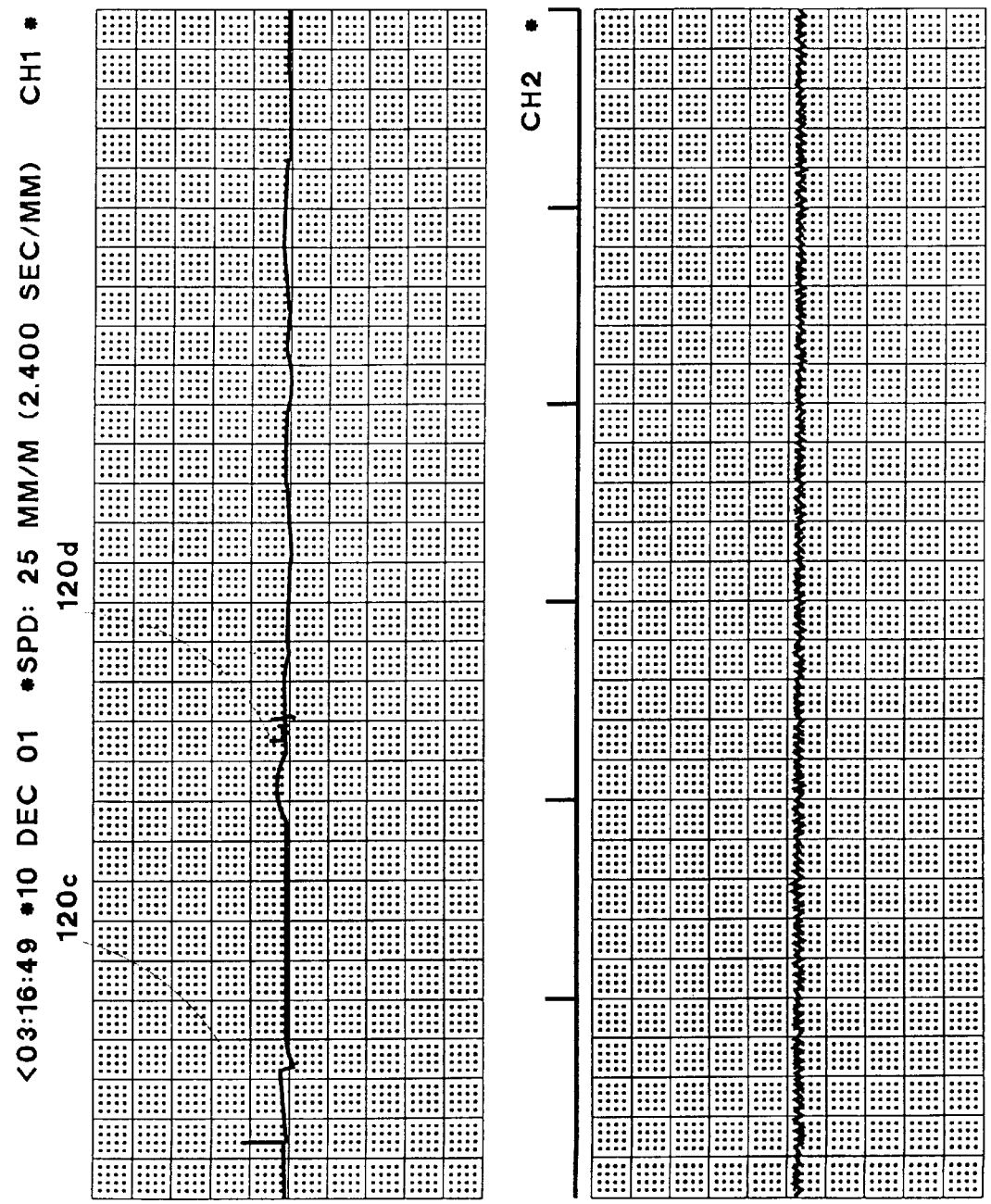
Figure 11E:
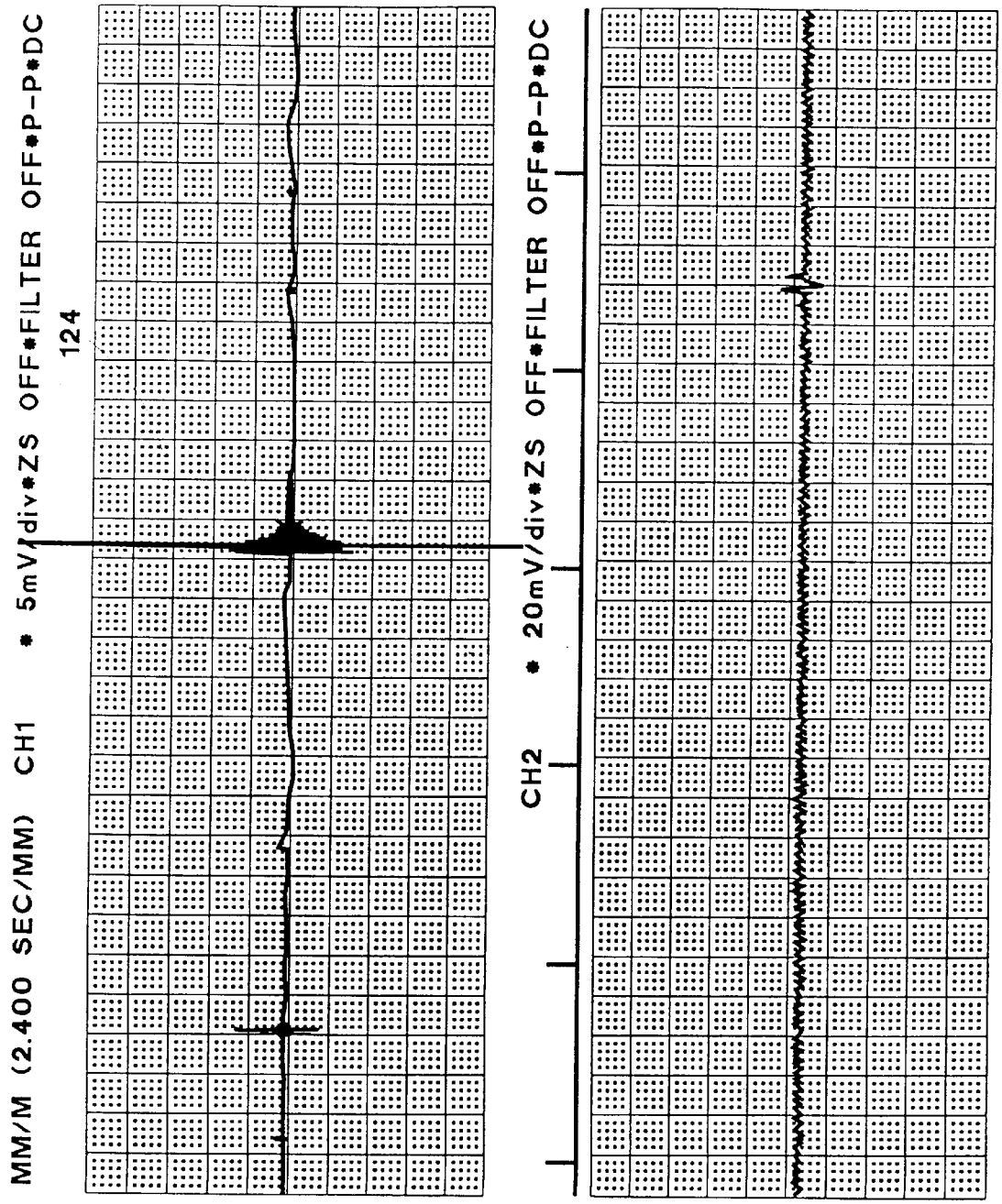

Referring to FIGS. 11A–11F, graphical measurement data from a precursor seismic detector, as shown in FIG. 1, was obtained from a detector located in the Mammoth Lakes area during a later time period, such as several days, as FIGS. 10A–10Z. A plurality of SPI impulses 120a–120d predict the occurrence of a future earthquake, although not necessarily waveform 124, as described below. The impulses as detected by the detector of FIG. 1 are very narrow in nature, approximately 40 milliseconds or less in duration. Referring specifically to FIG. 11E, waveform 124 is the occurrence of an actual earthquake, which correlated with United States government earthquake data of a 2.8 earthquake at the same time. The 2.8 earthquake 124 was 40.8 hours after the MPB burst 112, which is the primary prediction factor for an earthquake. The earthquake generally occurs from 8 to 80 hours after the MPB burst. In addition, the mass detector, as shown in FIG. 1, periodically produces a wavy base waveform 130 indicative of pressure within the earth's plates.

Referring to FIGS. 12A–12J, additional SPI and MPB waveforms detected by the detector constructed in accordance with FIG. 2 are shown. Additional SPIs 124a–124e were detected, some of which include overshooting such as SPIs 124a and 124e. Additional MPBs 126a, 126b, and 126c were detected and are generally characterized by multiple impulses within a short time frame not discrete from one another. Waveform 128 could be categorized as either a SPI or MPB.

Figure 13:
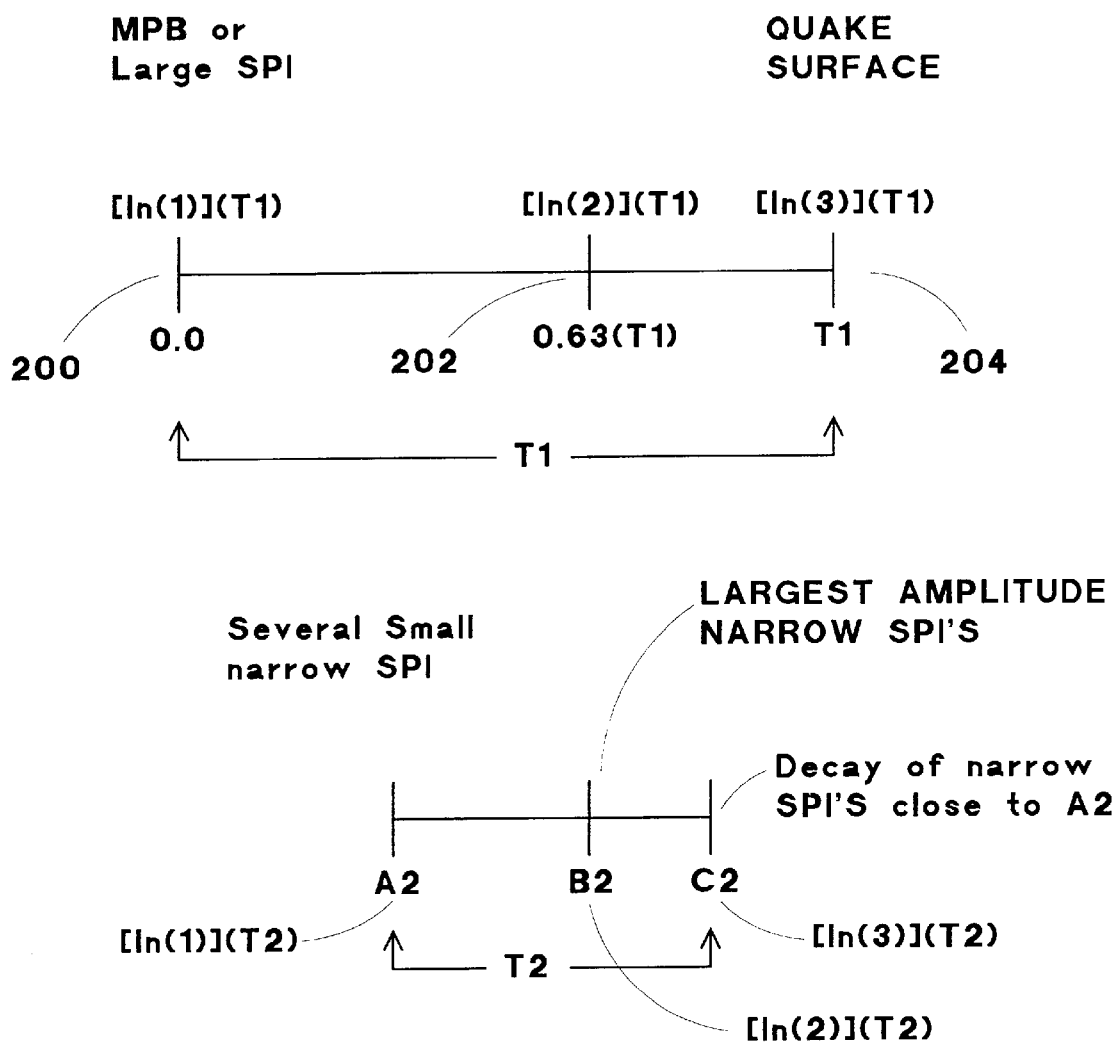
FIG. 13 is an exemplary embodiment of the prediction methodology used to predict earthquakes based on the SPI and MPB waveforms.

Referring to FIG. 13 the present inventor has developed a specific technique for prediction of earthquakes based on SPI and MPB precursor seismic waveforms as shown in FIGS. 10A–10Z, 11A–11F, and 12A–12J. Point 200 is the occurrence of a MPB or a large SPI waveform and designed at time index 0.0. Time index 0.0 is calculated by the [ln(1)]*T1. T1 is the time from the MPB or large SPI waveform until the future quake surfaces. After the MPB burst there is normally a series of several small narrow SPI waveforms detected which indicates time point A2. Point A2 is calculated by the [ln(1)]*T2. T2 is the time of duration of smaller narrower SPI waveforms. The small narrow SPI waveforms normally increase in magnitude and then decay again to a point C2 that is similar to that of point A2. The point of greatest magnitude is B2. Point B2 is calculated by [ln(2)]*T2 which is generally 63% of the length of time of T2. Point C2 is calculated by [ln(3)]*T2. Point B2 is point 202 which is calculated by [ln(2)]*T1 and generally 63% of the length of T1. With the point 202 defined then the duration of time T1 can be estimated and the point 204 {[ln(3)]*T1} when the quake will surface is calculated as a predictor. Other detection methods may likewise be used, based on the occurrence of SPIs and/or MPBs.

Unfortunately, the solar cells of the detectors shown in FIGS. 7 and 8 are susceptible to physical damage if not protected against inadvertent impact. Moreover, the present inventor realized that the clear nature (translucent and/or transparent) of the acrylic plastic dielectric is susceptible to photoelectric effects which could corrupt measurements made from solar cells supported thereon. The solar cells shown in FIGS. 7 and 8 may be encased within 3M DP 270 potting compound (black epoxy) to both protect the solar cells from inadvertent impact and provide strain relief for wires connected to the solar cells. In addition, the black epoxy coating does not transmit light which eliminates the susceptibility of the acrylic plastic dielectric to photoelectric effects.

Unfortunately, acrylic plastic is relatively expensive so an alternative dielectric medium is desirable. In testing cost optimized designs, such as epoxy blocks with solar cells encapsulated therein (without acrylic), the present inventor noted that the impulse signal response for the same seismic precursor varied from detector to detector. Such variability in the impulse signal response has several drawbacks. First, if the impulse signals are small then they may be difficult to accurately detect. Second, the signal response variability of the impulse signals may exceed the dynamic range of the detector. Third, if the amplitude is too large then the detector may saturate thereby resulting in inaccurate measurements. Fourth, calibration to compensate for the variability between detectors would require the development and implementation of a set of data tables and circuitry within the instrument, at added expense.

To reduce the variability between detectors, measures were taken to attempt to ensure that the detectors were identically constructed. Unexpectedly, the variability in measurements between the detectors remained. The present inventor conducted a study on clear 3M DP 270 clear epoxy (in contrast to dark 3M DP 270 potting compound epoxy) and noticed that light was distorted at points and regions within cured clear epoxy. The distortion of the light results from variability in the crystalline alignment (nonuniformity) of the clear epoxy. The present inventor realized that the nonuniformity in the crystalline alignment is primarily the result of heat generated during the curing process of the epoxy. After investigating the curing process of clear epoxy and then subsequently 3M DP 270 potting compound, the present inventor came to the revelation that the impulse signals are sensitive to anisotropic characteristics (nonuniform dipole alignment reaction from impulse direction and/or orientation, and impulse polarization) from the variations in the crystalline structure of the dielectric material between detectors. Experiments attempting to control the curing process for 3M DP 270 failed to provide adequate results. With the realization that impulse signals are sensitive to anisotropic characteristics, an inexpensive uniform crystalline structure (isotropic) dielectric for the detector is desirable. Further, the detector still should have opaque exterior material to prevent the detector from reacting to light.

Based on earlier experiments, such as the detector shown in FIG. 2, the present inventor realized that impulse responses are sensitive to the volume of the enclosure, the surface area of the enclosure, and the shape of the detector. Based on such experiments, the present inventor determined that air provides a dielectric medium that responds to SPI/MPB impulses, albeit weaker than a solid dielectric. The present inventor then decided to attempt to design a suitable detector using a gaseous based dielectric, such as air, which the inventor postulated would react to SPI/MPB impulses in an isotropic manner from detector to detector. The isolation of isotropic media as a significant factor in the detection of impulses provided the motivation for attempting to improve the weak impulse response characteristics of air. To design such a gaseous based detector, the present inventor used his knowledge that the ratio of the surface area of the enclosure of the detector to the volume of air contained therein related to the amplitude of the impulse reaction, similar to the detector shown in FIG. 2. Moreover, the present inventor realized that the surface area of the dielectric interfaced with metal (metal facilitates ionization charge injection) has a relationship to the impulse reaction, similar to the detector shown in FIG. 6. Experiments were conducted using various multiangular designs of enclosed air adjoining metal surface material in order to attempt to optimize the impulse response characteristics for all orientations and impulse polarizations. Another factor considered in such designs was attempting to concentrate the ionization charge potential because the air based dielectric tends to quickly disperse such impulse signals within the dielectric volume. Concentrating the ionization attempts to increase the sensitivity lost by not using a solid dielectric medium, such as epoxy, in which the impulse signals are not as quickly dispersed.

One of the principal problems in calibrating and designing such detectors is that actual earthquakes are required to test and stimulate the device. Earthquakes by their nature are infrequent and occur in an uncontrolled fashion. The solar cells were sorted by reverse bias voltage characteristics and luminance response but unfortunately still produced different responses to SPI/MPB impulse signals. Such sorting should have adequately sorted the solar cells to provide consistent results, but failed to do so. The present inventor then came to the realization that the solar cells in an electrostatic condition still need a charge differential to accumulate and strip off electrons with respect to other regions of the solar cells. Based on the aforementioned zero-point theory, the present inventor postulates that mass itself acts as a standing wave of energy with the mass itself ionized in the direction of the wave. With the postulation that SPI/MPB impulse signals are a form of zero-point energy, the mass of the detector and solar cell is then ionizing. This explains, at least in part, why a solid dielectric responds with a greater magnitude than a gaseous dielectric because a solid dielectric has more mass to ionize. Based on the premise of the ionization of the mass of the detector, the present inventor tested an ion generator to stimulate an impulse response. Most of the detectors were sensitive to the ion flow from an ion generator. All other electromagnetic signal sources tested by the present inventor failed to stimulate the detector.

Figure 14:
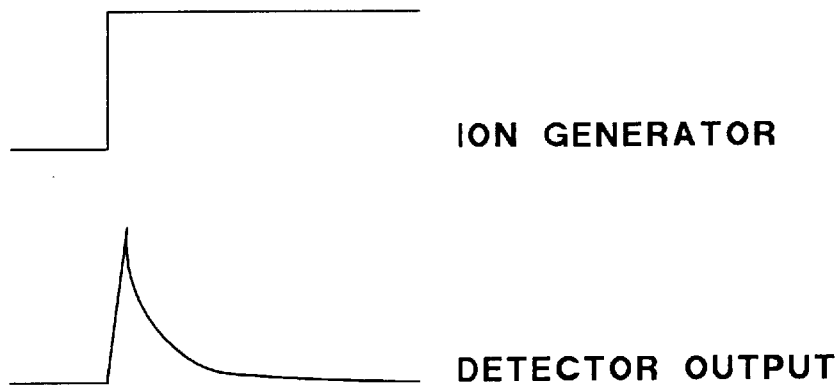
FIG. 14 is a step signal from an ion generator and a response from the detectors of FIGS. 7 and 8.
Figure 15:
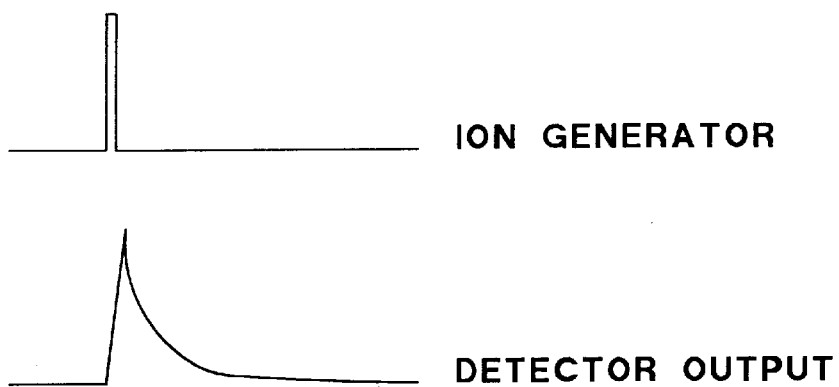
FIG. 15 is an impulse signal from an ion generator and a response from the detectors of FIGS. 7 and 8.
Figure 16:
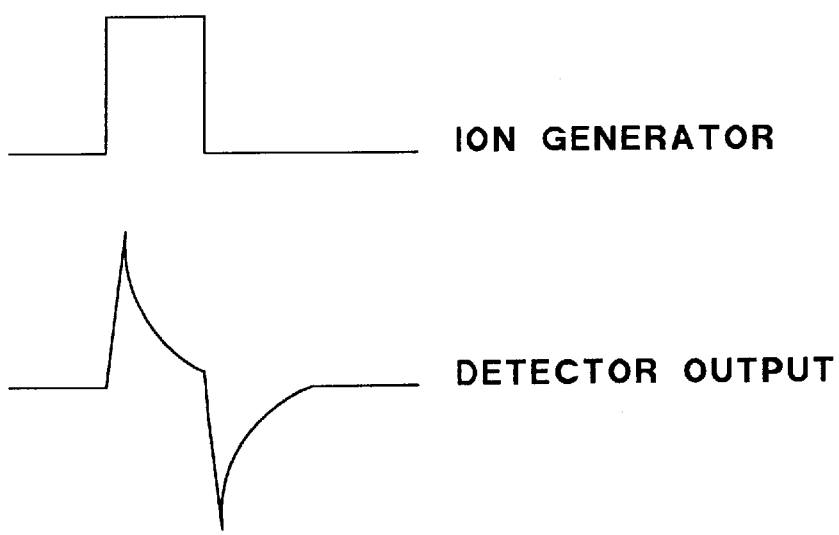
FIG. 16 is a rectangular type signal from an ion generator and a response from the detectors of FIGS. 7 and 8.

Referring to FIG. 14, a step signal from an ion generator received by a detector, such as those shown in FIGS. 7 and 8, provides an output equivalent to an SPI signal. The end of the SPI signal returns to zero as the charge differential balances even from a continuous charge injection from the ion generator. Referring to FIG. 15, an impulse type signal from an ion generator received by a detector, such as those shown in FIGS. 7 and 8, provides an output equivalent to an SPI signal. Referring to FIG. 16, a rectangular type signal from an ion generator received by a detector, such as those shown in FIGS. 7 and 8, provides an output equivalent to an MPB signal. The leading edge of the rectangular type signal provides an SPI signal in a positive direction (or alternatively negative) while the falling edge of the rectangular type signal provides an SPI signal in a negative direction (or alternatively positive), resulting in the MPB waveform. The result is that the ion generator provides an equivalent waveform output from the detector, similar to precursor electromagnetic type waveforms. Accordingly, the ion generator may be used to calibrate and test detectors.

Figure 17:
FIG. 17 is a graph of quiescent noise from a solar cell and the resulting detector output.

The solar cells have a quiescent noise value when reversed biased which the present inventor determined correlates directly with the sensitivity of the sensor and thus the magnitude of the resulting impulse. For example referring to FIG. 17, a quiescent noise value of 3 may result in an impulse value of 30 with a given precursor waveform. Likewise, a quiescent noise value of 0.3 would result in an impulse value of 3 with the same given precursor waveform. The scale factor between the quiescent noise value and the impulse magnitude is essentially the same for different quiescent noise values. The result is that the sensors can be sorted based on their quiescent noise values to select solar cells that provide similar results to precursor electromagnetic waveforms. This result was determined based on tests using the ion generator to simulate precursor seismic activity. Without the ion generator equivalence, verifying the existence of such a scale factor would have been difficult, if not impossible, because of the multitude of factors that influence the response of the detectors.

In attempting to develop gaseous based dielectric detectors, as previously described, the present inventor realized that metal reacts in cooperation with a solid dielectric to generate a charge potential from an SPI/MPB impulse, where the potential on the surface of the metal quickly balances as the impulse terminates. Referring again to FIG. 6 for example, this occurs by the metal injecting ions into the dielectric upon receiving an SPI/MPB impulse. Based on this realization, the present inventor postulated that metal could therefore inject ions into a gaseous dielectric medium, such as air. To increase the effect of the ion (charge) injection into air, it is desirable to maximize the metal surface area per unit air volume. This results in significant ionization charge injection into the gas dielectric during the impulse. The present inventor further postulated that an array of metal fingers would react in an analogous manner to a phased array of antennas, except in the reverse sense by receiving as opposed to transmitting. Such an array of metal fingers is readily available in the form of heat sinks for computer electronic devices. The heat sink is located within an enclosure that is preferably sealed and non-conductive to maintain the air in proximity to the heat sink. The large number of closely spaced fingers affords a large surface area capable of increased charge injection into the gas dielectric, namely air.

Figure 18:
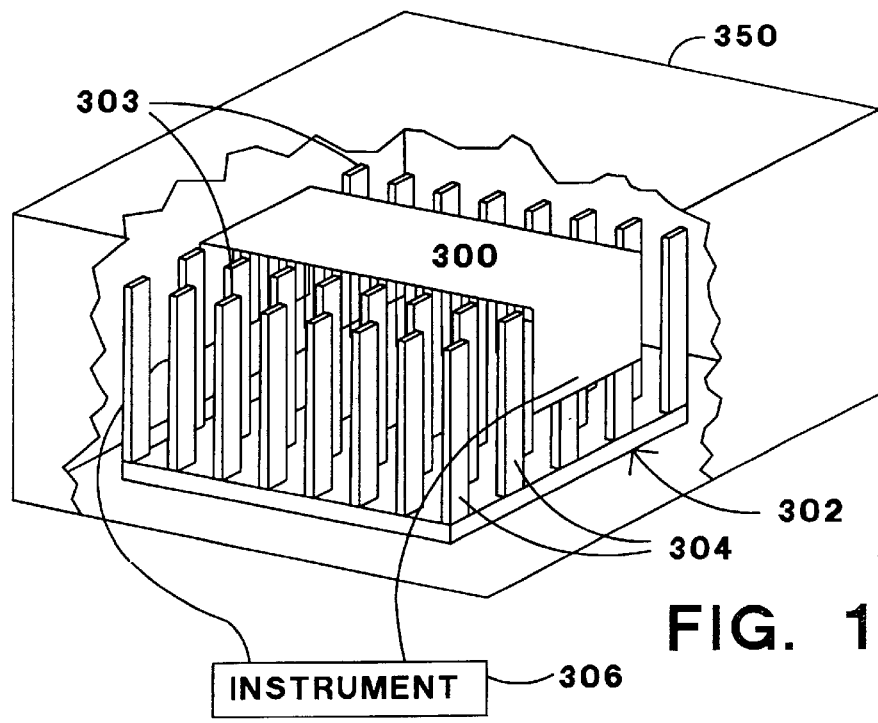
FIG. 18 is another embodiment of a seismic detector including a solar cell around a heat sink.

Referring to the detector shown in FIG. 18, a flexible thin film solar cell 300 is positioned above and curving around two sides of a heat sink 302 with a spacing of 0.1 inches apart from the tips 303 of the fingers 304 of the heat sink 302. The heat sink 302 is located within a plastic enclosure 350. Testing the detector of FIG. 18 with a set of ion impulses confirmed the omnidirectionality and multi-polarization capability of the detector, similar to a phased antenna array. Unfortunately, a significant problem still persisted in that the amplitude reaction remained small due to the ionization charge dispersal within the air before the near-field reaction with the solar cell 300 (modulation of depletion region from the reversed biased PIN junction of the solar cell via instrument 306). In other words, the coupling mechanism from the heat sink 302 through the air to the solar cell 300 remained too small for optimal performance.

While the SPI/MPB impulses may be detected and measured by a solar cell in the proximity of metal through a dielectric, such as a gas or a solid, the present inventor postulated that there is in fact a fast rise and a fast fall of the voltage potential on the metal surfaces themselves resulting from the impulse signal.

Figure 20:
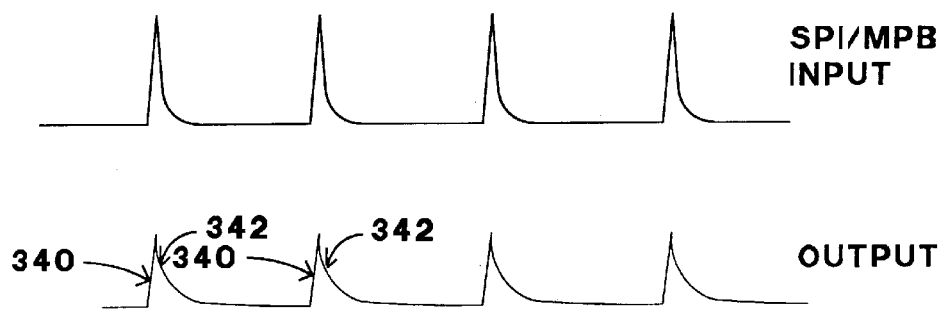
FIG. 20 is a graph of SPI/MPB input and the output of the detector of FIG. 19.
Figure 21:
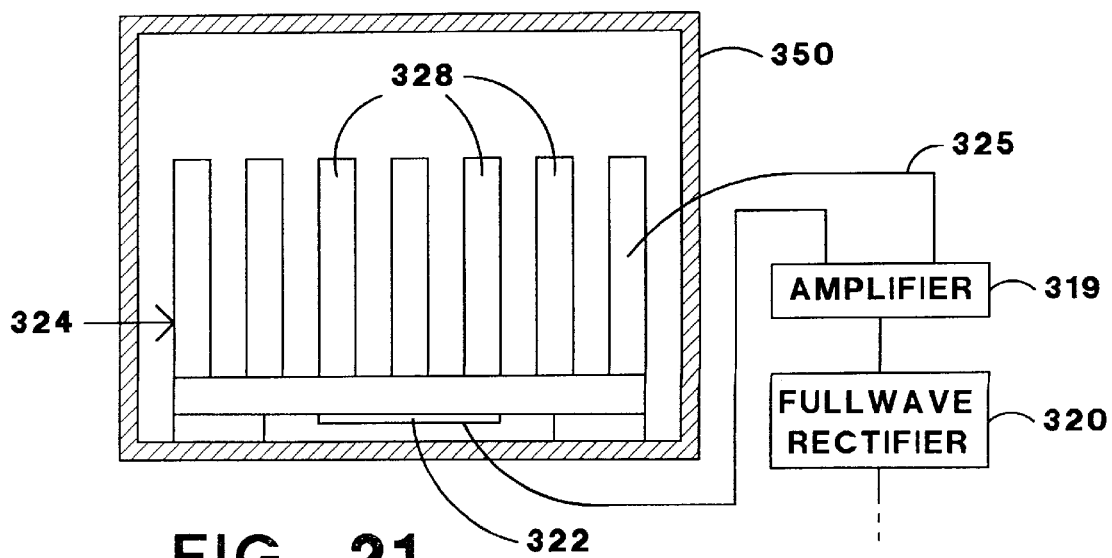
FIG. 21 is a sectional side view of the detector shown in FIG. 19.
Figure 19:
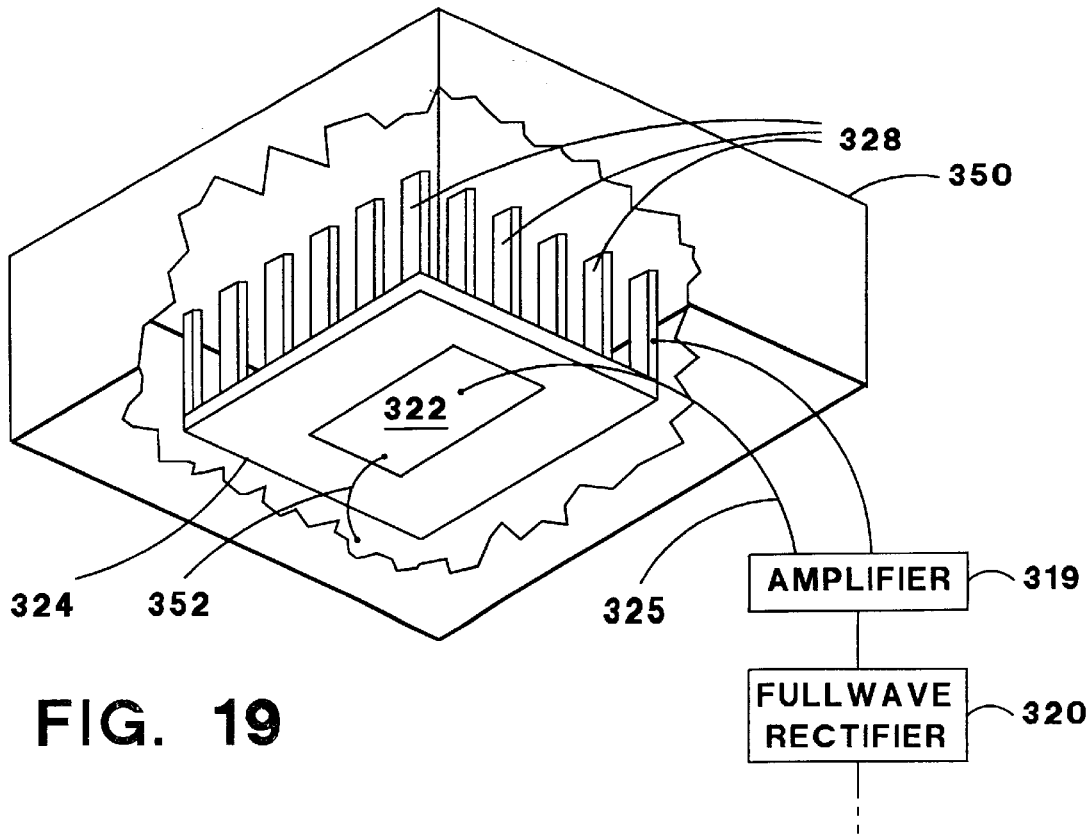
FIG. 19 is another embodiment of a seismic detector including metal tape attached to the base of a heat sink.

Seeking to detect the charge differential at the surface of the metal fingers 304 of the heat sink 302, instead of at a distance away, the detector of FIG. 18 was modified. Referring to FIGS. 19, 20 and 21 a modified detector design was thus constructed consisting of a fast response/slow decay impulse amplifier 319 and full wave rectifier 320. Creating differential reference inputs to the amplifier 319 was accomplished by mounting a strip of 3M foil tape 322 on the base of an anodized heat sink 324. The tape 322 forms an alternating-current electrical path to the heat sink 324. The tape 322 provides a consistent way of obtaining a reference voltage and is convenient because a wire 325 may be readily soldered to the tape 322. The anodized surface of the heat sink 324 results in a capacitance between the tape 322 and the metal of the heat sink 324. The advantage of such a capacitance is that if the electric measuring circuit (amplifier 319 and full wave rectifier 320) requires a bias voltage then one lead may be biased. The fingers 328 of the heat sink 324 are preferably sprayed with an exterior conductive electromagnetic interference material (EMI) and one of the fingers 328 is connected to an input to the amplifier 319. The EMI material provides both a highly conductive surface adjacent to the air and a porous surface which increases the ion injection into the air. Since SPI/MPB impulses have a fast rising edge and a somewhat slower falling edge, the full wave rectifier 320 translates the impulse into a sharp rising edge 340 and a slower falling edge decay 342, as shown in FIG. 20. The amplifier 319 preferably has a very high input impedance to permit detection of weak charges from small SPI/MPB impulses.

Another alternative design involves elimination of the 3M foil tape and directly attaching the wire to the base of the heat sink 324. The annodization may be eliminated, if desired, and both of the wire leads connected directly to either the metal of the heat sink or the EMI coating (if used). In such a design the voltage differential will be observable between two different portions of the same conductive member without the construction of a capacitance therebetween. The amplifier 319 would then be redesigned to not require a bias reference voltage. In essence, the design may involve only a conductive member and an enclosure.

Although the 3M foil tape provides a differential reference at the lesser surface area per adjoining unit air area of the anodized aluminum heat sink base, the reference at the tape is still influenced by the same charge reaction of the metal ejecting charge. To leverage the reaction of the ion charge injection into the gas dielectric, the inner surface of the plastic enclosure 350 is preferably lined with 3M foil tape. An impulse generates a charge cloud of ions around the fingers of the heat sink. The ion cloud thus generated is postulated by the present inventor to be attracted to the internal conductive foil tape lining for the duration of the impulse. Upon impulse termination the ion cloud then redistributes resulting in a larger detectable voltage difference across the heat sink itself and the internal conductive coating. To further intensify the near-field reaction, the conductive foil tape is also electrically connected by a wire 352 to the internal foil tape lining. The ion intensity is greater at the fingers of the heat sink from the greater mass adjacent to the air in relation to the metal tape. Accordingly, a field potential difference from the heat sink fingers and the inner conductive liner acts to pull the ion field away from the fingers in addition to the mutual charge repulsions of the ions themselves. After the SPI/MPB impulse, recombination of the charge field (ion field) will cause a difference in potential between the internal lining and the heat sink.

Figure 22:
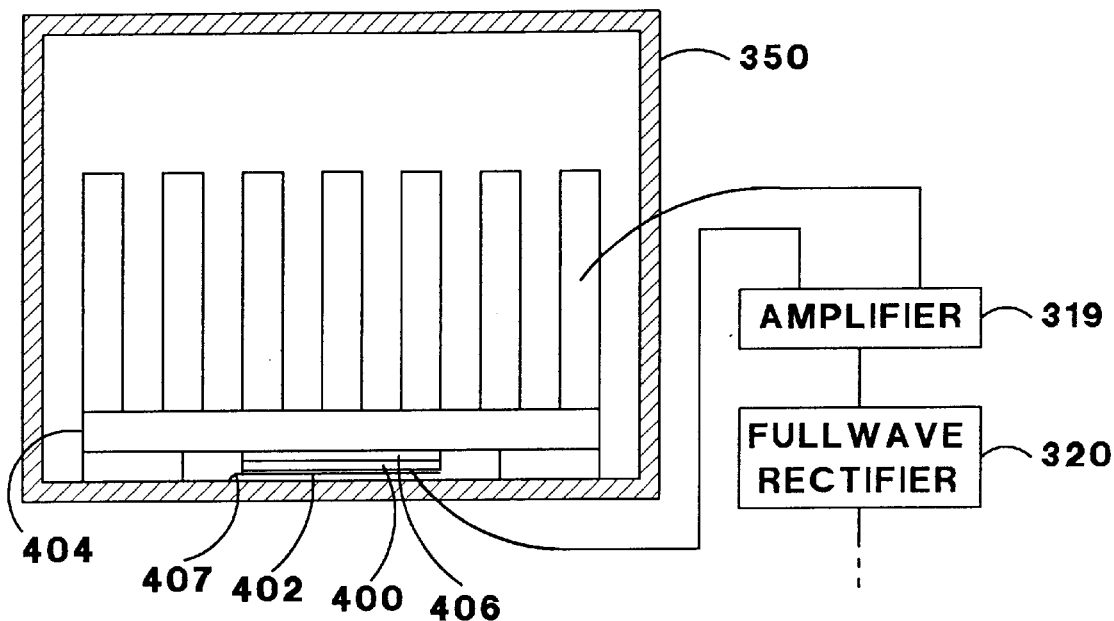
FIG. 22 is another embodiment of a seismic detector including a solar cell attached to the base of a heat sink.
Figure 23:
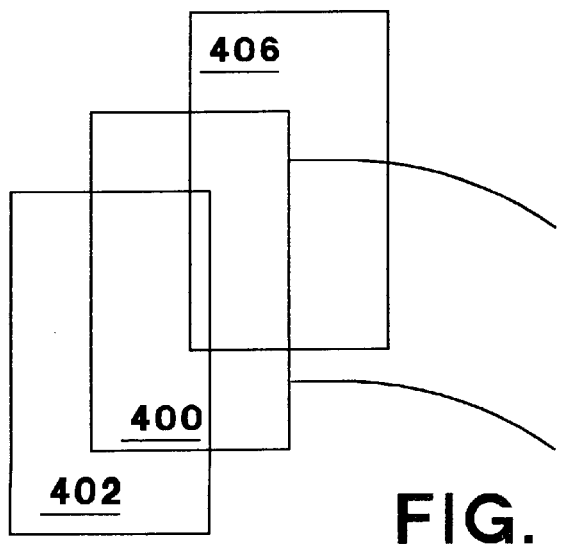
FIG. 23 is a detail of the layers attached to the base of the detector of FIG. 22.
Figure 24B:
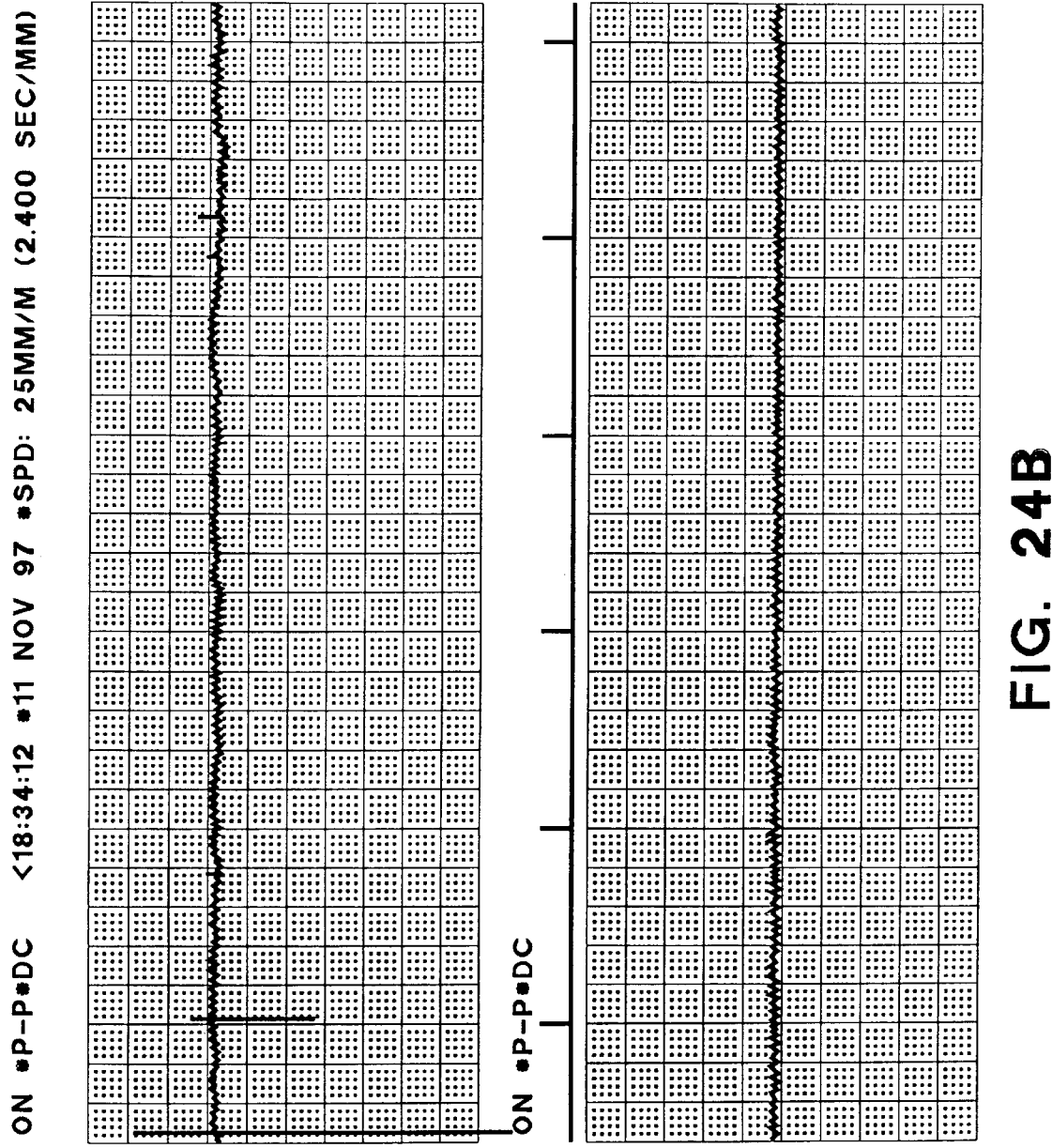
Figure 24D:
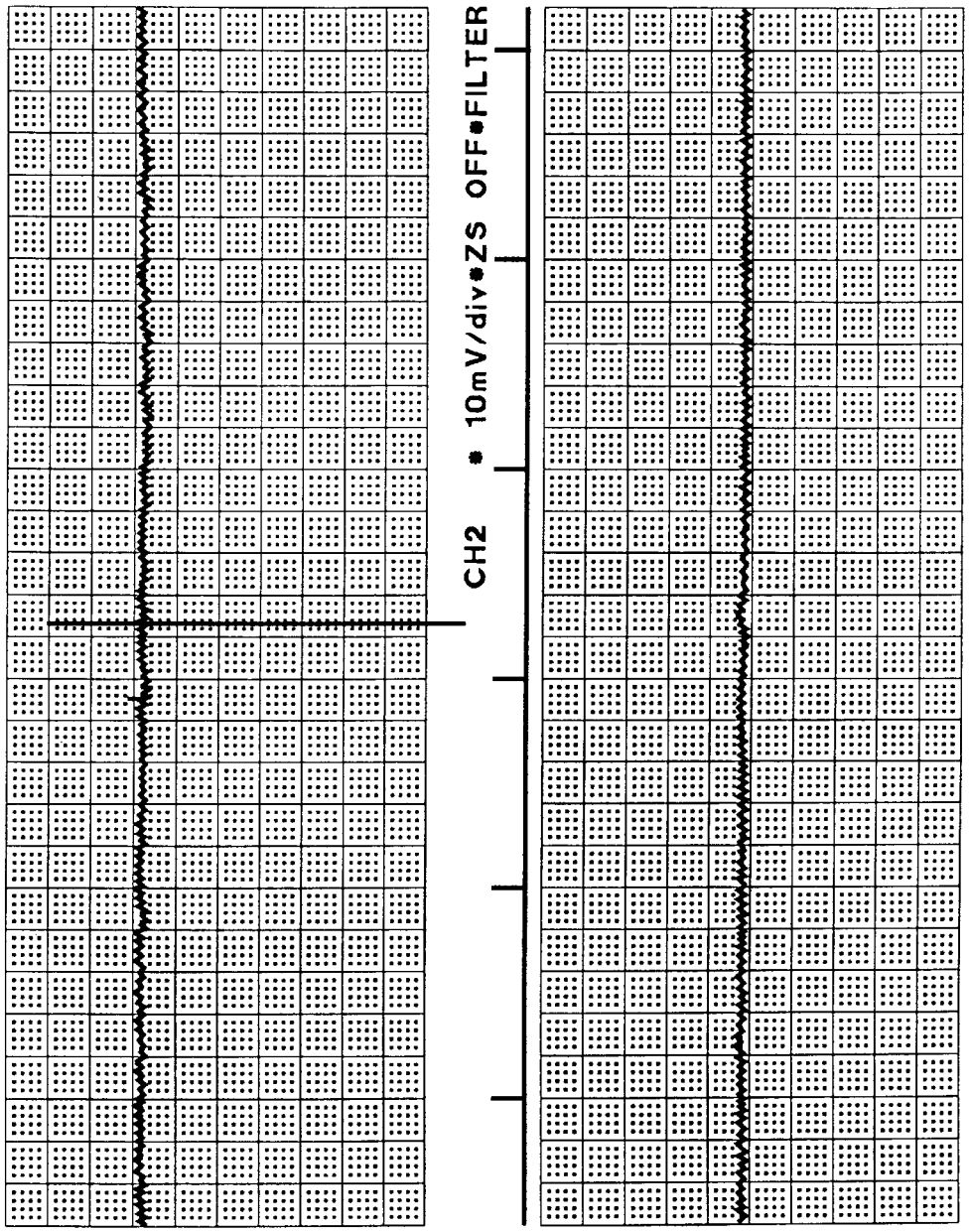
Figure 24I:
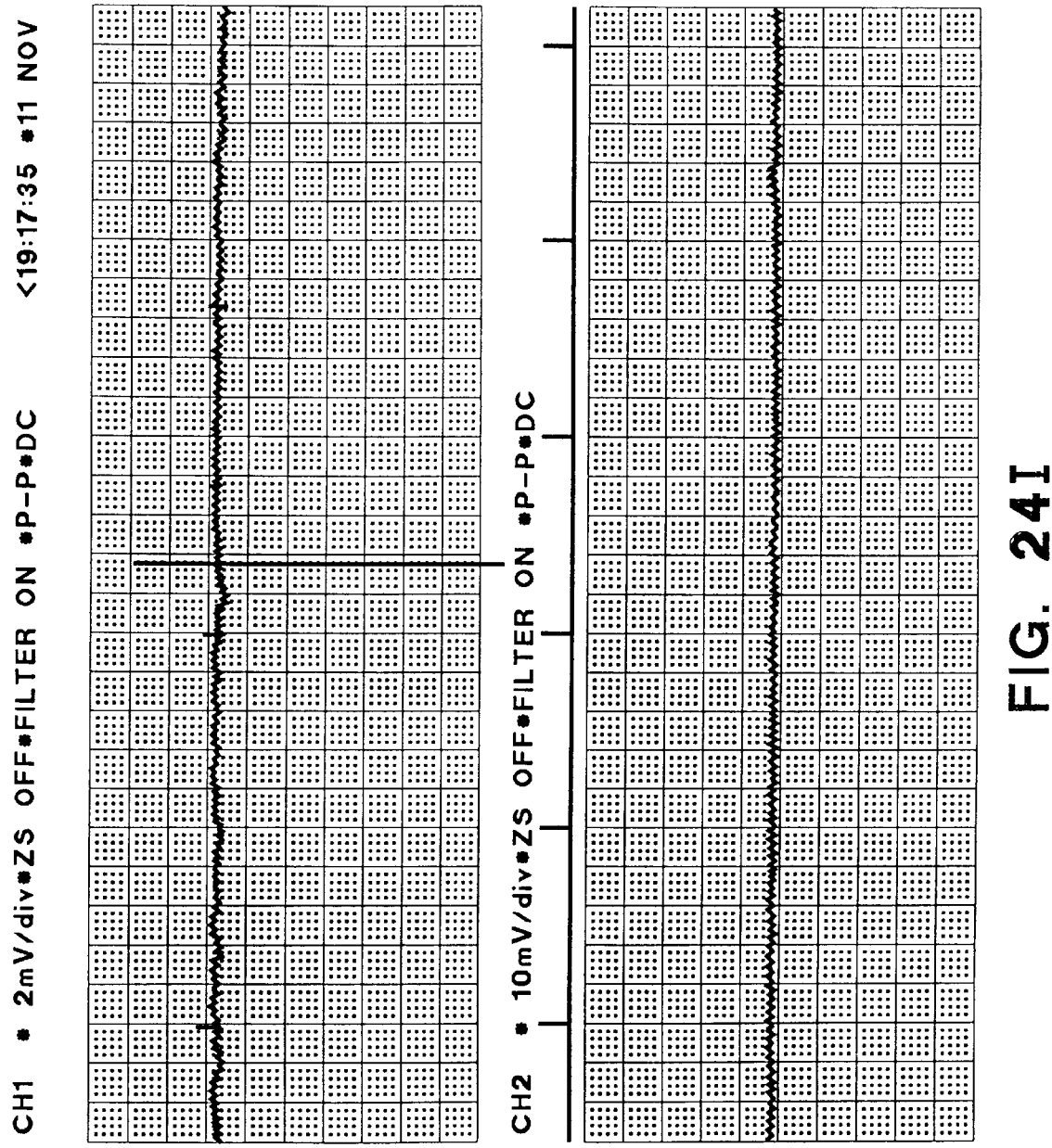
Figure 25A:
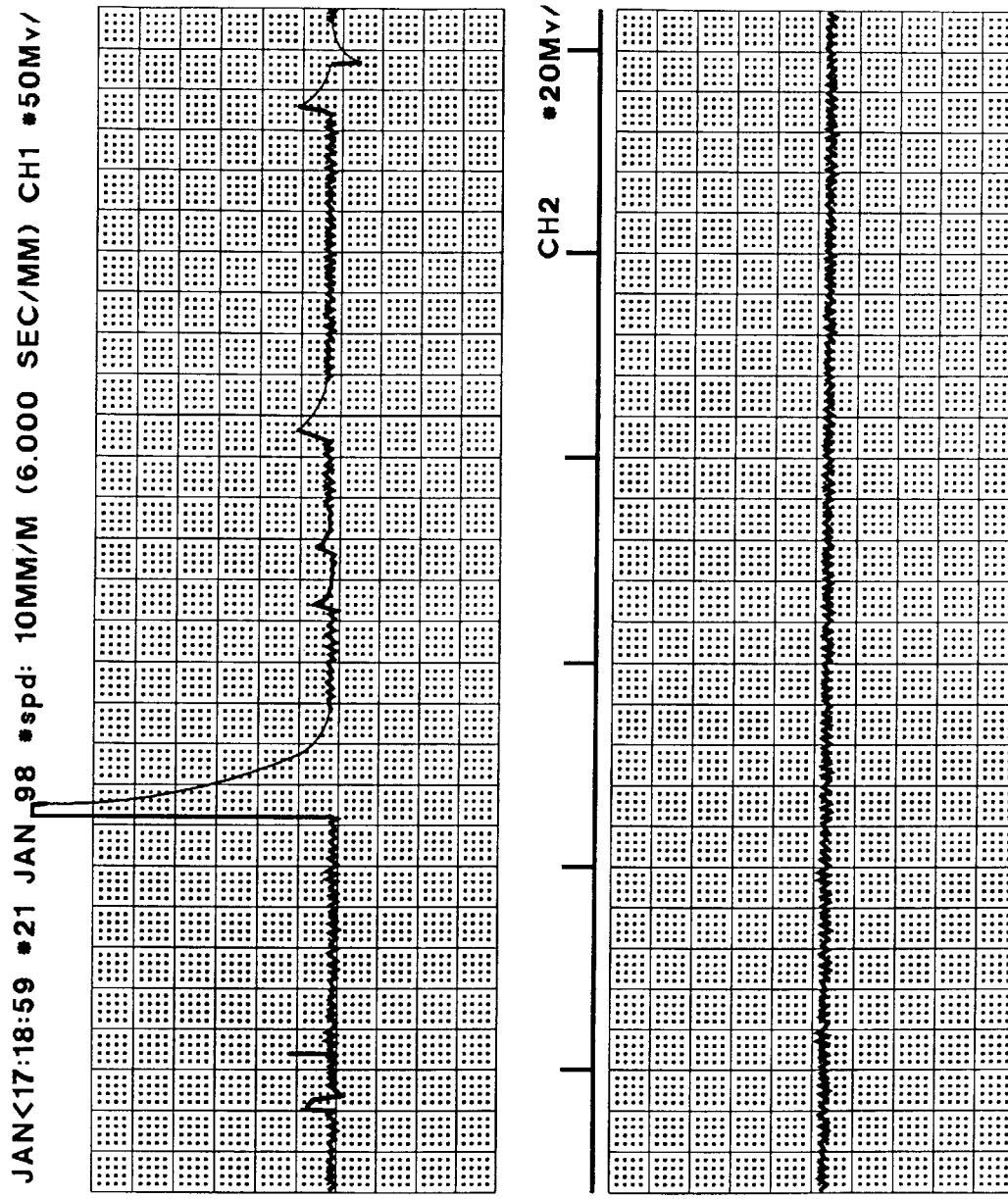
Figure 25C:
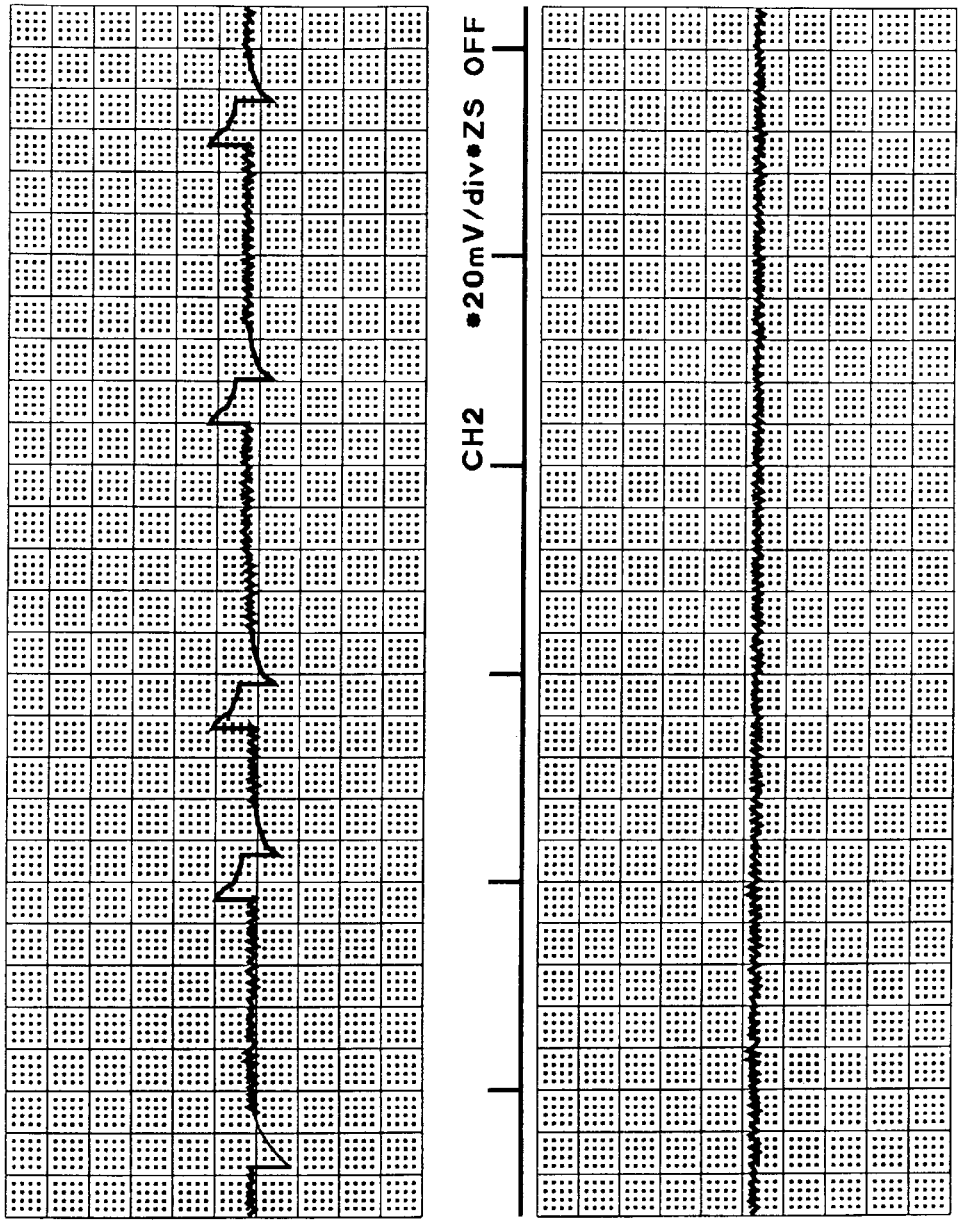

The detector shown in FIG. 19, especially with the foil tape lining, was found to be superior to the detector shown in FIG. 18. Referring to FIGS. 22 and 23, a further alternative detector design uses a solar cell 400 sandwiched between 3M foil tape 402 and the base of the heat sink 404 held in place with clear dual adhesive tape 406. The foil tape 402 is connected to the internal 3M foil tape lining by a wire 407. The charge differential immediate to the surfaces of the solar cell 400 results in an inherent high speed detector of impulses with a slow speed decay similar to the amplifier 319 and full wave rectifier 320 without the additional expense of the amplifier electronics. The solar cell 400 also has the advantage of a low impedance output allowing the detector to forego buffering with the amplifier. This also provides noise tolerance where the detector is buried in ground and the cable to the instrument is a significant distance away.

It is to be understood that the use of the solar cell or other devices that include a PN junction (or similar junction sensitive to ion fields) together with air (plus enclosure), a metal (enclosure not required), or a solid mass (enclosure not required) provides the preferred structure for mass ionization and detection.

The present inventor came to a startling realization that SPI/MPB impulses are in fact detectable above the surface of the ground. In fact, the SPI/MPB impulses propagate in a region of the atmosphere in general proximity to the ground. A differential in air propagation versus ground propagation provides a method of detecting distances to the earthquake. Initial tests appear to indicate that there is approximately a 1 μsec per kilometer difference between a detector located above the ground (sensor at approximately 15–20 ft above ground) and an "in ground" detector.

Direction determination from using multiple detectors in the ground (or above) spaced a distance apart, allows SPI/MPB detection at slightly different times which yields the direction of the quake. Fast response amplifiers and high speed time differential circuitry are needed. Time differences are measured in the nanosecond to hundreds of picosecond range depending on distances between detectors.

The present inventor postulates that the metal detectors with an air dielectric operate in the following manner. The SPI/MPB impulse signal strikes both the air of the detector and the metal. The air itself reacts to the SPI/MPB impulse signal by weakly ionizing. The metal has excess electrons and has a relatively strong ionization reaction to the SPI/MPB impulse signal. The significant surface area of the metal fingers of the heat sink injects a significant number of ions into the adjoining air, thus changing the voltage potential of the fingers. The bottom of the heat sink eject a smaller number of ions than the fingers, and thus changes the voltage differential at the base a lesser amount. The ions are disbursed within the air and repel against one another forming a net flow of electrons away from the base of the heat sink. The SPI/MPB impulse terminates and the metal nearly instantaneously rebalances the charge imbalance created by the SPI/MPB impulse signal. The ions in the air recombine with the metal. The differential in the ion generation is thus measured as a voltage differential, and thus the detection of the SPI/MPB impulse signal.

The detector of FIGS. 19 and 21 detected SPI/MPB waveforms as shown in FIGS. 24A–24K in the lower strip of recordings. The detector of FIGS. 22 and 23 detected SPI/MPB waveforms as shown in FIGS. 25A–25G in the upper strip of recordings.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A method of detecting precursor seismic electromagnetic waveforms and predicting future seismic activity in the form of an earthquake based thereon, comprising the steps of:

(a) locating a detector including at least one of a dielectric material and a conductive material in proximity with the earth;

(b) receiving within said at least one of said dielectric material and said conductive material in said proximity with said earth precursor seismic electromagnetic waveforms emanating from a region of seismic activity;

(c) sensing with a sensor responsive to said receiving said precursor seismic electromagnetic waveforms with said at least one of said dielectric material and said conductive material a series of individual discrete signals imposed by said waveforms at said at least one of said dielectric material and said conductive material, said each of said signals having the characteristic of a rise time that is shorter than its fall time; and (d) predicting based on said series of said signals the occurrence of said earthquake.

2. The method of claim 1 wherein each of said signals has only one of a positive and a negative polarity.

3. The method of claim 1 wherein said rise time is nearly vertical.

4. The method of claim 1 wherein said fall time is generally exponential in nature.

5. The method of claim 1 wherein said sensor is a solar cell.

6. The method of claim 1 wherein said sensor is an accelerometer connected to an elongated metal bar detector.

7. The method of claim 1 wherein said sensor senses a shift in the quiescent bias point of said accelerometer.

8. The method of claim 1 wherein said rise time is substantially shorter than said fall time.

9. The method of claim 1 wherein said dielectric material has a plurality of sides, a plurality of said sensors each of which is attached to one of said plurality of sides, and further comprising the step of sensing with said plurality of sensors said signals.

10. The method of claim 9 wherein said dielectric material has six sides and only three of said sides has an attached said sensor.

11. The method of claim 1 wherein said rise time is the elapsed time prior from zero to the absolute value of a maximum amplitude of said signal either in the positive or negative polarity direction.

12. A method of detecting precursor seismic electromagnetic waveforms and predicting future seismic activity in the form of an earthquake based thereon, comprising the steps of:
   (a) locating a detector including at least one of a dielectric material and a conductive material in proximity with the earth;
   (b) receiving within said at least one of said dielectric material and said conductive material in proximity with said earth precursor seismic electromagnetic waveforms emanating from a region of seismic activity;
   (c) sensing with a sensor responsive to said receiving said precursor seismic electromagnetic waveforms within said at least one of said dielectric material and said conductive material a discrete signal imposed by said waveforms at said at least one of said dielectric material and said conductive material characterized by a plurality of overlapping waveforms with multiple sharp transitions between both a positive and negative polarity; and
   (d) predicting based on said discrete signal the occurrence of said earthquake.

13. A method of detecting precursor seismic electromagnetic waveforms and predicting future seismic activity in the form of an earthquake based thereon, comprising the steps of:
   (a) locating a detector including at least one of a dielectric material and a conductive material in proximity with the earth;
   (b) receiving within said at least one of said dielectric material and said conductive material in proximity with said earth precursor seismic electromagnetic waveforms emanating from a region of seismic activity;
   (c) sensing with a sensor responsive to said receiving said precursor seismic electromagnetic waveforms within said at least one of said dielectric material and said conductive material a series of individual discrete signals imposed by said waveforms at said at least one of said dielectric material and said conductive material, said each of said signals having the characteristic of a rise time that is generally less than 40 milliseconds in duration; and
   (d) predicting based on said series of said signals the occurrence of said earthquake.

14. The method of claim 13 wherein each of said signal has only one of a positive and a negative polarity.

15. The method of claim 13 wherein said rise time is nearly vertical.

16. The method of claim 13 wherein said fall time is generally exponential in nature.

17. The method of claim 13 wherein said sensor is a solar cell.

18. The method of claim 13 wherein said sensor is an accelerometer connected to an elongated metal bar.

19. The method of claim 18 wherein said sensor is the quiescent bias point of said accelerometer.

20. The method of claim 13 wherein said rise time is substantially shorter than said fall time.

21. The method of claim 20 wherein said dielectric material has a plurality of sides, a plurality of said sensors each of which is attached to one of said plurality of sides, and further comprising the step of sensing with said plurality of sensors said signals.

22. The method of claim 21 wherein said dielectric material has six sides and only three of said sides has an attached said sensor.

23. The method of claim 13 wherein said rise time is the elapsed time prior from zero to the absolute value of a maximum amplitude of said signal either in the positive or negative polarity direction.

24. A method of detecting precursor seismic electromagnetic waveforms and predicting future seismic activity in the form of an earthquake based thereon, comprising the steps of:
   (a) locating a detector including at least one of a dielectric material and a conductive material in proximity with the earth;
   (b) receiving within said at least one of said dielectric material and said conductive material in proximity with said earth precursor seismic electromagnetic waveforms emanating from a region of seismic activity;
   (c) sensing with a sensor responsive to said receiving said precursor seismic electromagnetic waveforms with said at least one of said dielectric material and said conductive material a discrete signal imposed by said waveforms at said at least one of said at least one of said dielectric material and said conductive material characterized by a plurality of overlapping waveforms with a rise time of generally less than 40 milliseconds of both a positive and negative polarity; and
   (d) predicting based on said discrete signal the occurrence of said earthquake.

25. The method of claim 24 wherein said precursor seismic electromagnetic waveforms at least one of travel within said earth and in proximity with said earth.

26. A method of detecting precursor seismic electromagnetic waveforms and predicting future seismic activity in the form of an earthquake based thereon, comprising the steps of:
   (a) locating a detector in proximity with the earth;
   (b) receiving with said detector precursor seismic electromagnetic waveforms emanating from a region of seismic activity;
   (c) sensing with a sensor in response to said receiving said precursor seismic electromagnetic waveforms a plurality of signals, where each of said signals are characterized by at least one of;
      (i) each of said signals having the characteristic of a rise time that is shorter than its fall time;
      (ii) each of said signals including overlapping waveforms with multiple sharp transitions between both a positive and a negative polarity;
      (iii) each of said signals having the characteristic of a rise time that is generally less than 40 milliseconds in duration; and (iv) each of said signals including a plurality of overlapping waveforms with a rise time of generally less than 40 milliseconds of both a positive and negative polarity;

(d) predicting based on said signals the occurrence of said earthquake.

27. The method of claim 26 wherein said detector includes at least one of a dielectric medium, a conductive medium, and a gaseous medium within which said precursor seismic electromagnetic waveforms are received.

28. The method of claim 26 wherein said precursor seismic electromagnetic waveforms travel within said earth.

29. The method of claim 26 wherein said detector is in contact with said earth.

30. A method of detecting precursor seismic electromagnetic waveforms and predicting future seismic activity in the form of an earthquake based thereon, comprising the steps of:

(a) sensing at least one signal responsive to precursor seismic electromagnetic waveforms with a sensor, where said at least one signal is characterized by at least one of;

(i) said at least one signal having the characteristic of a rise time that is shorter than its fall time;

(ii) said at least one signal including overlapping waveforms with multiple sharp transitions between both a positive and a negative polarity;

(iii) said at least one signal having the characteristic of a rise time that is generally less than 40 milliseconds in duration; and (iv) said at least one signal including a plurality of overlapping waveforms with a rise time of generally less than 40 milliseconds of both a positive and negative polarity;

(d) predicting based on said at least one signal the occurrence of said earthquake.

31. The method of claim 30 wherein said detector includes at least one of a dielectric medium, a conductive medium, and a gaseous medium within which said precursor seismic electromagnetic waveforms are received.

32. The method of claim 30 wherein said precursor seismic electromagnetic waveforms travel within said earth.

33. The method of claim 30 wherein said detector is in contact with said earth.

* * * * *